United States Patent
Cha et al.

(10) Patent No.: US 10,217,914 B2
(45) Date of Patent: Feb. 26, 2019

(54) SEMICONDUCTOR LIGHT EMITTING DEVICE

(71) Applicant: SAMSUNG ELECTRONICS CO., LTD., Suwon-si (KR)

(72) Inventors: Nam Goo Cha, Hwaseong-si (KR); Wan Tae Lim, Suwon-si (KR); Yong Il Kim, Seoul (KR); Hye Seok Noh, Suwon-si (KR); Eun Joo Shin, Seoul (KR); Sung Hyun Sim, Uiwang-si (KR); Hanul Yoo, Goyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 93 days.

(21) Appl. No.: 15/163,204

(22) Filed: May 24, 2016

(65) Prior Publication Data

US 2016/0351764 A1    Dec. 1, 2016

(30) Foreign Application Priority Data

| May 27, 2015 | (KR) | ......................... 10-2015-0073930 |
| Oct. 1, 2015 | (KR) | ......................... 10-2015-0138683 |
| Feb. 5, 2016 | (KR) | ......................... 10-2016-0015233 |

(51) Int. Cl.
*H01L 29/49*     (2006.01)
*H01L 33/58*     (2010.01)
(Continued)

(52) U.S. Cl.
CPC ............ *H01L 33/58* (2013.01); *H01L 33/505* (2013.01); *F21K 9/237* (2016.08); *F21K 9/275* (2016.08);
(Continued)

(58) Field of Classification Search
CPC ... H01L 33/58; H01L 33/505; H01L 33/0079; H01L 33/44
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |

(Continued)

FOREIGN PATENT DOCUMENTS

| CN | 1674315 A | 9/2005 |
| CN | 102800790 A | 11/2012 |

(Continued)

OTHER PUBLICATIONS

Communication dated Feb. 14, 2017, issued by the Korean Intellectual Property Office in counterpart Korean application No. 10-2016-0015233.

(Continued)

*Primary Examiner* — Michael Shingleton
(74) *Attorney, Agent, or Firm* — Sughrue Mion, PLLC

(57) ABSTRACT

A semiconductor light emitting device includes: a light emitting structure including a first conductivity-type semiconductor layer and a second conductivity-type semiconductor layer respectively providing a first surface and a second surface, opposite to each other, of the light emitting structure, and an active layer interposed between the first conductivity-type semiconductor layer and the second conductivity-type semiconductor layer, a region of the first conductivity-type semiconductor layer being open toward the second surface, and the first surface having a concavo-convex portion disposed thereon; a first electrode and a second electrode disposed on the region of the first conductivity-type semiconductor layer and a region of the second conductivity-type semiconductor layer, respectively; a transparent support substrate disposed on the first surface of the light emitting structure; and a transparent adhesive layer disposed between the first surface of the light emitting structure and the transparent support substrate.

17 Claims, 44 Drawing Sheets

(51) Int. Cl.
*H01L 33/50* (2010.01)
*H01L 33/44* (2010.01)
*H01L 33/00* (2010.01)
*F21Y 103/10* (2016.01)
*F21Y 115/10* (2016.01)
*F21S 8/02* (2006.01)
*F21V 23/00* (2015.01)
*F21K 9/275* (2016.01)
*F21K 9/237* (2016.01)

(52) U.S. Cl.
CPC ............. *F21S 8/026* (2013.01); *F21V 23/005* (2013.01); *F21Y 2103/10* (2016.08); *F21Y 2115/10* (2016.08); *H01L 33/0079* (2013.01); *H01L 33/44* (2013.01); *H01L 2224/11* (2013.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,956,247 B1 * | 10/2005 | Stockman | H01L 33/50 257/94 |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,391,046 B2 | 6/2008 | Tsutsumi et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,455,285 B2 | 6/2013 | Yun | |
| 8,459,832 B2 | 6/2013 | Kim | |
| 8,470,621 B2 | 6/2013 | Kuo et al. | |
| 8,502,242 B2 | 8/2013 | Kim | |
| 8,536,604 B2 | 9/2013 | Kwak et al. | |
| 8,637,888 B2 | 1/2014 | Hodota et al. | |
| 8,686,430 B2 | 4/2014 | Chen | |
| 8,735,931 B2 | 5/2014 | Han et al. | |
| 8,766,295 B2 | 7/2014 | Kim | |
| 8,960,932 B2 | 2/2015 | You et al. | |
| 9,070,844 B2 | 6/2015 | Kimura et al. | |
| 9,070,852 B2 | 6/2015 | Lee et al. | |
| 9,401,348 B2 | 7/2016 | Yoon et al. | |
| 2005/0194876 A1 * | 9/2005 | Shimada | A61B 1/0638 313/110 |
| 2006/0278884 A1 | 12/2006 | Chen | |
| 2008/0197378 A1 | 8/2008 | Kong et al. | |
| 2009/0081821 A1 | 3/2009 | Aihara | |
| 2009/0110017 A1 | 4/2009 | Aihara | |
| 2009/0267484 A1 * | 10/2009 | Kasakura | C09K 11/0883 313/502 |
| 2009/0291518 A1 * | 11/2009 | Kim | H01L 33/0079 438/33 |
| 2011/0018017 A1 * | 1/2011 | Bierhuizen | H01L 33/46 257/98 |
| 2011/0031516 A1 * | 2/2011 | Basin | H01L 33/507 257/98 |
| 2013/0193466 A1 | 8/2013 | Sudhiranjan et al. | |
| 2014/0138729 A1 | 5/2014 | Kim et al. | |
| 2014/0151635 A1 | 6/2014 | Chu et al. | |
| 2014/0179029 A1 | 6/2014 | Bhat et al. | |
| 2014/0183586 A1 | 7/2014 | Kamiya et al. | |
| 2014/0203320 A1 | 7/2014 | Ibbetson et al. | |
| 2014/0209955 A1 | 7/2014 | Kim et al. | |
| 2014/0226330 A1 | 8/2014 | Yun | |
| 2014/0339581 A1 | 11/2014 | Kwon et al. | |
| 2014/0362536 A1 | 12/2014 | Mishra et al. | |
| 2015/0069439 A1 * | 3/2015 | Deeben | H01L 33/501 257/98 |
| 2015/0137169 A1 | 5/2015 | Chen et al. | |
| 2015/0162315 A1 | 6/2015 | Yu et al. | |
| 2015/0243853 A1 | 8/2015 | Cha et al. | |
| 2015/0340346 A1 * | 11/2015 | Chu | H01L 25/0753 257/89 |
| 2016/0027969 A1 * | 1/2016 | Denis | H01L 33/0095 257/98 |
| 2017/0040505 A1 * | 2/2017 | You | H01L 33/507 |
| 2017/0067620 A1 * | 3/2017 | Sano | G02B 5/0278 |
| 2017/0098743 A1 * | 4/2017 | Chen | H01L 33/507 |

FOREIGN PATENT DOCUMENTS

| | | |
|---|---|---|
| CN | 103982785 A | 8/2014 |
| CN | 104253205 A | 12/2014 |
| JP | 2008-205468 A | 9/2008 |
| JP | 2011-60966 A | 3/2011 |
| KR | 101299942 B1 | 8/2013 |
| KR | 1020140047870 A | 4/2014 |
| KR | 1020140074040 A | 6/2014 |
| KR | 1020150000384 A | 1/2015 |
| KR | 1020150012538 A | 2/2015 |
| KR | 1020150025438 A | 3/2015 |
| KR | 1020150052513 A | 5/2015 |
| WO | 2015012513 A1 | 1/2015 |

OTHER PUBLICATIONS

Communication issued Aug. 28, 2017 by the Korean Intellectual Property Office in counterpart Korean Patent Application No. 10-2016-0015233.

Communication dated Feb. 2, 2018, issued by the State Intellectual Property Office of the People's Republic of China in counterpart Chinese Patent Application No. 201610357748.6.

* cited by examiner

SEMICONDUCTOR LIGHT EMITTING DEVICE

CROSS-REFERENCE TO RELATED APPLICATIONS

This application claims priority from Korean Patent Application Number 10-2015-0073930 filed on May 27, 2015, Korean Patent Application Number 10-2015-0138683 filed on Oct. 1, 2015 and Korean Patent Application Number 10-2016-0015233 filed on Feb. 5, 2016 in the Korean Intellectual Property Office, the disclosures of which are incorporated herein by reference in their entirety.

BACKGROUND

1. Field

Apparatuses and methods consistent with exemplary embodiments of the inventive concept relate to a semiconductor light emitting device.

2. Description of the Related Art

In general, semiconductor light emitting diodes (LEDs) are commonly used as light source due to various inherent advantages thereof, such as low power consumption, high levels of luminance, and the like. In particular, recently, semiconductor light emitting devices have been used as backlight in display devices such as large liquid crystal displays (LCDs), as well as in general lighting devices.

A substrate (hereinafter, referred to as a "growth substrate") used for epitaxial growth of semiconductor light emitting devices may be removed due to an electrical connection or an optical loss problem. In this case, other means may be required to support an epitaxial thin film.

SUMMARY

Example embodiments of the inventive concept provide semiconductor light emitting devices having improved light extraction efficiency, while retaining a flip chip structure.

According to an aspect of an example embodiment, there is provided a semiconductor light emitting device which may include: a light emitting structure including a first conductivity-type semiconductor layer and a second conductivity-type semiconductor layer respectively providing a first surface and a second surface, opposite to each other, of the light emitting structure, and an active layer interposed between the first conductivity-type semiconductor layer and the second conductivity-type semiconductor layer, a region of the first conductivity-type semiconductor layer being open toward the second surface, and the first surface having a concavo-convex portion disposed thereon; a first electrode and a second electrode disposed on the region of the first conductivity-type semiconductor layer and a region of the second conductivity-type semiconductor layer, respectively; a transparent support substrate disposed on the first surface of the light emitting structure; and a transparent adhesive layer disposed between the first surface of the light emitting structure and the transparent support substrate.

At least one of the transparent support substrate and the transparent adhesive layer may include a wavelength conversion material converting at least a portion of light having a first wavelength and generated by the active layer into light having a second wavelength. The transparent adhesive layer may have a refractive index between a refractive index of the first conductivity-type semiconductor layer and a refractive index of the transparent support substrate.

The transparent adhesive layer may include at least one material selected from the group consisting of polyacrylate, polyimide, polyamide, and benzocyclobutene (BCB). The transparent support substrate may be a glass substrate.

An area of the first surface of the light emitting structure in which the concavo-convex portion is formed may be 80% or greater of an entire area of the first surface.

According to an aspect of an example embodiment, there is provided a semiconductor light emitting device which may include: a light emitting structure comprising a first surface and a second surface opposite to each other, the first surface comprising an uneven surface; and a transparent support substrate disposed on the first surface of the light emitting structure to structurally support the light emitting structure, wherein the transparent support substrate contains a wavelength conversion material converting at least a portion of light having a first wavelength and generated at the light emitting structure into light having a second wavelength.

The light emitting structure may include: an n-type semiconductor layer; a p-type semiconductor layer; an active layer interposed between the n-type and p-type semiconductor layers to generate light; and a buffer layer disposed on the n-type semiconductor layer and providing the uneven surface. The buffer layer may be formed of AlN, AlGaN or InGaN. The light emitting structure may be a structure grown on a growth substrate which comprises at least one of sapphire, SiC, $MgAl_2O_4$, MgO, $LiAlO_2$ and $LiGaO_2$, and is replaced by the transparent support substrate to obtain the semiconductor light emitting device. The uneven surface is formed on the first surface of the light emitting structure after the growth substrate is removed to obtain the semiconductor light emitting device.

The semiconductor light emitting device may further include an optical filter layer disposed on a surface of the transparent support substrate and blocking light having the first wavelength while allowing light having the second wavelength to be transmitted therethrough.

The semiconductor light emitting device may further include a color filter layer disposed on the optical filter layer and allowing light partially within a wavelength band of the second wavelength to be selectively transmitted therethrough.

The semiconductor light emitting device may further include a light diffusion layer disposed on the color filter layer and diffusing emitted light.

According to an aspect of an example embodiment, there is provided a semiconductor light emitting device which may include: a light emitting structure including a first conductivity type semiconductor layer, an active layer, and a second conductivity type semiconductor layer, a first through hole being formed inside the light emitting structure; an etch stop layer disposed on a top surface of the second conductivity type semiconductor layer of the light emitting structure, the etch stop layer comprising a second through hole communicating with the first through hole and used to stop etching when the first through hole is formed; a current spreading layer disposed on top surfaces of the second conductivity type semiconductor layer of the light emitting structure, the second through hole and the etch stop layer, and used to apply a voltage to the second conductivity type semiconductor layer; a first electrode structure on a bottom surface of the first conductivity type semiconductor layer and electrically connected to the first conductivity type semiconductor layer; a second electrode structure on the bottom surface of the first conductivity type semiconductor layer and electrically connected to the current spreading layer through the first through hole and the second through hole; a transparent adhesive layer on the current spreading layer; and a transparent support substrate adhered onto the transparent adhesive layer.

The first conductivity-type semiconductor layer may be an n-type semiconductor layer, and the second conductivity-type semiconductor layer may be a p-type semiconductor layer.

The semiconductor light emitting device may further include a graded index layer disposed between the current spreading layer and the transparent adhesive layer.

The semiconductor light emitting device may further include a reflective layer disposed on internal surfaces of the first through hole and the second through hole and on the bottom surface of the first conductivity-type semiconductor layer.

BRIEF DESCRIPTION OF DRAWINGS

Example embodiments of the present inventive concept will be more clearly understood from the following detailed description taken in conjunction with the accompanying drawings, in which:

FIGS. 16A through 28A and 16B through 28B are cross-sectional views illustrating major processes of a method of manufacturing a semiconductor light emitting device, according to an example embodiment of the inventive concept;

DETAILED DESCRIPTION

Figure 1:
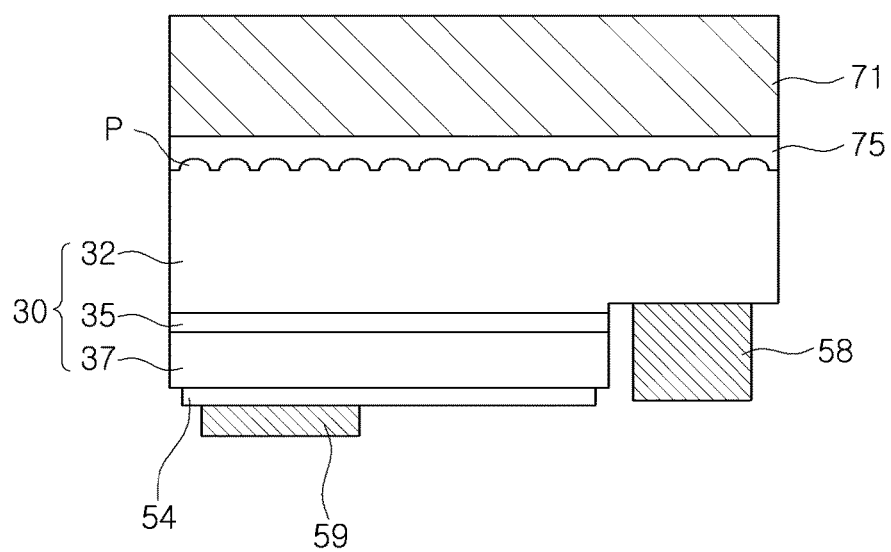
FIG. 1 is a cross-sectional view illustrating a semiconductor light emitting device, according to an example embodiment of the inventive concept.

Hereinafter, example embodiments of the inventive concept will be described with reference to the accompanying drawings. The inventive concept may, however, be embodied in many different forms and should not be construed as being limited to the example embodiments set forth herein; rather, these example embodiments are provided so that this disclosure will be thorough and complete, and will fully convey the inventive concept to those of ordinary skill in the art. It should be understood, however, that there is no intent to limit the inventive concept to the particular forms disclosed, but on the contrary, the inventive concept is to cover all modifications, equivalents, and alternatives falling within the spirit and scope of the inventive concept. In the drawings, the dimensions of structures are exaggerated for clarity of the inventive concept.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items. Expressions such as "at least one of", when preceding a list of elements, modify the entire list of elements and do not modify the individual elements of the list.

Also, though terms "first" and "second" are used to describe various members, components, regions, layers, and/or portions in various embodiments of the inventive concept, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment may be referred to as a second member, a second component, a second region, a second layer, or a second portion in another embodiment.

Spatially relative terms, such as "above", "upper", "beneath", "below", "lower", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein describes particular embodiments only and the inventive concept is not limited thereby. As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Hereinafter, example embodiments of the inventive concept will be described with reference to the accompanying drawings. In the accompanying drawings, the modifications of the illustrated shapes may be expected according to manufacturing technologies and/or tolerance. Therefore, the example embodiments should not be construed as being limited to specific shapes of the illustrated regions. The shapes may be changed during the manufacturing processes. The following example embodiments may be combined.

The contents of the inventive concept described below may have a variety of configurations and propose only a required configuration herein, but are not limited thereto.

FIG. 1 is a cross-sectional view illustrating a semiconductor light emitting device, according to an example embodiment of the inventive concept.

A semiconductor light emitting device 50 according to an example embodiment includes a light emitting structure 30 including a first conductivity-type semiconductor layer 32, a second conductivity-type semiconductor layer 37, and an active layer 35 interposed therebetween, and a transparent support substrate 71 supporting the light emitting structure 30.

The first conductivity-type semiconductor layer 32 may be a nitride semiconductor satisfying n-type $Al_xIn_yGa_{1-x-y}N$, where $0 \leq x \leq 1$, $0 \leq y \leq 1$, and $0 \leq x+y \leq 1$, and an n-type impurity may be silicon (Si). For example, the first conductivity-type semiconductor layer 32 may be an n-type GaN. The second conductivity-type semiconductor layer 37 may be a nitride semiconductor layer satisfying p-type $Al_xIn_yGa_{1-x-y}N$, and a p-type impurity may be magnesium (Mg). For example, the second conductivity-type semiconductor layer 37 may be a p-type AlGaN/GaN. The active layer 35 may have a multi-quantum well (MQW) structure in which a quantum well layer and a quantum barrier layer are alternately stacked. For example, in a case where a nitride semiconductor is used, the active layer 35 may have a GaN/InGaN MQW structure.

The light emitting structure 30 has first and second surfaces respectively provided by a first conductivity-type semiconductor layer 32 and a second conductivity-type semiconductor layer 37. The first and second surfaces may be disposed to be opposite to each other.

A first electrode 58 and a second electrode 59 respectively connected to the first conductivity-type semiconductor layer 32 and the second conductivity-type semiconductor layer 37 may be disposed on the second surface of the light emitting structure 30. An ohmic-contact layer 54 may be provided between the second conductivity-type semiconductor layer 37 and the second electrode 59.

The light emitting structure 30 may have a concavo-convex portion P formed on the first surface thereof. The concavo-convex portion P may be formed by processing at least a portion of the first conductivity-type semiconductor layer 32. The concavo-convex portion P may be a protrusion having a hemispherical shape such as in the present example embodiment, but a configuration of the concavo-convex portion P is not limited thereto and the concavo-convex portion P may be implemented by making the first surface of the light emitting structure 30 uneven. The uneven structure may take various different shapes. An area of the first surface of the light emitting structure 30 in which the concavo-convex portion P is formed may be 80% or greater of an entire area of the first surface. Preferably, but not necessarily, in order to increase light extraction efficiency, the area in which the concavo-convex portion P is formed may be 90% or greater of the entire area of the first surface.

The transparent support substrate 71 may be provided as a main path along which light generated by the active layer 35 is emitted. The transparent support substrate 71 may be formed of a transparent material as a support substrate replacing a growth substrate used to grow the light emitting structure 30. For example, the transparent support substrate 71 may be a glass substrate.

In a specific example embodiment, the transparent support substrate 71 may be a support containing a wavelength conversion material such as a phosphor or a quantum dot. For example, the transparent support substrate 71 may be formed of a silicon resin mixed with a wavelength conversion material or a transparent liquid resin such as an epoxy resin.

In another example, in a case where the transparent support substrate 71 is a glass substrate, a wavelength conversion material such as a phosphor may be mixed in a glass composition, and the mixture may be sintered at a low temperature to manufacture a support containing the wavelength conversion material.

The transparent support substrate 71 may be adhered to the first surface of the light emitting structure 30 using a transparent adhesive layer 75. For example, the transparent adhesive layer 75 may include a material selected from polyacrylate, polyimide, polyamide, and benzocyclobutene (BCB). The transparent adhesive layer 75 may be a layer for matching refractive indices of the transparent support substrate 71 and the light emitting structure 30. The refractive index of the transparent adhesive layer 75 may be greater than that of the transparent support substrate 71. For example, in a case where the transparent support substrate 71 is glass having a refractive index of about 1.5, the transparent adhesive layer 75 may have a refractive index greater than 1.5.

Also, the refractive index of the transparent adhesive layer 75 may be lower than that of the first conductivity-type semiconductor layer 32. For example, in a case where the first conductivity-type semiconductor layer 32 is n-type GaN (refractive index: about 2.3), the refractive index of the transparent adhesive layer 75 may be 2.3 or lower.

The transparent adhesive layer 75 may be configured to act as a wavelength conversion layer for converting a wavelength of light generated by the active layer 35, as well as acting as a refractive index matching layer. For example, the transparent adhesive layer 75 may include a wavelength conversion material such as a phosphor (please refer to FIG. 3).

Figure 2:
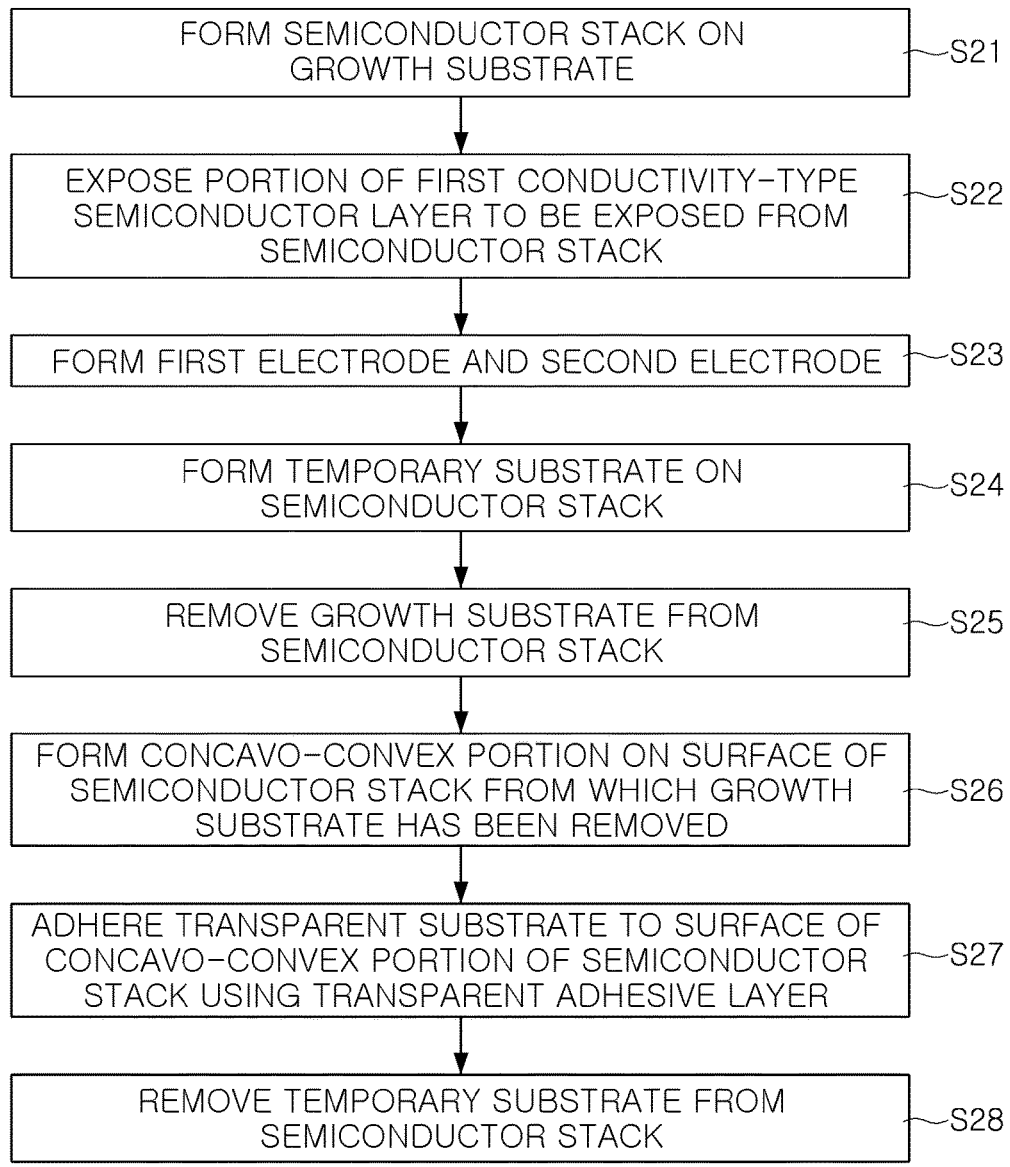
FIG. 2 is a flow chart illustrating a method of manufacturing a semiconductor light emitting device, according to an example embodiment of the inventive concept.

FIG. 2 is a flow chart illustrating a method of manufacturing a semiconductor light emitting device, according to an example embodiment of the inventive concept. The manufacturing method may be understood as being a method of manufacturing the semiconductor light emitting device illustrated in FIG. 1.

In operation S21, a light emitting structure for a light emitting device may be formed on a growth substrate.

The light emitting structure may include a first conductivity-type semiconductor layer, an active layer, and a second conductivity-type semiconductor layer, and may be a nitride semiconductor described above. The light emitting structure may be grown on the growth substrate using a method such as metal-organic chemical vapor deposition (MOCVD), molecular beam epitaxy (MBE), or hydride vapor phase epitaxy (HVPE). The growth substrate may be an insulating, conductive, or semiconductor substrate. For example, the growth substrate may be formed of sapphire, SiC, Si, $MgAl_2O_4$, MgO, $LiAlO_2$, $LiGaO_2$, or GaN.

In operation S22, a region of the first conductivity-type semiconductor layer may be partially exposed from the light emitting structure.

This process may be realized through an etching method of partially removing the second conductivity-type semiconductor layer and the active layer. The exposed region of the first conductivity-type semiconductor layer may be provided as a region where a first electrode is disposed.

In operation S23, a first electrode and a second electrode may be formed on the exposed region of the first conductivity-type semiconductor layer and on a region of the second conductivity-type semiconductor layer, respectively.

For example, The first electrode and the second electrode may include a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au). Each of the first electrode and the second electrode may be a single layer or may have a structure including two or more layers. Although not limited thereto, the first electrode and the second electrode may be formed through a single electrode formation process, and in this case, the same electrode material may be used.

In operation S24, a temporary substrate (or a temporary support) may be provided on the surface of the light emitting structure in which the first and second electrodes are formed.

Since the temporary substrate is a temporary support structure temporarily supporting the light emitting structure in a follow-up process, it is not required to be transparent, and thus, supports formed of various materials may be used. The temporary substrate may be adhered using various energy-curable joining materials, such as a ultraviolet (UV)-cured resin, as an adhesive. Also, the temporary substrate is removed in a follow-up process, a temporary substrate and a joining material easy to remove and clean may be selectively used.

In operation S25, the growth substrate is removed from the light emitting structure.

The removing of the growth substrate may be performed through various methods such as laser lift-off (LLO), mechanical polishing, chemical-mechanical polishing, or chemical etching. For example, in a case where the growth substrate is a sapphire substrate, the LLO method may be used. In a case where the growth substrate is a silicon substrate, mechanical or chemical-mechanical polishing may be used.

In operation S26, a concavo-convex portion is formed on the surface of the light emitting structure from which the growth substrate has been removed.

A concavo-convex portion may be formed on the surface of the light emitting structure from which the growth substrate has been removed, in order to enhance light extraction efficiency. The concavo-convex portion may be formed through dry etching using a photoresist pattern. The concavo-convex portion may have various shapes. For example, a fill factor of the concavo-convex portion (that is, an area occupied by the concavo-convex portion in the overall area of the corresponding surface) may be sufficiently secured, and light extraction efficiency may be significantly improved. For example, in the area of the first surface of the light emitting structure 30, an area in which the concavo-convex portion P is formed may be 80% or greater of an entire area of the first surface. Preferably, but not necessarily, the area in which the concavo-convex portion P is formed may be 90% or greater of the entire area of the first surface in order to further enhance light extraction efficiency.

In operation S27, a transparent support substrate is adhered to the surface of the light emitting structure with the concavo-convex portion formed thereon using a transparent adhesive layer.

The transparent support substrate may be a support substrate replacing the growth substrate and the temporary substrate. The transparent support substrate is provided as a main path along which light is emitted, and thus, it may be formed of a transparent material. For example, the transparent support substrate may be a glass substrate. If necessary, a thickness of the glass substrate may be adjusted through additional polishing.

The transparent adhesive layer provided between the transparent support substrate and the light emitting structure may include a material selected from among polyacrylate, polyimide, polyamide, and benzocyclobutene (BCB). As described above, the transparent adhesive layer may have a refractive index between those of the transparent support substrate and the light emitting structure so as to be used as a refractive index matching layer for enhancing light extraction efficiency. Also, the transparent adhesive layer may be configured to act as a wavelength conversion layer for converting a wavelength of emitted light.

In operation S28, the temporary substrate is removed from the light emitting structure.

After the transparent support substrate is adhered, the temporary substrate may be removed. In order to remove the temporary substrate, various removal methods such as chemical, mechanical, and physical (thermal shock removal for example) may be used. In a case where a curable resin layer is used to adhere the temporary substrate, a cleaning process may be additionally performed to remove the curable resin layer and clean a surface of an electrode.

The above method of the present example embodiment may be applied to a process of manufacturing various types of semiconductor light emitting devices. For example, a process of manufacturing a nitride semiconductor light emitting device using a silicon substrate may be advantageously applied to the present example embodiment.

Figure 3:
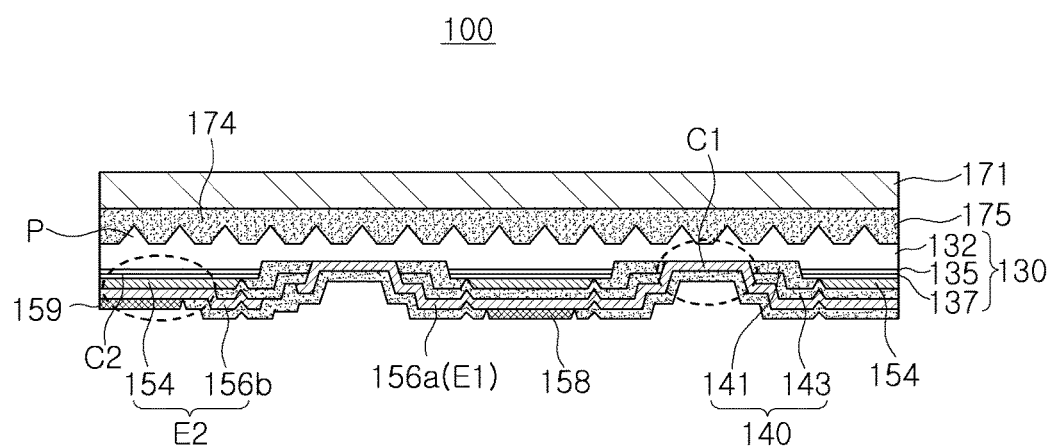
FIG. 3 is a cross-sectional view according to an example embodiment of the present inventive concept illustrating a semiconductor light emitting device.

FIG. 3 is a cross-sectional view illustrating a semiconductor light emitting device, according to an example embodiment of the inventive concept.

A semiconductor light emitting device 100 according to the present example embodiment includes a light emitting structure 130 including a first conductivity-type semiconductor layer 132, a second conductivity-type semiconductor layer 137, and an active layer 135 interposed therebetween, and a transparent support substrate 171 supporting the light emitting structure 130.

A first conductivity-type semiconductor layer 132 and a second conductivity-type semiconductor layer 137 and the active layer 135 may be nitride semiconductors described above with reference to FIG. 1. The light emitting structure 130 has first and second surfaces respectively provided by the first conductivity-type semiconductor layer 132 and the second conductivity-type semiconductor layer 137.

A hole penetrating through the second conductivity-type semiconductor layer 137 and the active layer 135 to reach a region of the first conductivity-type semiconductor layer 132 is formed on the second surface of the light emitting structure 130. The hole may have a circular or hexagonal shape when viewed from above or in a plan view, or may extend to have a groove shape as necessary. A first electrode E1 is disposed in the hole and connected to the first conductivity-type semiconductor layer 132.

A second electrode E2 may be disposed on the top surface of the second conductivity-type semiconductor layer 137. The second electrode E2 may include an ohmic-contact layer 154 and a second conductive layer 156*b*. The second conductive layer 156*b* may be formed of the same material as that of a first conductive layer 156*a* of the first electrode E1. For example, the two conductive layers 156*a* and 156*b* may include a material such as Ag, Ni, Al, Rh, Pd, Ir, Ru, Mg, Zn, Pt, or Au. Each of the two conductive layers 156*a* and 156*b* may be a single layer or may have a structure including two or more layers. The first conductive layer 156*a* and the second conductive layer 156*b* may be formed through a single electrode formation process, and in this case, the same electrode material may be used. An example of the process may be understood with reference to FIGS. 4C through 4F.

An insulating layer 140 specifying first and second contact areas C1 and C2 for electrode formation may be formed on the second surface of the light emitting structure 130. The insulating layer 140 may include first and second insulating layers 141 and 143. The first insulating layer 141 may be formed to open the first and second contact areas C1 and C2, and the second insulating layer 143 may be formed to open the first contact area C1 and cover the second contact area C2.

A portion of the first electrode E1 may extend to the top surface of the insulating layer 140, and may overlap the second electrode E2 with the insulating layer 140 interposed therebetween. First and second solder pads 158 and 159 may be formed on the overlapping portion of the first electrode E1 and an exposed portion of the second electrode E2, respectively. An additional insulating layer 147 has openings for forming the first and second solder pads 158 and 159. The first and second solder pads 158 and 159 may include under bump metallurgy (UBM).

The light emitting structure 130 may have a concavo-convex portion P formed on the first surface thereof. In the present example embodiment, a cross-section of the concavo-convex portion P may have a triangular protrusion (for example, a hexagonal pyramid), or may have various other shapes as necessary. The concavo-convex portion P may be formed by processing a surface of the first conductivity-type semiconductor layer 132. According to an example embodiment, at least a portion of a buffer layer 110 (please refer to FIG. 4A) used when the light emitting structure 130 is grown may be formed as a concavo-convex portion P. An area of the first surface of the light emitting structure 130 in which the concavo-convex portion P is formed may be 80% or greater of an entire area of the first surface. Preferably, but not necessarily, in order to increase light extraction efficiency, the area in which the concavo-convex portion P is formed may be 90% or greater of the entire area of the first surface.

The transparent support substrate 171 may be provided as a main path along which light generated by the active layer 135 is emitted. The transparent support substrate 171 may be formed of a transparent material as a support substrate replacing a growth substrate used to grow the light emitting structure 130. For example, the transparent support substrate 171 may be a glass substrate.

The transparent support substrate 171 may be adhered to the first surface of the light emitting structure 130 using a transparent adhesive layer 175. For example, the transparent adhesive layer 175 may include a material selected from polyacrylate, polyimide, polyamide, and benzocyclobutene (BCB). The transparent adhesive layer 175 may be a layer for matching refractive indices of the transparent support substrate 171 and the light emitting structure 130. The refractive index of the transparent adhesive layer 175 may be between a refractive index of the transparent support substrate 171 and a refractive index of the first conductivity-type semiconductor layer 132. For example, in a case where the transparent support substrate 171 is glass having a refractive index of about 1.5, the transparent adhesive layer 175 may be formed of a material having a refractive index greater than 1.5 and smaller than 2.3.

The transparent adhesive layer 175 may include a wavelength conversion material 174 such as a phosphor. For example, the transparent adhesive layer 175 may be formed of a BCB material in which red and green phosphors are dispersed. In such a structure, a process of forming a wavelength conversion unit may be omitted or simplified.

Using the transparent adhesive layer 175, the transparent support substrate 171 may be easily adhered to the surface with the concavo-convex portion formed thereon, and light extraction efficiency of the device 100 may be enhanced through refractive index matching using the refractive index of the transparent adhesive layer 175. In addition, since the transparent adhesive layer 175 contains the wavelength conversion material 174, an additional wavelength conversion unit formation process may be simplified.

FIGS. 4 and 5 are cross-sectional views illustrating major processes of a method of manufacturing a semiconductor light emitting device, according to an example embodiment of the inventive concept. The manufacturing method may be divided into a device manufacturing process (FIGS. 4A through 4F) and a substrate replacing process (FIGS. 5A through 5F).

Figure 4A:
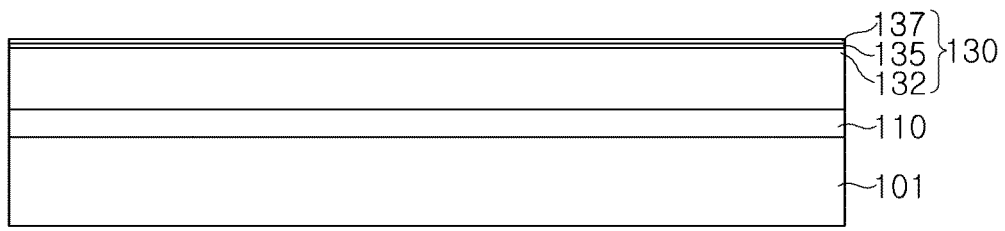
FIGS. 4A through 4F are cross-sectional views illustrating a method of manufacturing a semiconductor light emitting device, according to an example embodiment of the inventive concept.

Referring to FIG. 4A, a buffer layer 110 is formed on a growth substrate 101, and a light emitting structure 130 for a light emitting device may be formed on the buffer layer 110. The light emitting structure 130 may include a first conductivity-type semiconductor layer 132, an active layer 135, and a second conductivity-type semiconductor layer 137.

The buffer layer 110 may include $In_xAl_yGa_{1-x-y}N$, where $0 \leq x \leq 1$ and $0 \leq y \leq 1$. For example, the buffer layer 110 may be formed of AlN, AlGaN or InGaN. If necessary, a plurality of layers may be combined to be used as a buffer layer or a material composition in the buffer layer may be gradually changed. When the growth substrate is a silicon substrate and a nitride semiconductor layer is grown as a light emitting structure, the buffer layer may have various types of composite buffer structure. This will be described in detail with reference to FIGS. 6 and 7.

Each layer of the light emitting structure 130 may be a nitride semiconductor described above in the previous example embodiment, and may be grown on a growth substrate 101 using a method such as MOCVD, MBE, or HVPE.

Figure 4B:
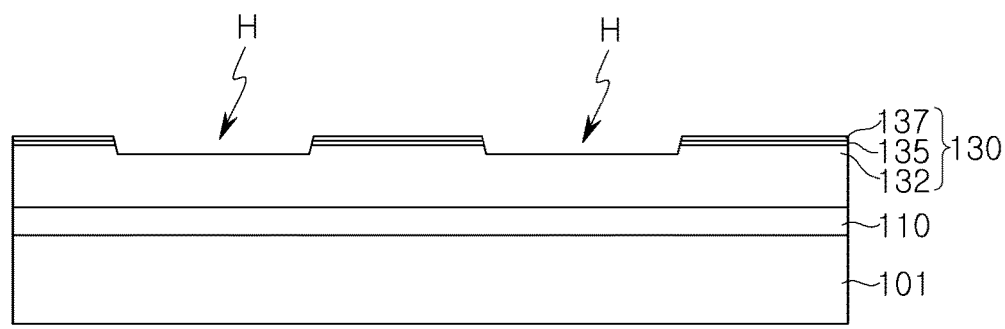

Subsequently, as illustrated in FIG. 4B, a hole H partially exposing a region of the first conductivity-type semiconductor layer 132 may be formed in the light emitting structure 130.

This process may be realized by an etching method of partially removing regions of the second conductivity-type semiconductor layer 137 and the active layer 135. The region of the first conductivity-type semiconductor layer 132 exposed by the hole H may be provided as a region where a first electrode is formed.

Thereafter, a first electrode E1 and a second electrode E2 may be formed to be connected to a region of the first conductivity-type semiconductor layer 132 and a region of the second conductivity-type semiconductor layer 137, respectively.

In the present example embodiment, the electrode formation process may be realized through the process illustrated in FIGS. 4C through 4F.

Figure 4C:
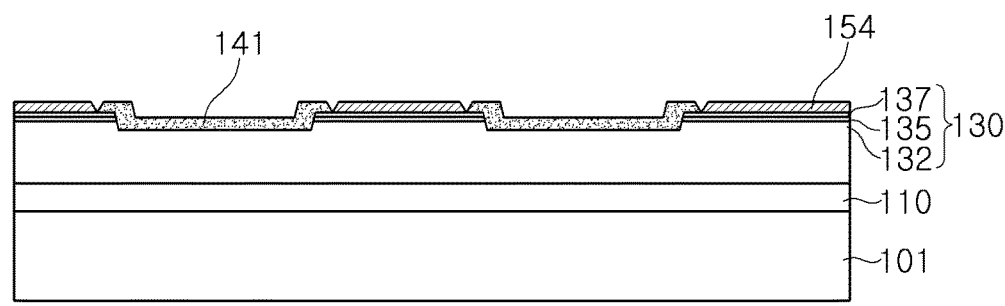

First, as illustrated in FIG. 4C, an ohmic-contact layer 154 may be formed on the top surface of the second conductivity-type semiconductor layer 137.

This process may be realized by forming a first insulating layer 141 on the entire top surface of the light emitting structure 130, allowing a region in which the ohmic-contact layer 154 is to be formed to be exposed using a mask, and subsequently depositing the ohmic-contact layer 154 on the exposed region.

The first insulating layer 141 may be formed of $SiO_2$, $Si_3N_4$, $HfO_2$, SiON, $TiO_2$, $Ta_2O_3$, or $SnO_2$. As described above, the insulating layer 141 may be a distributed Bragg reflector (DBR) multilayer formed by alternately stacking dielectric layers having different refractive indices.

The ohmic-contact layer 154 may include a highly reflective ohmic contact material forming ohmic-contact with the second conductivity-type semiconductor layer 137 and having high reflectivity. For example, the ohmic-contact layer 154 may include silver (Ag) or Ag/Ni. The ohmic-contact layer 154 may further include a barrier layer. For example, the barrier layer may be formed of titanium (Ti) or Ni/Ti. The barrier layer may prevent a partial component of a solder bump formed in a follow-up process from being spread, whereby ohmic characteristics of the ohmic-contact layer 154 may be maintained.

Figure 4D:
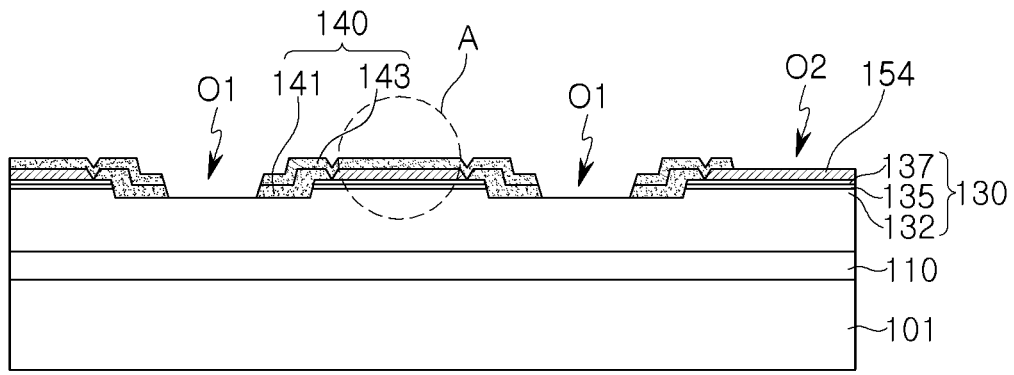

Thereafter, as illustrated in FIG. 4D, a second insulating layer 143 having first opening O1 and a second opening O2 may be formed on the top surface of the light emitting structure 130.

The first opening O1 and the second opening O2 may be formed to open an exposed region of the first conductivity-type semiconductor layer 132 and a region of the second electrode 154, respectively. In forming the first opening O1 and the second opening O2, a first insulating layer 141 may be formed using a mask for forming the first opening O1 and the second opening O2 after an insulating material is formed on the entire top surface. The first opening O1 and the second opening O2 may define a contact region for a first electrode and a second electrode, respectively. The second insulating layer 143 may be formed to cover the ohmic-contact layer 154 disposed on a partial mesa region (indicated by "A"). The second insulating layer 143 may be understood as an insulating layer 140 for passivation with the first insulating layer 141. The second insulating layer 143 may be formed of the same material as that of the first insulating layer 141.

Figure 4E:
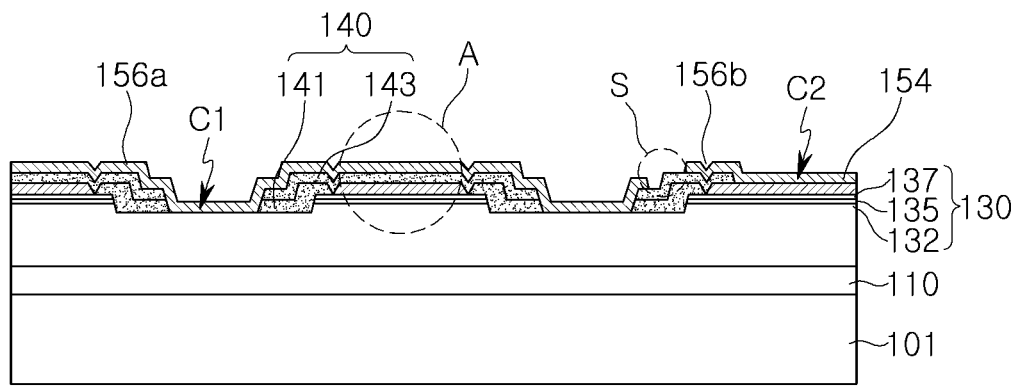

Thereafter, as illustrated in FIG. 4E, first and second conductive layers 156a and 156b may be formed to be connected to open regions of the first opening O1 and the second opening O2, respectively.

The first conductive layer 156a may be provided as a first electrode E1, and the second conductive layer 156b, together with the ohmic-contact layer 154, may be provided as a second electrode E2. This process may be performed by forming a conductive layer on the insulating layer 140 to cover the open regions of the first opening O1 and the second opening O2 and dividing the conductive layer in a specific region S to be first and second regions respectively connected to the open regions of the first opening O1 and the second opening O2. Here, the first and second regions of the conductive layer may be a first conductive layer 156a and a second conductive layer 156b, respectively. For example, the first conductive layer 156a and the second conductive layer 156b may each include a material such as Ag, Ni, Al, Rh, Pd, Ir, Ru, Mg, Zn, Pt, or Au, and may be a single layer or may have a structure including two or more layers. In a mesa region A in which the ohmic-contact layer 154 is covered by the second insulating layer 143, a portion of the first conductive layer 156a may extend to the top surface of the insulating layer 140 and may overlap the second electrode E2 with the insulating layer 140 interposed therebetween.

Figure 4F:
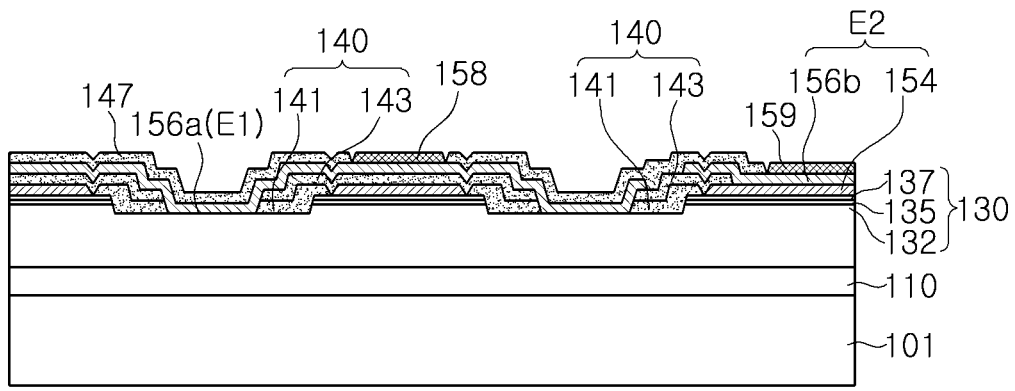

In addition, as illustrated in FIG. 4F, first and second solder pads 158 and 159 may be partially formed in a region of the first electrode E1 and partially formed in a region of the second electrode E2.

The first solder bump 158 may be partially disposed in a region of the first electrode E1 disposed on the mesa region A. In the mesa region A, the ohmic-contact layer 154 is covered by the second insulating layer 143 and a portion of the first electrode E1 may extend to the region.

The first and second solder pads 158 and 159 may include a UBM layer. For example, the first and second solder pads 158 and 159 may be multilayer structures including a titanium (Ti) film and a nickel (Ni) film disposed on the Ti film. If necessary, a copper (Cu) film may be used instead of the Ni film. In another example, the first and second solder pads 158 and 159 may be multilayered structures of Cr/Ni films or Cr/Cu films.

FIGS. 5A through 5F are cross-sectional views illustrating a method of manufacturing a semiconductor light emitting device, according to an example embodiment of the inventive concept. In these processes, the growth substrate of the previously obtained semiconductor light emitting device may be replaced with a transparent support substrate.

Figure 5A:
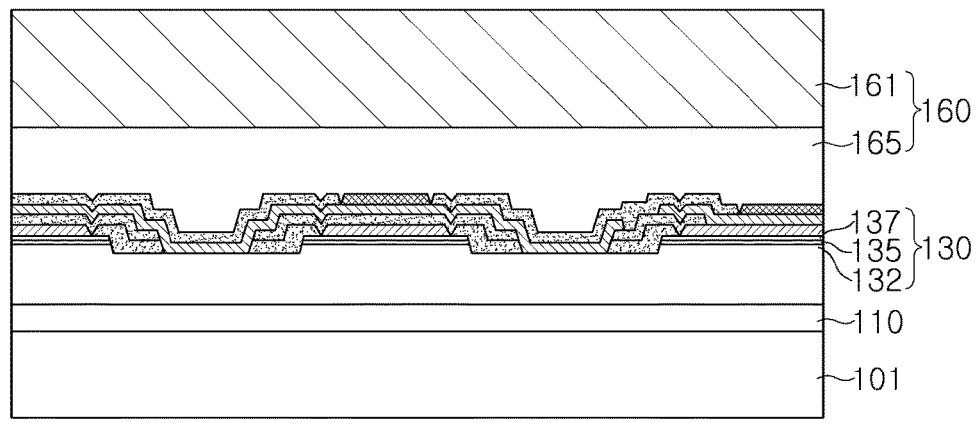
FIGS. 5A through 5F are cross-sectional views illustrating a method of manufacturing a semiconductor light emitting device, according to an example embodiment of the inventive concept.

Referring to FIG. 5A, a temporary support 160 may be provided on the second surface of the light emitting structure 130, that is, the surface on which the first electrode E1 and the second electrode E2 are formed.

The temporary support 160 may include a temporary substrate 161 and a temporary adhesive layer 165 for adhering the temporary substrate 161. For example, the temporary substrate 161 may be a quartz substrate. The temporary substrate 161 may be adhered using the temporary adhesive layer 165 such as various energy-cured resins including a UV-cured resin. Also, the temporary substrate 161 and the temporary adhesive layer 165 may be formed of a material that can easily be removed and cleaned in a follow-up process.

Figure 5B:
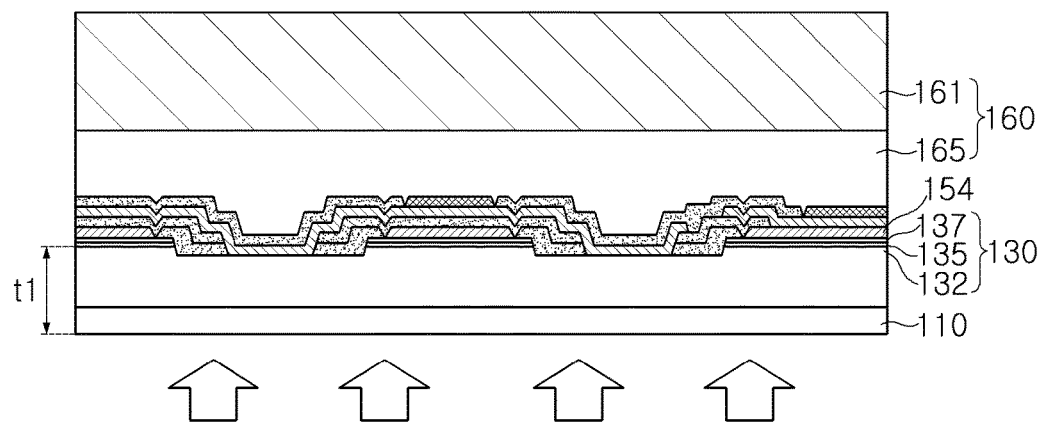

Thereafter, as illustrated in FIG. 5B, the growth substrate 101 may be removed from the light emitting structure 130.

The growth substrate 101 may be removed through various methods such as such as laser lift-off (LLO), mechanical polishing, chemical-mechanical polishing, or chemical etching. In a case where the growth substrate 101 is a silicon substrate, since mechanical strength thereof is relatively low, mechanical or chemical-mechanical polishing may be used.

In the present example embodiment, a configuration in which the buffer layer 110 remains is illustrated, but the inventive concept is not limited thereto and at least a portion of the buffer layer 110 may be removed together as necessary.

Figure 5C:
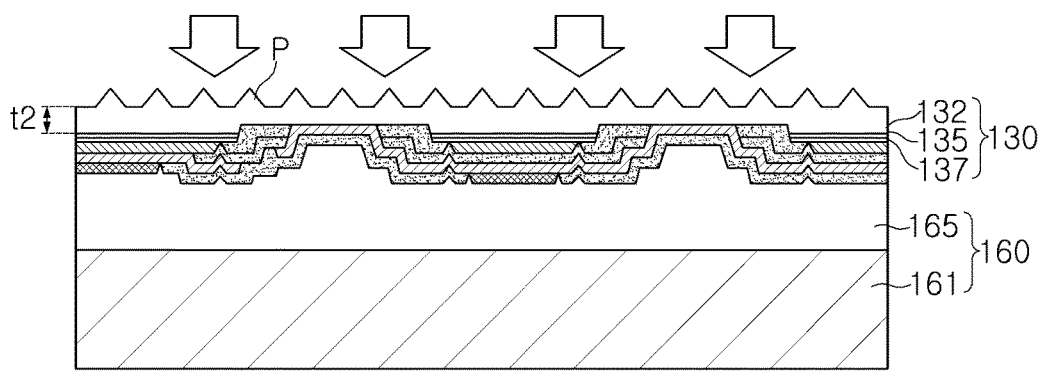

Thereafter, as illustrated in FIG. 5C, a concavo-convex portion P may be formed on the first surface of the light emitting structure 130, that is, on the surface from which the growth substrate 101 has been removed.

The concavo-convex portion P may be formed directly on the surface of the light emitting structure 130 (specifically, on the surface of the first conductivity-type semiconductor layer 132) in order to enhance light extraction efficiency. The concavo-convex portion P may be formed through dry etching using a photoresist pattern. In the course of forming the concavo-convex portion P, a thickness t1 corresponding to the second conductivity-type semiconductor layer 137 and the buffer layer 110 may be reduced to a desired thickness t2. In another example, at least a portion of the concavo-convex portion P may be formed as the buffer layer 110 by lowering an etching depth.

As described above, in this process, since there is no need to form a plane between protrusions and depressions of the concavo-convex portion P, a fill factor of the concavo-convex portion P (that is, an area occupied by the concavo-convex portion P in the overall area of the corresponding surface) may be sufficiently secured, and as a result, light extraction efficiency of the device may be significantly improved. For example, in the area of the first surface of the light emitting structure 130, an area in which the concavo-convex portion P is formed may be 80% or greater of an entire area of the first surface, and preferably, but not necessarily, 90% or greater of the entire area of the first surface.

Figure 5D:
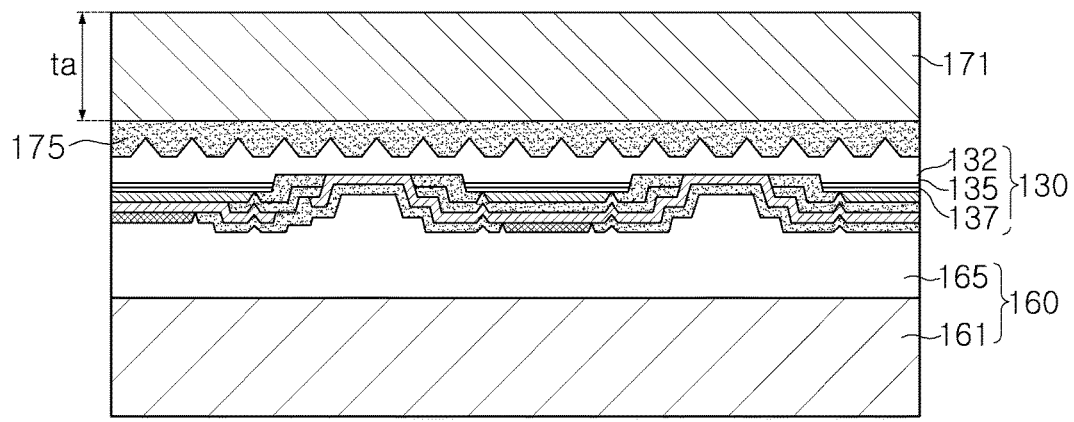

Thereafter, as illustrated in FIG. 5D, a transparent support substrate 171 may be adhered to the first surface of the light emitting structure 130, that is, the surface on which the concavo-convex portion P is formed, using the transparent adhesive layer 175.

The transparent support substrate 171 may be a permanent support substrate replacing the growth substrate and the temporary substrate. Since the transparent support substrate 171 is provided as a main path along which light is emitted, the transparent support substrate 171 may be formed of a transparent material. For example, the transparent support substrate 171 may be a glass substrate. The transparent adhesive layer 175 may include an adhesive material having transparency. As described above, the transparent adhesive layer 175 may have a refractive index between those of the transparent support substrate 171 and the light emitting structure 130 so as to be used as a refractive index matching layer for enhancing light extraction efficiency. Also, the transparent adhesive layer 175 may include a wavelength conversion material 174 for converting a wavelength of emitted light to serve as a wavelength conversion unit.

Figure 5E:
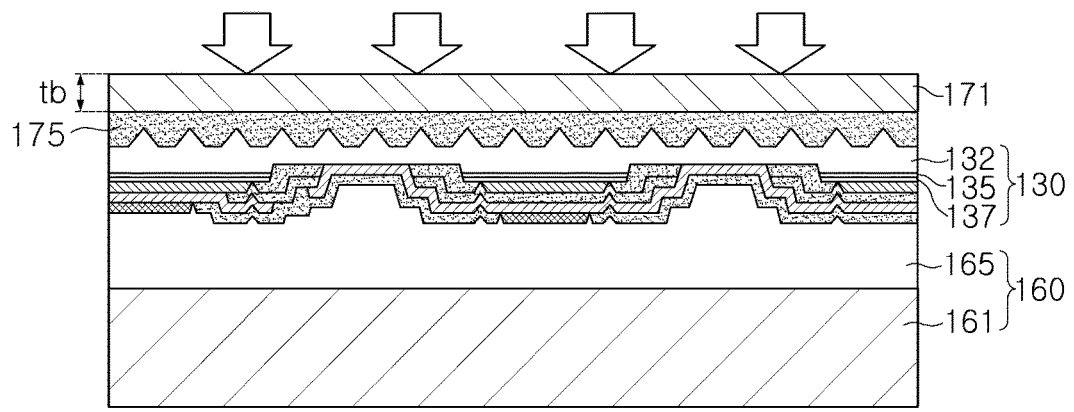

If necessary, as illustrated in FIG. 5E, the transparent support layer 171 may be polished such that a thickness to thereof is reduced to a desired thickness tb. Through this process, a desired thickness of a final semiconductor light emitting device may be determined.

Figure 5F:
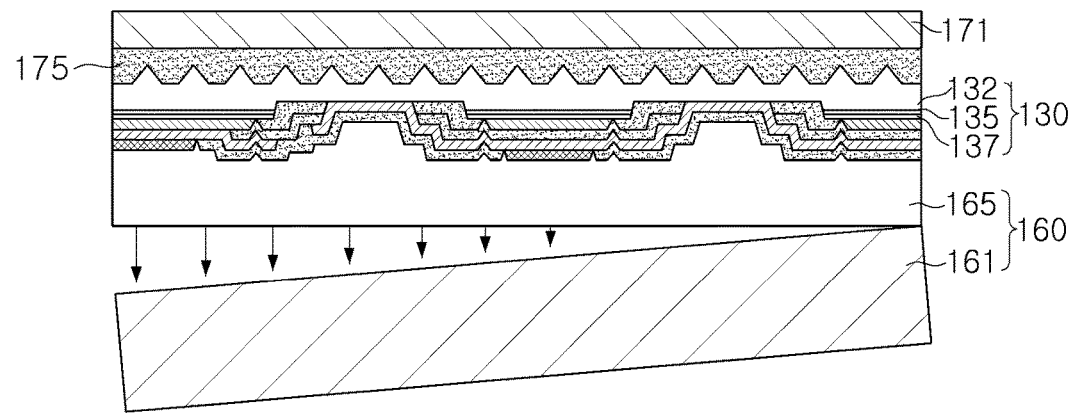

Thereafter, as illustrated in FIG. 5F, the temporary support 160 may be removed from the light emitting structure 130. This process may be performed such that the temporary substrate 161 is removed and the temporary adhesive layer 165 is subsequently removed using a cleaning method.

According to the present example embodiment, the transparent adhesive layer is introduced between the transparent support substrate and the light emitting structure and the transparent support substrate may be provided on the surface of the light emitting structure on which the concavo-convex portion is formed. The transparent adhesive layer may be utilized as a wavelength conversion structure, as well as a reflective index matching layer.

<Evaluation of Fill Factor of Concavo-Convex Portion>

A semiconductor light emitting device was manufactured to have a structure similar to that illustrated in FIG. 3, but under conditions in which a wavelength conversion material was not present (Embodiment 1). For comparison, a semiconductor light emitting device having a structure similar to that illustrated in FIG. 3 was manufactured using a growth substrate with a concavo-convex portion formed on a surface thereof (Comparative Example 1).

Both Embodiment 1 and Comparative Example 1 commonly include a concavo-convex portion formed at an interface between a light emitting structure and a substrate. However, in the semiconductor light emitting device according to Comparative Example 1, the concavo-convex portion was formed on the growth substrate, and thus, there are limitations in increasing a fill factor of the concavo-convex portion for crystal growth. As a result, a fill factor of the concavo-convex portion employed in Comparative Example 1 was 58%. In contrast, in the semiconductor light emitting device according to Embodiment 1, the concavo-convex portion was formed on the light emitting structure (specifically, on the surface of the first conductivity-type semiconductor layer) after the growth substrate was removed, and thus, a fill factor of the concavo-convex portion may be increased to 91%.

In order to confirm the effect based on the difference between the fill factors of the concavo-convex portions, optical outputs of the semiconductor light emitting devices according to Embodiment 1 and Comparative Example 1 and optical outputs of semiconductor light emitting device packages having the same structure were measured and are illustrated in Table 1.

TABLE 1

| Classification | Fill Factor of Concavo-convex Portion | Optical Output of Semiconductor Light Emitting Device | Optical Output of Semiconductor Light Emitting Device Package |
|---|---|---|---|
| Embodiment | 0.91 | 102.7% | 105% |
| Comparative Example (Reference) | 0.58 | 100% | 100% |

As illustrated in Table 1, it can be seen that the optical output of Embodiment 1 in which a fill factor of the concavo-convex portion can be increased is 2.7% and 5% greater than that of Comparative Example 1 in the device level and the package level, respectively. In general, when the fill factor of the concavo-convex portion is 80% or greater, light extraction efficiency may be significantly improved.

Hereinafter, a buffer layer used when a light emitting structure is grown with a nitride semiconductor on a silicon substrate as in the previous example embodiment will be described.

Figure 6:
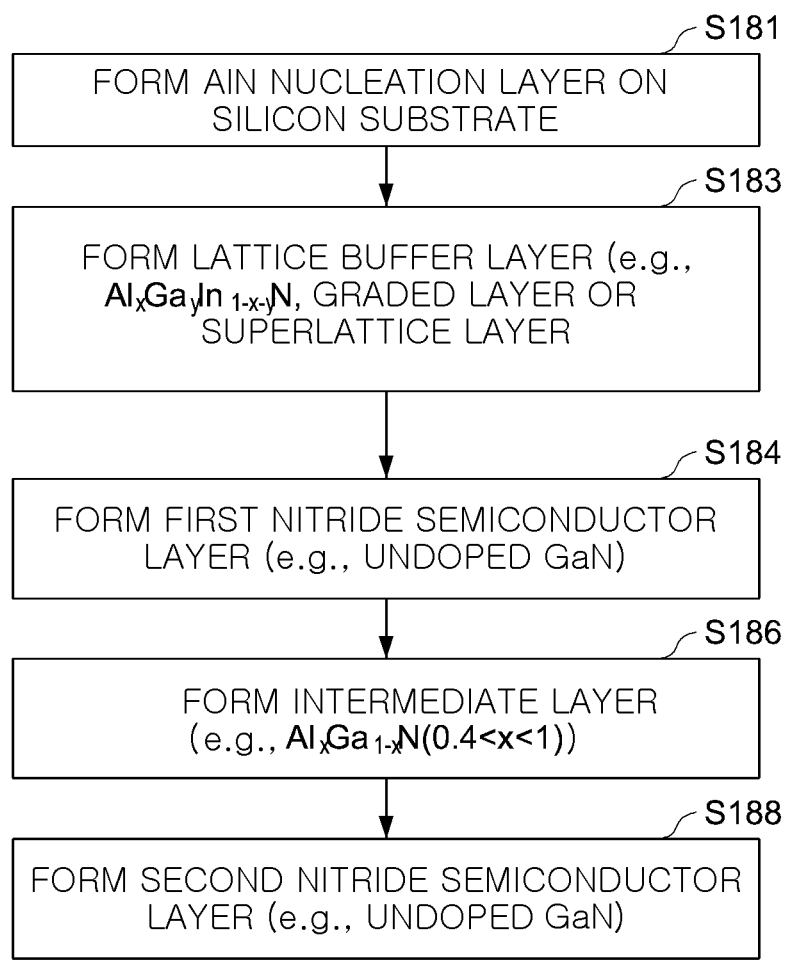
FIG. 6 is a flow chart illustrating a process of forming a composite buffer layer, according to an example embodiment of the inventive concept.

As illustrated in FIG. 6, an operation of forming a buffer layer on a silicon substrate includes operation S181 of forming a nucleation layer and operation S183 of forming a lattice buffer layer on the nucleation layer.

The operation of forming a buffer layer according to the present example embodiment may start with operation S181 of forming the nucleation layer on a silicon substrate.

The nucleation layer may be formed on the (111) plane of the silicon substrate. The nucleation layer may provide a growth surface with improved wettability. For example, the nucleation layer may be AlN. For example, the nucleation layer may have a size of tens to hundreds of nm.

In operation S183, a lattice buffer layer may be formed on the nucleation layer. The lattice buffer layer may form a dislocation loop at an interface between the lattice buffer layer and a nitride crystal to be grown in a follow-up process to reduce dislocation density. Also, the lattice buffer layer may alleviate lattice mismatches and mismatches of coefficients of thermal expansion between the lattice buffer layer and a nitride single crystal to be grown in a follow-up process to effectively generate compressive stress when a crystal is grown and reduce tensile stress generated during cooling. The lattice buffer layer may be formed of a nitride crystal containing aluminum (Al) and may be a single layer or multiple layers. For example, the lattice buffer layer may be a graded $Al_xIn_yGa_{1-x-y}N$, where $0 \le x$, $y \le 1$, $x+y \le 1$ or $Al_{x1}In_{y1}Ga_{1-x1-y1}N/Al_{x2}In_{y2}Ga_{1-x2-y2}N$, where $0 \le x1$, $x2$, $y1$, $y2 \le 1$, $x1 \ne x2$, or $y1 \ne y2$, $x1+y1 \le 1$, $x2+y2 \le 1$ superlattice layer in which the content of a partial component such as AlGaN or Al is increased or decreased linearly or stepwise. In a specific example, the lattice buffer layer may have a structure in which AlGaN and AlN are alternately stacked. For example, the lattice buffer layer may have a triple-layer structure of AlGaN/AlN/AlGaN.

Thereafter, the operation of forming the nitride single crystal may include operations S184, S186, and S188 of sequentially forming a first nitride semiconductor layer, an intermediate layer, and a second nitride semiconductor layer on the lattice buffering layer.

The operation of forming the nitride single crystal may start with operation S184 of forming the first nitride semiconductor layer on the lattice buffering layer.

The first nitride semiconductor layer may be a nitride crystal having a lattice constant greater than that of the lattice buffering layer. The first nitride semiconductor layer may include $Al_xIn_yGa_{1-x-y}N$, where $0 \le x$, $y \le 1$ and $x+y < 1$. For example, the first nitride semiconductor layer may be GaN.

The first nitride semiconductor layer may receive compressive stress in an interface between the first nitride semiconductor layer and the lattice buffering layer, and when the first nitride semiconductor layer is cooled to a room temperature after completion of the growth process, tensile stress may occur due to a difference in coefficients of thermal expansion between the substrate and the first nitride semiconductor layer. In order to compensate for the stress, in operation S186, the intermediate layer may be formed on the first nitride semiconductor layer. The intermediate layer may be a nitride crystal having a lattice constant smaller than that of the first nitride semiconductor layer. For example, the intermediate layer may be $Al_xGa_{1-x}N$, where $0.4 < x < 1$.

Thereafter, in operation S188, a second nitride semiconductor layer may be formed on the intermediate layer. The second nitride semiconductor layer may have high compressive stress. Relatively weak compressive stress or tensile stress acting on the first nitride semiconductor layer may be compensated for by compressive stress of the second nitride semiconductor layer to reduce cracking. Similar to the first nitride semiconductor layer, the second nitride semiconductor layer may include $Al_xIn_yGa_{1-x-y}N$, where $0 \le x$, $y \le 1$ and $x+y < 1$. For example, the second nitride semiconductor layer may be GaN. GaN used as the first and second nitride semiconductor layers may be undoped GaN.

In a specific example embodiment, a nitride stacked body having at least one nitride semiconductor layer may additionally be formed on the second nitride semiconductor layer. Such a nitride semiconductor layer may be formed as $Al_xIn_yGa_{1-x-y}N$, where $0 \le x$, $y \le 1$, $x+y1$, and may be an undoped layer or a layer doped with an n-type and/or a p-type impurity. For example, the nitride semiconductor layer may be a plurality of semiconductor layers provided as a device for performing a specific function.

FIGS. 7A through 7D are cross-sectional views illustrating various examples of structures of a buffer layer and a stress compensation layer that are usable for an example embodiment of the inventive concept. An additional stress compensation layer structure may also be introduced to the example embodiment illustrated in FIGS. 3 and 4A, in addition to the buffer layer 110.

Figure 7A:
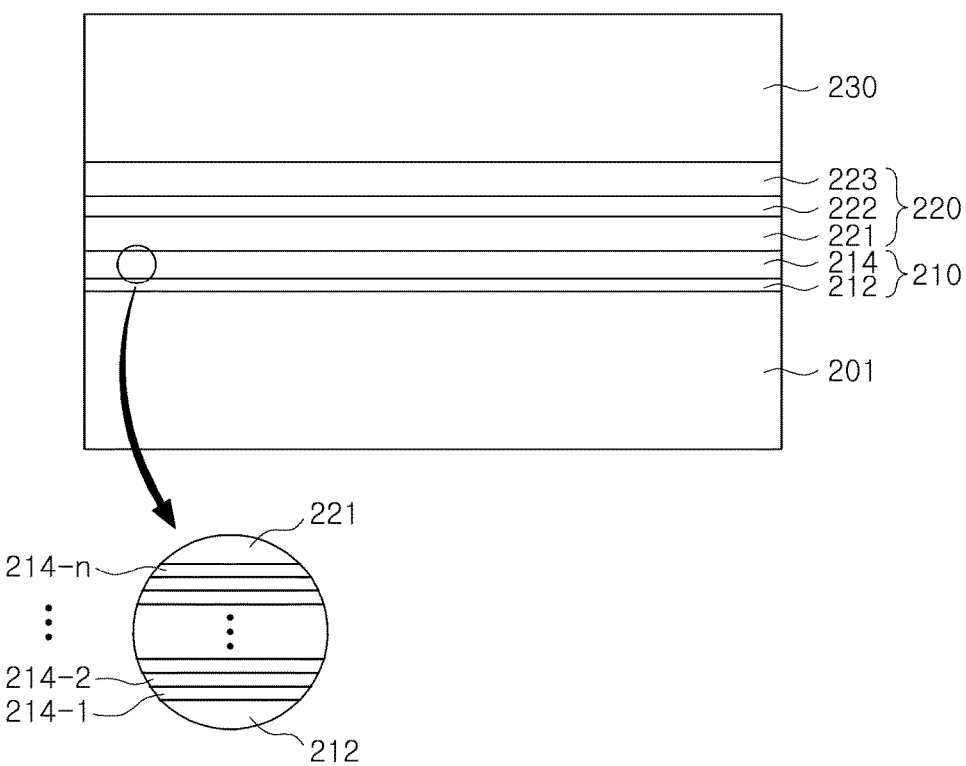
FIGS. 7A through 7D are cross-sectional views illustrating various examples of a composite buffer layer of an example embodiment of the inventive concept.

As illustrated in FIG. 7A, a buffer layer 210, a stress compensation layer 220, and a nitride stacked body 230 may be sequentially disposed on a silicon substrate 201.

The silicon substrate 201 may include a substrate partially including a silicon material, as well as a substrate formed of only a silicon material. For example, a silicon-on insulator (SOI) substrate may be used. The top surface of the silicon substrate 201 may be the (111) plane. The buffer layer 210 may include a nucleation layer 212 disposed on the silicon substrate 201 and the lattice buffering layer 214 disposed on the nucleation layer 212.

The nucleation layer 212 may be formed of AlN. The lattice buffering layer 214 may bend threading dislocation to reduce a defect. As a thickness of the lattice buffering layer 214 is increased, compressive stress relaxation in a first nitride semiconductor layer 221 to be grown in a follow-up process may be reduced and a defect rate may also be reduced. The thickness of the lattice buffering layer 214 may range from hundreds of nm to a few nm.

The lattice buffering layer 214 may have a single composition, or as illustrated in FIG. 4A, the lattice buffering layer 214 may be a graded layer of $Al_xIn_yGa_{1-x-y}N$, where $0 \le x$, $y \le 1$ and x+y1. The graded structure employed in the present example embodiment includes a plurality of layers 214-1, 214-2, ..., 214-n, and the plurality of layers 214-1, 214-2, ..., 214-n may have a step-graded structure in which an aluminum (Al) composition is reduced in a stepwise manner. In a specific example, the lattice buffering layer 214 having a graded structure may be realized as a three-component system AlGaN in which the Al composition is adjusted. In another example, the lattice buffering layer 214 may have a linearly graded structure, rather than step-graded structure.

The lattice buffering layer 214 may reduce a lattice mismatch between the AlN nucleation layer 212 and the first nitride semiconductor layer 221 in a stepwise manner. In particular, when a crystal is grown, the lattice buffering layer 214 may effectively generate compressive stress to reduce tensile stress generated during cooling.

The stress compensation layer 220 may include a first nitride semiconductor layer 221, an intermediate layer 222, and a second nitride semiconductor layer 223 sequentially disposed on the lattice buffering layer 214.

The first nitride semiconductor layer 221 may be a nitride crystal having a lattice constant greater than that of the lattice buffering layer 223. The first nitride semiconductor layer 221 may include $Al_xIn_yGa_{1-x-y}N$, where $0 \le x$, $y \le 1$ and x+y<1, and may be, for example, GaN. The first nitride semiconductor layer 221 may receive compressive stress in an interface between the first nitride semiconductor layer 221 and the lattice buffering layer 214.

Such compressive stress may be reduced as a thickness of the first nitride semiconductor layer 221 is increased. In a case where the thickness (about 2 μm) of the first nitride semiconductor layer 221 is increased, when the growth process is completed and cooling is performed to a room temperature, it is difficult to control tensile stress occurring due to a difference in coefficients of thermal expansion between the substrate 201 and the first nitride semiconductor layer 221 and cracking may occur.

The intermediate layer 222 may be disposed on the first nitride semiconductor layer 221 in order to compensate for tensile stress occurring during cooling. The intermediate layer 222 may be a nitride crystal having a lattice constant smaller than that of the first nitride semiconductor layer 221. For example, the intermediate layer 222 may be $Al_xGa_{1-x}N$, where $0.4<x<1$.

The second nitride semiconductor layer 223 may be disposed on the intermediate layer 222. The second nitride semiconductor layer 223 may have compressive stress. The compressive stress of the second nitride semiconductor layer 223 may compensate for relatively weak compressive stress or tensile stress acting on the first nitride semiconductor layer 221, suppressing the occurrence of cracks. Similar to the first nitride semiconductor layer 221, the second nitride semiconductor layer 223 may include $Al_xIn_yGa_{1-x-y}N$, where $0 \le x$, $y \le 1$ and x+y<1. For example, the second nitride semiconductor layer 223 may be formed of GaN. At least one of the first and second nitride semiconductor layers 221 and 223 may be, but is not limited to, an undoped nitride layer.

The nitride stacked body 230 may correspond to the light emitting structure 30 or 130 of the previous example embodiment described above.

Figure 7B:
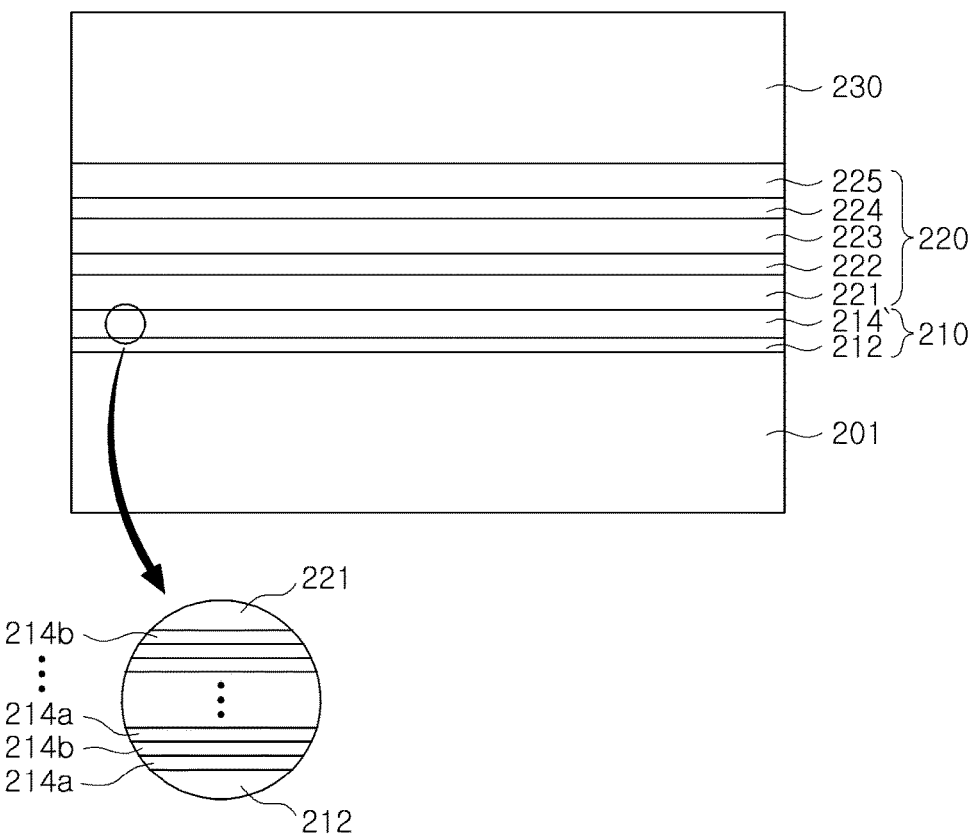

Referring to FIG. 7B, similar to the example of FIG. 7A, a buffer layer 210, a stress compensation layer 220, and a nitride stacked body 230 are sequentially disposed on a silicon substrate 201.

The components denoted by the same reference numerals as those of FIG. 7A may be referred to in descriptions of FIG. 7A and combined with descriptions of the present example embodiment, unless otherwise mentioned.

Similarly to the buffer layer 210 illustrated in FIG. 7A, the buffer layer 210 includes an AlN nucleation layer 212 and a lattice buffering layer 214'. The lattice buffering layer 214' used in the present example embodiment has a structure different from that of the lattice buffering layer 214 illustrated in FIG. 4A.

The lattice buffering layer 214' may have a superlattice structure in which two or more layers 214a and 214b having different compositions are alternately stacked. For example, the lattice buffering layer 214' may be a $Al_{x1}In_{y1}Ga_{1-x1-y1}N/Al_{x2}In_{y2}Ga_{1-x2-y2}N$, where $0 \le x1$, x2, y1, $y2 \le 1$, and $x1 \ne x2$ or $y1 \ne y2$, $x1+y1 \le 1$, and $x2+y2 \le 1$, superlattice layer. As in the present example embodiment, the lattice buffering layer 214' adopting the superlattice structure may effectively reduce stress between the silicon substrate 201 and the first nitride semiconductor layer 221.

The stress compensation layer 220 employed in the present example embodiment may include first and second nitride semiconductor layers 221 and 223, a first intermediate layer 222 disposed between the first and second nitride semiconductor layers 221 and 223, a second intermediate layer 224, and a third nitride semiconductor layer 225.

The second intermediate layer 224 and the third nitride semiconductor layer 225 may be understood as performing a function similar to those of the first intermediate layer 222 and the second nitride semiconductor layer 223. That is, the second intermediate layer 224 may be disposed on the second nitride semiconductor layer 223 in order to compensate for tensile stress generated during cooling. The second intermediate layer 224 may be a nitride crystal having a lattice constant smaller than that of the second nitride semiconductor layer 223. For example, the second intermediate layer 224 may be $Al_xGa_{1-x}N$, where $0.4<x<1$, similar to the first intermediate layer 222.

The third nitride semiconductor layer 225 may be disposed on the second intermediate layer 224. The third nitride semiconductor layer 225 may have compressive stress, and the compressive stress of the third nitride semiconductor layer 225 may compensate for relatively weak compressive stress or tensile stress acting on the first and second nitride semiconductor layers 221 and 223 (in particular, 223) disposed therebelow, to suppress the occurrence of cracks.

Similar to the second nitride semiconductor layer 223, the third nitride semiconductor layer 225 may include $Al_x$-

In$_y$Ga$_{1-x-y}$N, where 0≤x, y≤1 and x+y<1. For example, the third nitride semiconductor layer 225 may be GaN.

Figure 7C:
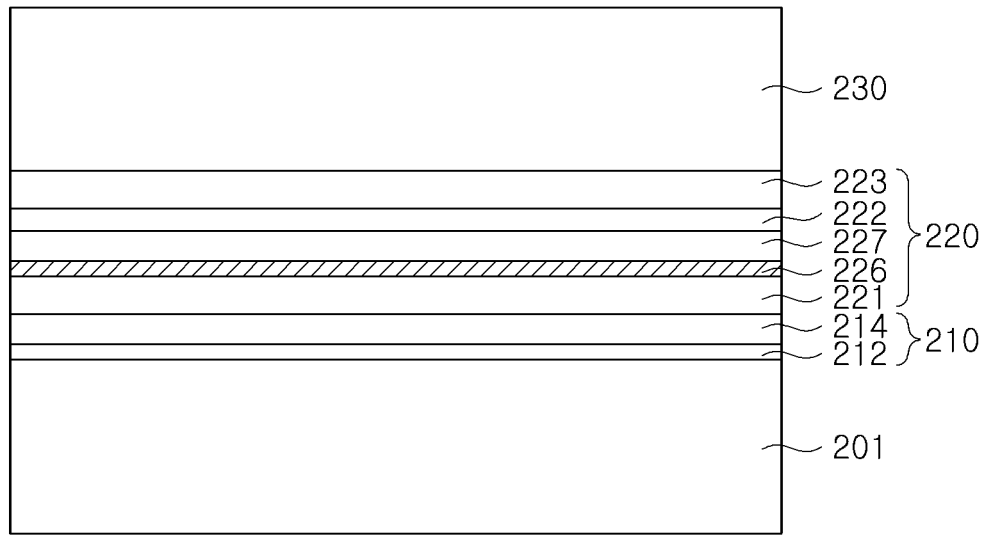

Referring to FIG. 7C, similar to the example of FIG. 7A, a buffer layer 210, a stress compensation layer 220, and a nitride stacked body 230 are sequentially disposed on a silicon substrate 201. However, unlike the example of FIG. 7A, a mask layer 226 and a coalesced nitride layer 227 formed on the mask layer 226 are included.

The mask layer 226 may be disposed on the first nitride semiconductor layer 221.

Most of the threading dislocations from the first nitride semiconductor layer 221 are blocked by the mask layer 226, and the other remaining threading dislocation may be bent by the coalescence nitride layer 227 grown in a follow-up process. As a result, defect density of a nitride crystal grown in a follow-up process may be significantly improved. A thickness and defect density of the coalescence nitride layer 227 may vary according to growth conditions, for example, variables such as a temperature, pressure, and a mole ratio of a V/III source.

The mask layer 226 may be formed of a silicon nitride (SiN$_x$) or a titanium nitride (TiN). For example, a SiN$_x$ mask layer 226 may be formed using silane (SiH$_4$) and an ammonia gas. The mask layer 226 may not completely cover a surface of the first nitride semiconductor layer 221. Thus, an exposed region of the first nitride semiconductor layer 221 may be determined according to a degree to which the mask layer 226 covers the first nitride semiconductor layer 221, and an initial island growth shape of a nitride crystal grown thereon may be varied. For example, in a case where the exposed area of the nitride semiconductor layer is reduced by increasing the mask region of SiN$_x$, density of an initial island of the nitride layer 227 to be grown on the mask layer 226 may be reduced, while a size of a relatively coalesced island may be increased. Thus, a thickness of the coalesced nitride layer 227 may also be increased.

In a case where the mask layer 226 is added, stress between the first and second nitride semiconductor layers 221, 223 may be decoupled by the mask layer 226, and thus, compressive stress transferred to the coalesced nitride layer 227 may be partially blocked. Also, relative tensile stress may occur in the coalesced nitride layer 227 while grown islands coalesce. As a result, the first nitride semiconductor layer 221 may receive strong compressive stress by the buffer layer 210, while the coalesced nitride layer 227 on the mask layer 226 may receive relatively weak compressive stress or tensile stress due to stress decoupling and island coalescence. When a thickness of the layer having a relatively small compressive stress exceeds a threshold point, cracks do not occur in a thin film during cooling, and thus, a thickness of the coalesced nitride layer 227 may be selected under the conditions in which cracks do not occur and defect density is reduced.

Figure 7D:
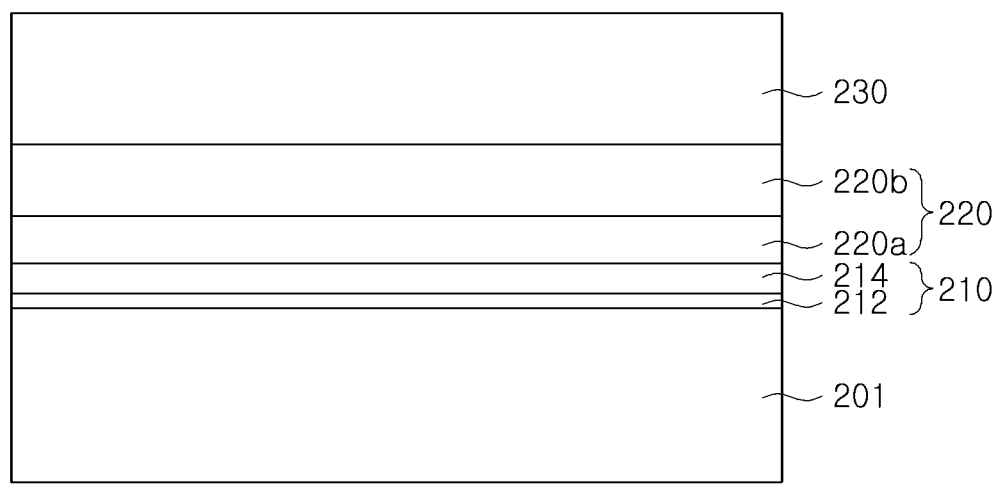

Referring to FIG. 7D, a buffer layer 210, a stress compensation layer 220, and a nitride stacked body 230 are sequentially disposed on a silicon substrate 201.

The stress compensation layer 220 employed in the present example embodiment may include first and second nitride semiconductor layers 220a and 220b formed under different growth conditions. The first nitride semiconductor layer 220a may be grown in a two-dimensional (2D) mode such that an increase in surface roughness is controlled, to thereby reduce occurrence of a twist grain boundary in an interface between the first nitride semiconductor layer 220a and the second nitride semiconductor layer 220b.

The first nitride semiconductor layer 220a may be formed under a first growth condition to have surface roughness equal to 3% or less of surface roughness of the buffer layer 210, and the second nitride semiconductor layer 220b may be formed on the first nitride semiconductor layer 220a under a second growth condition. Here, at least one of a temperature, pressure, and a V/III group mole ratio of the second growth condition may be different from those of the first growth condition such that a three-dimensional (3D) growth mode is increased in the second growth condition, compared with the first growth condition. The first nitride semiconductor layer 220a may have a thickness ranging from 2 nm to 1000 nm. As the thickness of the first nitride semiconductor layer 220a is increased, occurrence of the twist grain boundary may be reduced in the interface between the first nitride semiconductor layer 220a and the second nitride semiconductor layer 220b. Here, however, if the first nitride semiconductor layer 220a is too thick, crystallinity of an overall thin film may be degraded. In this regard, since the first nitride semiconductor layer 220a is grown at a temperature lower than that of the nitride layer, a defect rate may be rather increased. Thus, it would be desirable to reduce occurrence of the twist grain boundary, while the thickness of the first nitride semiconductor layer 220b is reduced.

When the twist grain boundary is reduced, a defect of the second nitride semiconductor layer 220b stacked on the first nitride semiconductor layer 220a may be reduced. That is, since the first nitride semiconductor layer 220a has a thickness ranging from 2 nm to 1000 nm and has roughness of 3% or less of that of the buffer layer 210, a defect of the second nitride semiconductor layer 220b stacked thereon may be reduced. Thus, the same crystallinity may be obtained from a reduced thickness, making the entire structure thinner (reduced in thickness). For example, even though a mask layer is not used, an overall thickness of the buffer layer 210 and the stress compensation layer 220 may be manufactured to be 6 µm or less. Thus, a process time of the crystal growth process and manufacturing costs may be reduced.

The second nitride semiconductor layer 220b may be formed of Al$_x$In$_y$Ga$_{1-x-y}$N, where 0≤x, y≤1 and x+y<1. The second nitride semiconductor layer 220b may be continuously grown on the first nitride semiconductor layer 220a without additionally growing any intervening layer of a different composition. The second nitride semiconductor layer 220b may have the same composition as that of the first nitride semiconductor layer 220a. For example, the first and second nitride semiconductor layers 220a and 220b may be GaN. In a specific example, the first nitride semiconductor layer 220a may be undoped GaN, and the second nitride semiconductor layer 220b may be n-type GaN.

Figure 8:
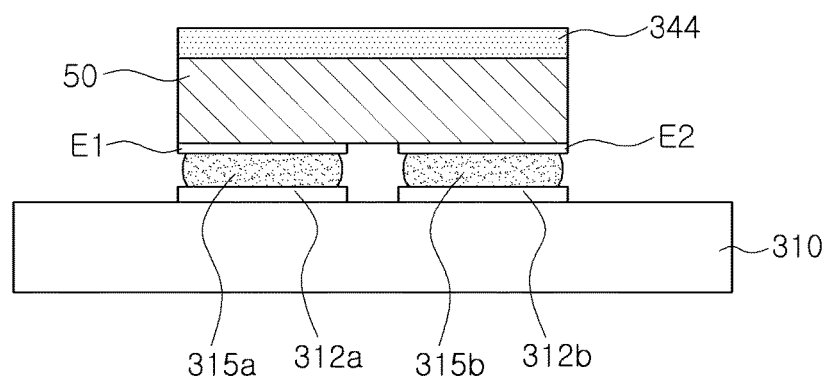
FIGS. 8 and 9 are cross-sectional views illustrating a package including a semiconductor light emitting device, according to an example embodiment of the inventive concept.
Figure 9:
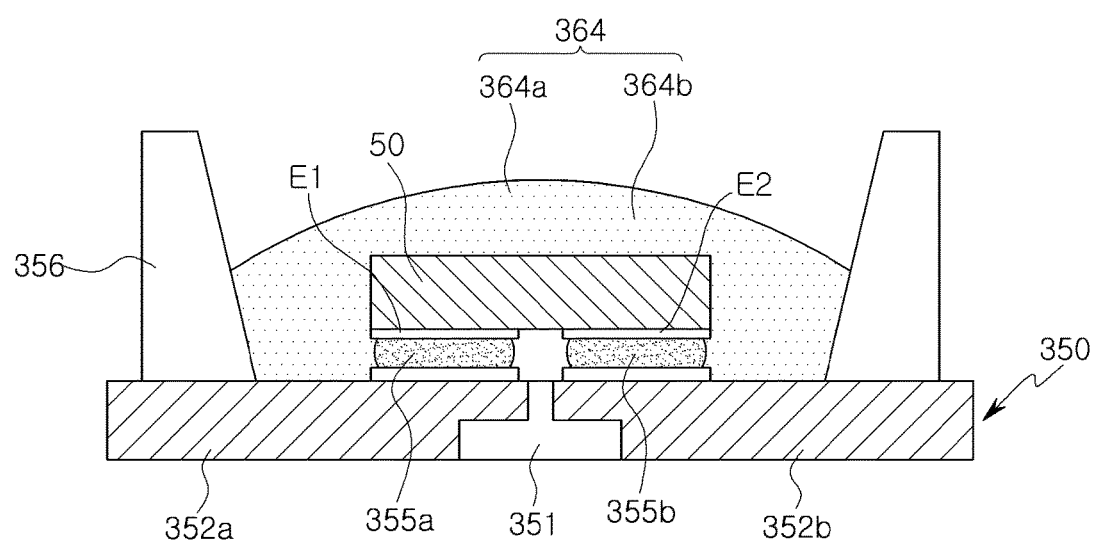

The semiconductor light emitting device illustrated in FIG. 3 may be used in a semiconductor light emitting device package (FIGS. 8 and 9). In this case, a wavelength conversion unit having various shapes may be additionally provided.

FIG. 8 is a cross-sectional view of a semiconductor light emitting device package, according to an example embodiment of the inventive concept.

Referring to FIG. 8, a semiconductor light emitting device package 340 according to the present example embodiment includes a package board 310 having a mounting surface and a semiconductor light emitting device 50 mounted on the mounting surface of the package board 310.

The package board 310 may include first and second wiring electrodes 312a and 312b disposed on the mounting surface. The first and second wiring electrodes 312a and 312b may extend to the bottom surface or a side surface of the package board 310. The package board 310 may include an insulating resin and a ceramic board. The first and second wiring electrodes 312a and 312b may include a metal such as gold (Au), copper (Cu), silver (Ag), or aluminum (Al). For example, the package board 310 may be a board such as a printed circuit board (PCB), a metal core PCB (MCPCB), a metal PCB (MPCB), or a flexible PCB (FPCB).

The semiconductor light emitting device 50 may be mounted on the mounting surface such that a surface thereof on which first and second electrodes E1 and E2 are disposed faces the mounting surface, and the first electrode E1 and the second electrode E2 may be connected to the first and second wiring electrodes 312a and 312b by solder bumps 315a and 315b, respectively.

A wavelength conversion film 344 may be disposed on a top surface as a wavelength conversion unit, that is, a transparent support substrate, of the semiconductor light emitting device 50 which is mounted on the package body 310. The wavelength conversion film 344 includes a wavelength conversion material converting a portion of light emitted from the semiconductor light emitting device 50 into light having a different wavelength. The wavelength conversion film 344 may be a ceramic film including a sintered body of a ceramic phosphor and a resin layer in which the wavelength conversion material is dispersed. When the semiconductor light emitting device 50 emits blue light, the wavelength conversion film 344 may convert a portion of the blue light into yellow and/or red and green light to provide the semiconductor light emitting device package 340 emitting white light. Like the semiconductor light emitting device 100 illustrated in FIG. 3, the wavelength conversion material 174 of the transparent adhesive layer 175 may include a first wavelength conversion material converting light into light having a first wavelength, while the wavelength conversion material of the wavelength conversion film 344 may include a second wavelength conversion material converting light into light having a second wavelength shorter than that of the first wavelength. A wavelength conversion material that may be used in the present example embodiment will be described hereinafter (please refer to Table 2 below).

FIG. 9 is a cross-sectional view of a semiconductor light emitting device package, according to an example embodiment of the inventive concept.

Similar to the previous example embodiment, a semiconductor light emitting device package 360 illustrated in FIG. 9 includes a package board 350 having a mounting surface and a semiconductor light emitting diode (LED) chip 50 flipchip-bonded to the mounting surface of the package board 350.

The package board 350 may have a structure in which first and second wiring electrodes 352a and 352b as lead frames are united by an insulating resin part 351. The package board 350 may further include a reflective structure 356 disposed on the mounting surface and surrounding the semiconductor light emitting device 50. The reflective structure 356 may have a cup shape in which an internal surface thereof is sloped. A wavelength conversion part 364 employed in the present example embodiment may include a wavelength conversion material 364a and a resin packing portion 364b containing the wavelength conversion material 364a. The wavelength conversion part 364 may be formed to cover the semiconductor light emitting device 50 within the reflective structure 356.

Alternatively, as described above with reference to FIG. 3, a wavelength conversion material may be contained in a different component of the semiconductor light emitting device. Various example embodiments thereof are illustrated in FIGS. 10 through 13.

Figure 10:
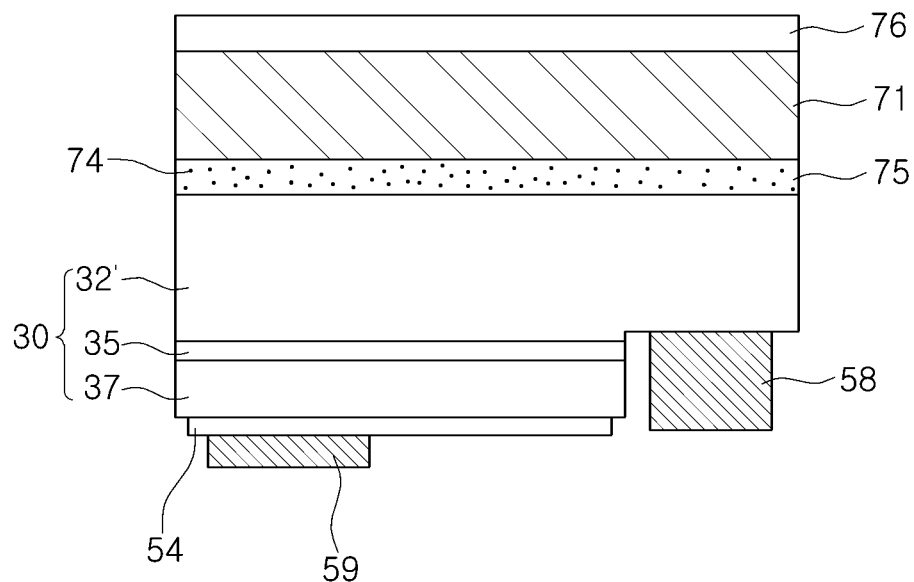
FIGS. 10 through 13 are cross-sectional views illustrating semiconductor light emitting devices, according to various example embodiments of the inventive concept.

A semiconductor light emitting device 50a illustrated in FIG. 10 may be understood as being similar to the semiconductor light emitting device 50 illustrated in FIG. 1, except that a wavelength conversion material 74 is contained in a transparent adhesive layer 75 and an optical filter layer 76 is added. The components of the present example embodiment may be understood with reference to the descriptions of the components the same as or similar to those of the semiconductor light emitting device 50 illustrated in FIG. 1, unless otherwise mentioned.

In the present example embodiment, the transparent adhesive layer 75 may act as a wavelength conversion element. The transparent adhesive layer 75 may include a wavelength conversion material 74 converting at least a portion of light having a first wavelength generated by an active layer 35 into light having a second wavelength. The transparent adhesive layer 75 may include at least one adhesive material selected from the group consisting of silicone, epoxy, polyacrylate, polyimide, polyamide, and benzocyclobutene (BCB). The wavelength conversion material 74 may be mixed in the adhesive material before being cured to thereby provide the transparent adhesive layer 75 as a wavelength conversion element.

The semiconductor light emitting device 50a may further include the optical filter layer 76 disposed on a top surface (that is, a surface from which light is emitted) of the transparent support substrate 71. The optical filter layer 76 may be configured to allow light within a required wavelength band to be selectively transmitted therethrough, while selectively blocking light within an undesired wavelength band. For example, the optical filter layer 76 may be an omnidirectional reflector (ODR) or a distributed Bragg reflector (DBR). In this case, the optical filter layer 76 may be formed by alternately forming two types of dielectric layers having different refractive indices. Alternatively, the optical filter layer 76 may include a material such as dye.

The optical filter layer 76 may serve to block unconverted light (for example, blue light) having the first wavelength in order to increase a rate of light (for example, green or red light) having the second wavelength converted by the wavelength conversion material 74 contained in the transparent adhesive layer 75, in finally emitted light.

In the present example embodiment, the optical filter layer 76 is illustrated to be disposed on the top surface of the transparent support substrate 71, but it may also be arranged in a different position, as necessary. For example, the optical filter layer 76 may be disposed between the transparent support substrate 71 and the transparent adhesive layer 75 (please refer to FIG. 13).

Also, a surface to which the transparent adhesive layer 75 is applied may be varied. As in the present example embodiment, a first conductivity-type semiconductor layer 32' may not have a concavo-convex portion on a junction surface thereof. In another example, a surface on which a growth substrate or a buffer layer remains, rather than being completely removed, may be used as a junction surface.

Figure 11:
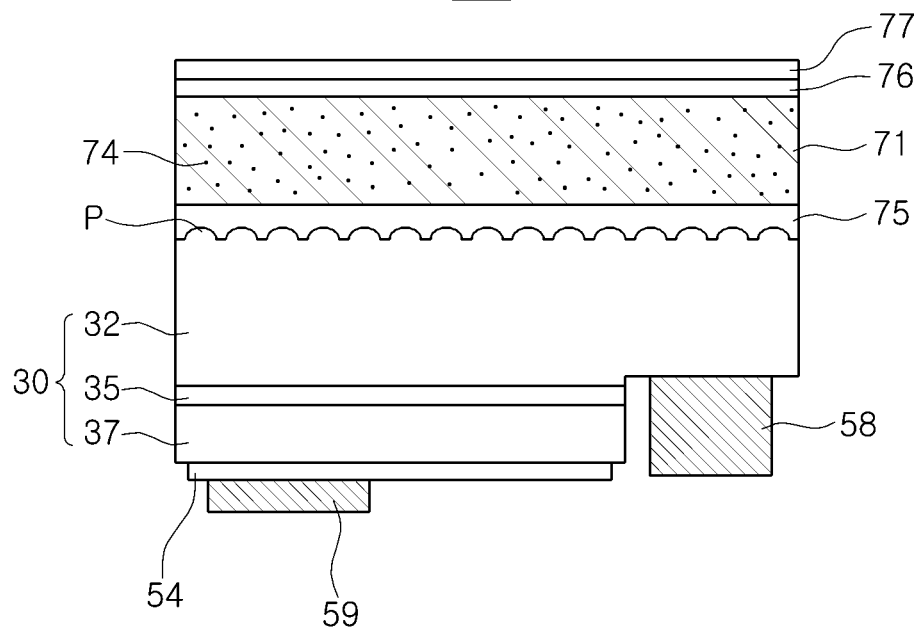

A semiconductor light emitting device 50b illustrated in FIG. 11 may be understood as being similar to the semiconductor light emitting device 50a illustrated in FIG. 10, except that a wavelength conversion material 74 is contained in a transparent support substrate 71 and that a color filter layer 77 is added.

The transparent support substrate 71 may be a support containing a wavelength conversion material 74 such as a phosphor or a quantum dot. For example, the transparent support substrate 71 may be formed of a silicon resin mixed with a wavelength conversion material or a transparent liquid resin such as an epoxy resin. In another example, in a case where the transparent support substrate 71 is a glass substrate, a wavelength conversion material 74 such as a phosphor may be mixed in a glass composition, and the mixture may be sintered at a low temperature to manufacture a transparent support substrate 71 containing the wavelength conversion material 74.

The color filter layer 77 may be disposed on the optical filter layer 76. The color filter layer 77 may allow light having a desired partial band of a converted wavelength to be selectively transmitted therethrough. In an emission spectrum of finally emitted light, the color filter layer 77 may form a narrow full width at half maximum.

Figure 12:
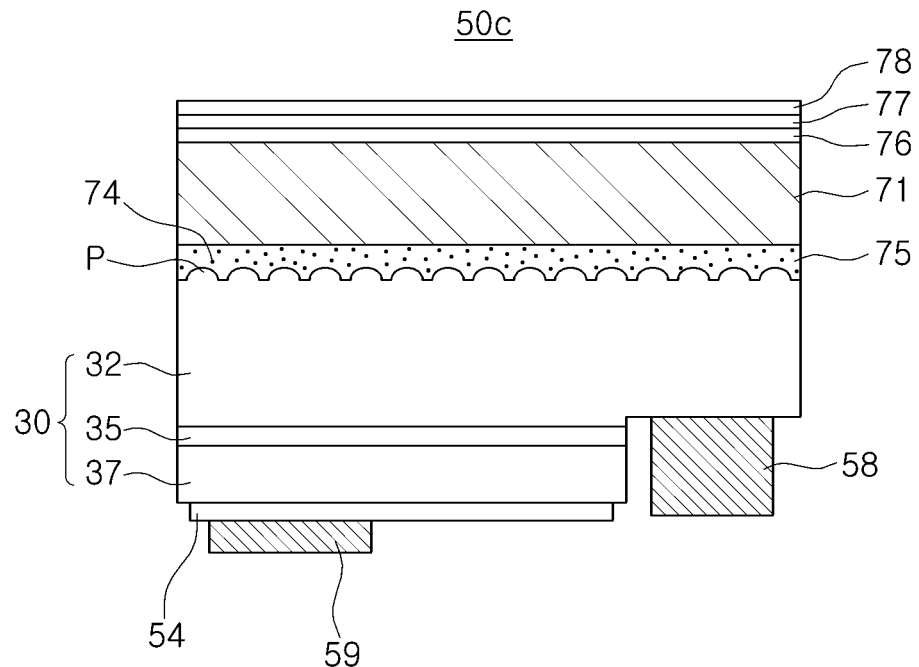

A semiconductor light emitting device 50c illustrated in FIG. 12 may be understood as being similar to the semiconductor light emitting device 50a illustrated in FIG. 10, except that a light diffusion layer 78 may be added.

The semiconductor light emitting device 50c may include the light diffusion layer 78 together with the color filter layer 77 described above with reference to FIG. 11. In this manner, characteristics of finally emitted light may be changed by including the additional optical element. The color filter layer 77 may be disposed on the optical filter layer 76. The color filter layer 77 may allow light having a desired partial band of the converted wavelength to be selectively transmitted therethrough. In an emission spectrum of finally emitted light, the color filter layer 77 may form a relatively narrow full width at half maximum.

Figure 13:
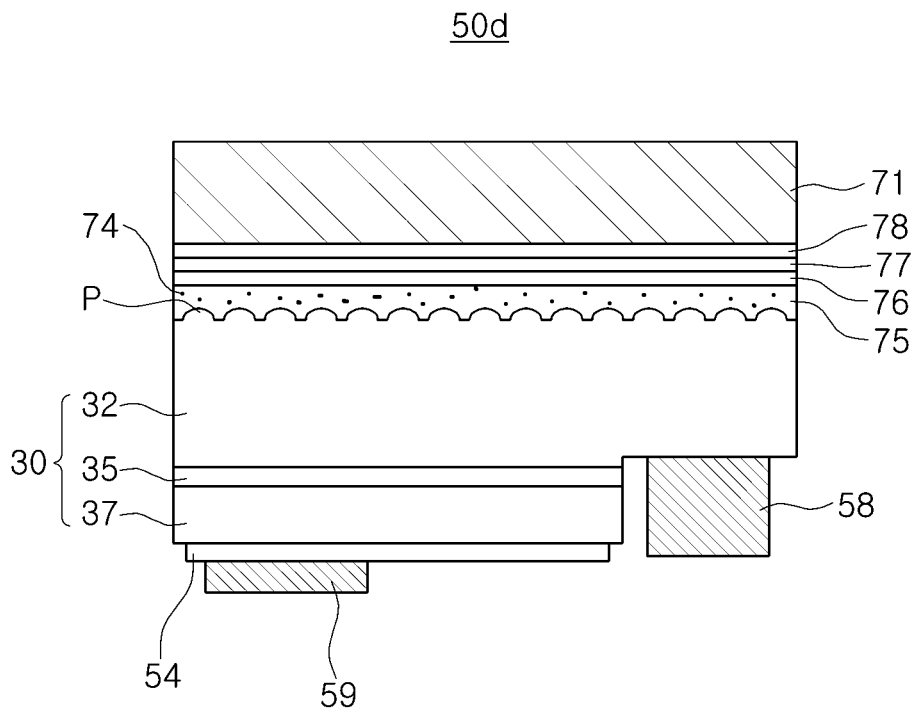

A semiconductor light emitting device 50d illustrated in FIG. 13 may be understood as being similar to the semiconductor light emitting device 50c illustrated in FIG. 12, except that an optical filter layer 76, a color filter layer 77, and a light diffusion layer 78 are disposed between a transparent support substrate 71 and a transparent adhesive layer 75.

As in the present example embodiment, the optical filter layer 76, the color filter layer 77, and the light diffusion layer 78 may be disposed between the transparent support substrate 71 and the transparent adhesive layer 75. If necessary, the optical filter layer 76, the color filter layer 77, and the light diffusion layer 78 may be provided on one surface of the transparent support substrate 71 as a single stacked body before being adhered to a light emitting structure 30.

In the aforementioned example embodiment, various materials such as a phosphor and/or a quantum dot may be used. For example, the aforementioned semiconductor light emitting device may include at least one wavelength conversion element converting light into light having a different wavelength so as to be provided as a white light emitting device. For example, the semiconductor light emitting device may include a yellow phosphor or a combination of green and red phosphors.

Figure 14:
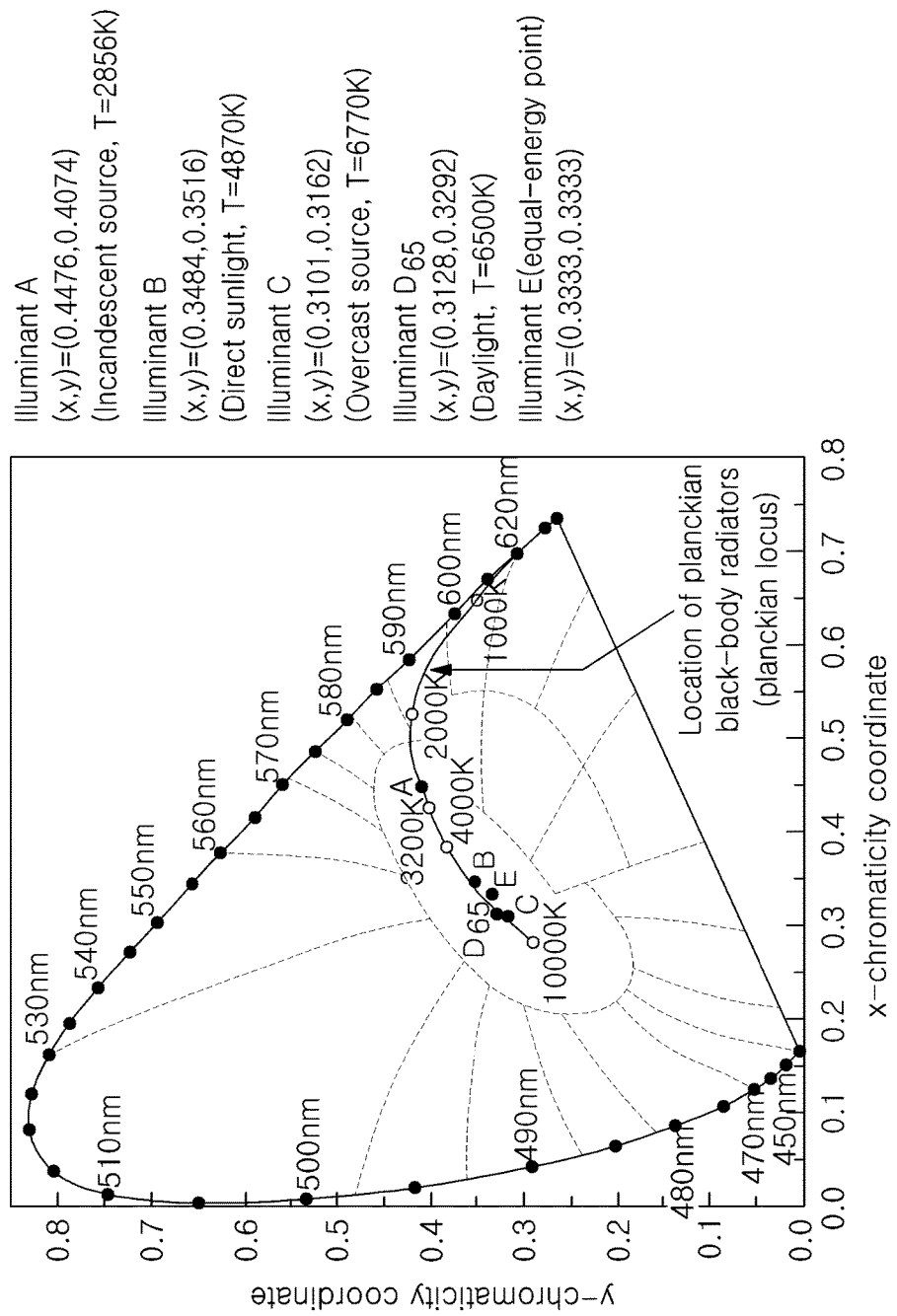
FIG. 14 is a CIE chromaticity diagram illustrating a wavelength conversion material of a semiconductor light emitting device or a package, according to an example embodiment of the inventive concept.

FIG. 14 is a CIE 1931 color space diagram illustrating a wavelength conversion material that may be used in a semiconductor light emitting device or a semiconductor light emitting device package, according to an example embodiment of the inventive concept.

In a single light emitting device package, light having a required color may be determined depending on a wavelength of light from a light emitting diode (LED) chip, a light emitting device, and a phosphor type and a combination ratio of phosphors. In the case of the white light emitting device package, a color temperature and a color rendering index may be controlled thereby.

For example, semiconductor light emitting devices may be combined with phosphors selected from yellow, green, red, and blue phosphors to be appropriate therefor, thereby implementing white light, and may emit white light having various color temperatures according to a selected phosphor combination ratio.

In this case, in a lighting apparatus, a color rendering index (CRI) may be adjusted from a level of a sodium-vapor lamp to a level of sunlight, and various types of white light having a color temperature of around 1500K to around 20000K may be generated. In addition, a lighting color may be adjusted to be appropriate for an ambient atmosphere or for viewer mood by generating violet, blue, green, red, orange visible light or infrared light as needed. Further, the lighting apparatus may also emit light within a special wavelength band, capable of promoting plant growth.

White light obtained by combining yellow, green, red, blue phosphors and/or green and red light emitting devices with a semiconductor light emitting device may have two or more peak wavelengths, and coordinates (x, y) of the CIE 1931 color space diagram illustrated in FIG. 14 may be located on line segments (0.4476, 0.4074), (0.3484, 0.3516), (0.3101, 0.3162), (0.3128, 0.3292), and (0.3333, 0.3333) connected to one another. Alternatively, the coordinates (x, y) may be located in a region surrounded by the line segments and a blackbody radiation spectrum. A color temperature of white light may be within a range of 1500K to 20000K. In FIG. 14, white light in the vicinity of a point E (0.3333, 0.3333) below the blackbody radiation spectrum may be in a state in which light of a yellow-based component becomes relatively weak. This white light may be used as an illumination light source in a region in which a relatively bright or refreshing mood may be provided to the naked eye. Thus, a lighting apparatus product using white light in the vicinity of the point E (0.3333, 0.3333) below the blackbody radiation spectrum (a Planckian locus) may be effective for use in retail spaces in which consumer goods are for sale.

Phosphors may be represented by the following empirical formulae and have colors as below.

Oxide-based Phosphor: Yellow and green $Y_3Al_5O_{12}$:Ce, $Tb_3Al_5O_{12}$:Ce, $Lu_3Al_5O_{12}$:Ce Silicate-based Phosphor: Yellow and green $(Ba,Sr)_2SiO_4$:Eu, Yellow and yellowish-orange $(Ba,Sr)_3SiO_5$:Ce Nitride-based Phosphor: Green β-SiAlON:Eu, Yellow $La_3Si_6N_{11}$:Ce, Yellow α-SiAlON:Eu, Red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ (0.5≤x≤3, 0<z<0.3, 0<y≤4)—Formula (1) (Here, Ln may be at least one element selected from a group consisting of group IIIa elements and rare-earth elements, and M may be at least one element selected from a group consisting of calcium (Ca), barium (Ba), strontium (Sr), and magnesium (Mg).

Fluoride-based Phosphor: KSF-based red $K_2SiF_6$:$Mn^{4+}$, $K_2TiF_6$:$Mn^{4+}$, $NaYF_4$:$Mn^{4+}$, $NaGdF_4$:$Mn^{4+}$, $K_3SiF_7$:$Mn^{4+}$ A composition of a phosphor should basically conform to stoichiometry, and respective elements may be substituted with other elements in respective groups of the periodic table of elements. For example, Sr may be substituted with Ba, Ca, Mg, or the like, of an alkaline earth group II, and Y may be substituted with lanthanum-based terbium (Tb), lutetium (Lu), scandium (Sc), gadolinium (Gd), or the like. In addition, Eu or the like, an activator, may be substituted with cerium (Ce), Tb, praseodymium (Pr), erbium (Er), ytterbium (Yb), or the like, according to a required energy level. In this case, an activator may be used alone, or a sub-activator or the like, for modification of characteristics thereof, may additionally be used.

The following table 2 illustrates phosphor types of white light emitting devices using a UV LED chip (200 to 430 nm).

TABLE 2

| Purpose | Phosphor |
|---|---|
| LED TV BLU | β-SiAlON:$Eu^{2+}$, (Ca, Sr)AlSiN$_3$:$Eu^{2+}$, La$_3$Si$_6$N$_{11}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ (0.5 ≤ x ≤ 3, 0 < z < 0.3, 0 < y ≤ 4), K$_2$TiF$_6$:$Mn^{4+}$, NaYF$_4$:$Mn^{4+}$, NaGdF$_4$:$Mn^{4+}$ |
| Lighting | Lu$_3$Al$_5$O$_{12}$:$Ce^{3+}$, Ca-α-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$(0.5 ≤ x ≤ 3, 0 < z < 0.3, 0 < y ≤ 4), K$_2$TiF$_6$:$Mn^{4+}$, NaYF$_4$:$Mn^{4+}$, NaGdF$_4$:$Mn^{4+}$ |
| Side Viewing (Mobile Devices, Laptop PCs) | Lu$_3$Al$_5$O$_{12}$:$Ce^{3+}$, Ca-α-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, (Sr, Ba, Ca, Mg)$_2$SiO$_4$:$Eu^{2+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$(0.5 ≤ x ≤ 3, 0 < z < 0.3, 0 < y ≤ 4), K$_2$TiF$_6$:$Mn^{4+}$, NaYF$_4$:$Mn^{4+}$, NaGdF$_4$:$Mn^{4+}$ |
| Electrical Components (Headlamps, etc.) | Lu$_3$Al$_5$O$_{12}$:$Ce^{3+}$, Ca-α-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$(0.5 ≤ x ≤ 3, 0 < z < 0.3, 0 < y ≤ 4), K$_2$TiF$_6$:$Mn^{4+}$, NaYF$_4$:$Mn^{4+}$, NaGdF$_4$:$Mn^{4+}$ |

In addition, as the wavelength conversion material, a quantum dot (QD) may be used by substituting a phosphor therewith or being mixed with a phosphor. The quantum dot may be implemented to exhibit various colors according to a size thereof, and in addition, in a case where the quantum dot is used as a phosphor substitute, the quantum dot may be used as a red or green phosphor. In the case of using a quantum dot, a narrow full width at half maximum of, for example, about 35 nm may be implemented.

Although the wavelength conversion material may be implemented in a manner in which it is contained in an encapsulation portion, the wavelength conversion material may also be previously formed in the form of a film to be used by being adhered to a surface of an optical structure such as a semiconductor light emitting device or a light guide plate. In this case, the wavelength conversion material may be easily applied to a required region in a uniform thickness structure, and may be usefully used in a backlight unit, a display device, or various types of light source devices such as a lighting apparatus (see FIGS. 36 to 44).

Figure 15A:
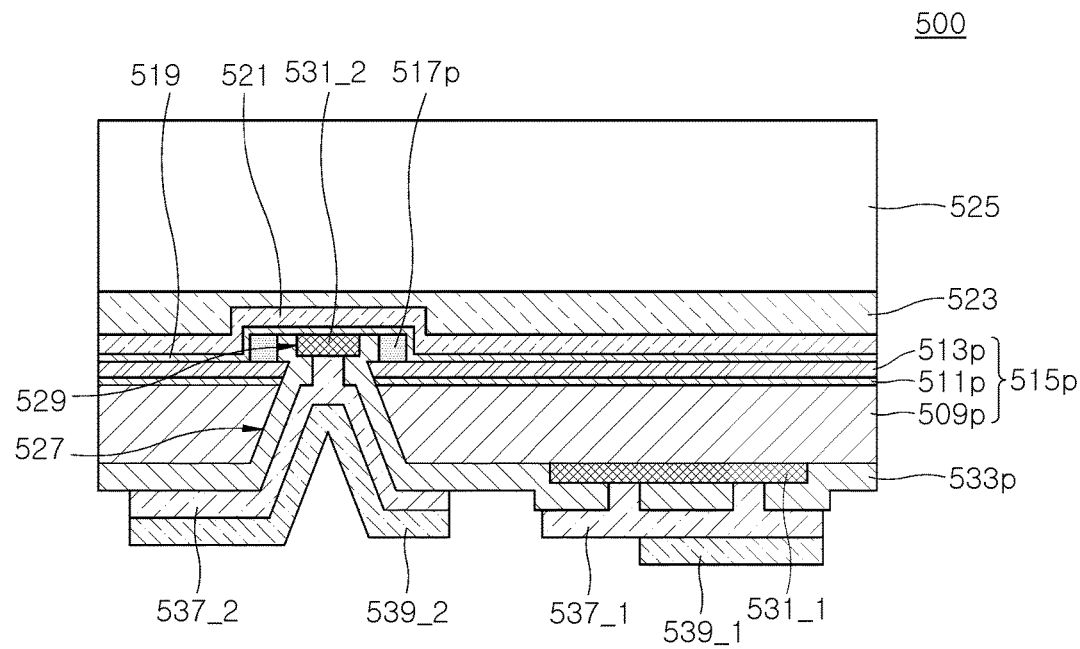
FIGS. 15A and 15B are cross-sectional views of a major part of a semiconductor light emitting device, according to an example embodiment of the inventive concept.
Figure 15B:
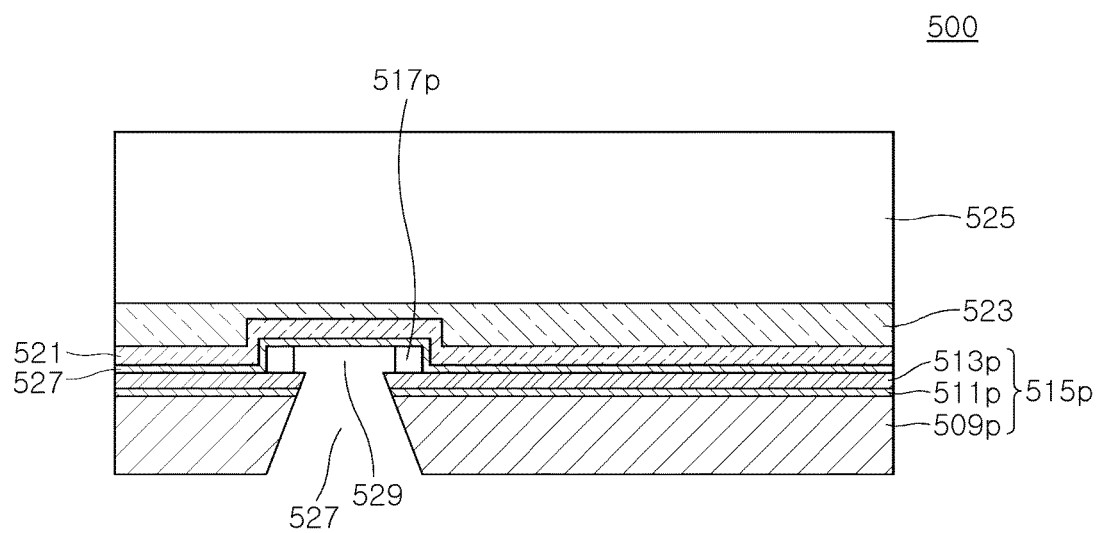
Figure 15C:
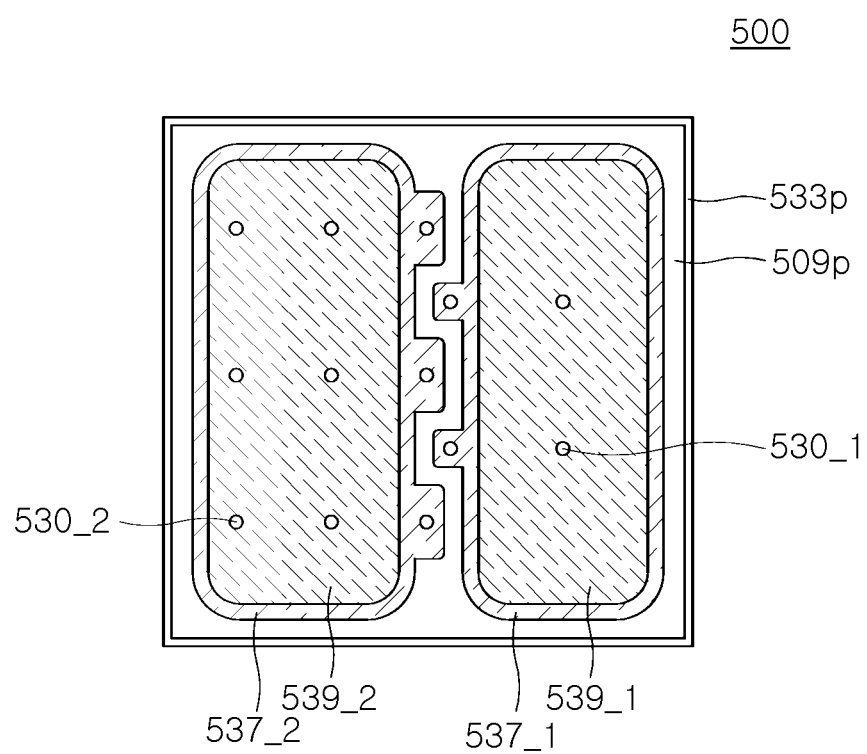
FIG. 15C is a bottom view of the semiconductor light emitting device illustrated in FIG. 15A, according to an example embodiment.

FIGS. 15A and 15B are side cross-sectional views of a semiconductor light emitting device 500, according to an example embodiment of the inventive concept, and FIG. 15C is a bottom view of the semiconductor light emitting device 500 illustrated in FIG. 15A, according to an example embodiment.

Specifically, FIG. 15B is a cross-sectional view of the semiconductor light emitting device 500 illustrated in FIG. 15A, but an electrode structure is not illustrated. The semiconductor light emitting device 500 according to the example embodiment of the inventive concept may be a chip scale package (CSP) or a wafer level package (WLP). As described above, the terms "upper portion", "top surface", "lower portion", "bottom surface", and "side surface" are based on the drawings and may be changed according to an actual arrangement direction. In the drawings of the present specification, only necessary elements are illustrated.

The semiconductor light emitting device 500 may have a light-emitting structure 515p including a first conductivity type semiconductor layer 509p, an active layer 511p, and a second conductivity type semiconductor layer 513p. The first conductivity type semiconductor layer 509p may be an n-type semiconductor layer. The second conductivity type semiconductor layer 513p may be a p-type semiconductor layer.

The first conductivity type semiconductor layer 509p and the second conductivity type semiconductor layer 513p may include a nitride semiconductor, for example, GaN or InGaN. The first conductivity type semiconductor layer 509p and the second conductivity type semiconductor layer 513p may include a nitride semiconductor, for example, Al$_x$In$_y$Ga$_{1-x-y}$N (0≤x≤1, 0≤y≤1, 0≤x+y≤1). Each of the first conductivity type semiconductor layer 509p and the second conductivity type semiconductor layer 513p may be a single layer or a plurality of layers having different doping concentrations, different compositions, or the like. Alternatively, the first conductivity type semiconductor layer 509p and the second conductivity type semiconductor layer 513p may include an AlInGaP-based semiconductor or an AlInGaAs-based semiconductor.

The active layer 511p between the first conductivity type semiconductor layer 509p and the second conductivity type semiconductor layer 513p may emit light having predetermined energy level through a recombination of electrons and holes. The active layer 511p may have a multi-quantum well (MQW) structure in which a quantum well layer and a quantum barrier layer are alternately stacked. In the case of a nitride semiconductor, a GaN/InGaN structure may be used. The active layer 511p may have a single quantum well (SQW) structure using a nitride semiconductor.

The light-emitting structure 515p may include a first through hole 527. The first through hole 527 may be referred to as a first through-via hole or a first via hole. As illustrated in FIG. 15B, the first through hole 527 may pass through the first conductivity type semiconductor layer 509p, the active layer 511p, and the second conductivity type semiconductor layer 513p.

An etch stop layer 517p may be on the second conductivity type semiconductor layer 513p of the light-emitting structure 515p. The etch stop layer 517p may include a second through hole 529 passing through the first through hole 527. The second through hole 529 may be referred to as a second through-via hole or a second via hole. As described below, the etch stop layer 517p may stop etching when the first through hole 527 is formed. The second through hole 529 may be inside the etch stop layer 517p. The etch stop layer 517p may include a silicon oxide (SiO$_2$) layer.

A current spreading layer 519 may be on the second conductivity type semiconductor layer 513*p*, the second through hole 529, and the etch stop layer 517*p*, which constitute the light-emitting structure 515*p*. The current spreading layer 519 may be an indium tin oxide (ITO) layer. The current spreading layer 519 may be on a top surface of the second conductivity type semiconductor layer 513*p*, a top surface of the second through hole 529, and a side surface of the etch stop layer 517*p*, which constitute the light-emitting structure 515*p*. The current spreading layer 519 may be provided for applying a voltage to the second conductivity type semiconductor layer 513*p*.

The semiconductor light emitting device 500 may further include a reflective layer 533*p* on internal walls of the first through hole 527 and the second through hole 529 and a bottom surface of the first conductivity type semiconductor layer 509*p*. The reflective layer 533*p* may reflect light generated by the light-emitting structure 515*p*. The reflective layer 533*p* may be formed when necessary. The reflective layer 533*p* may include silver (Ag) or copper (Cu). The reflective layer 533*p* may be a distributed Bragg reflector (DBR). The distributed Bragg reflector may be a multilayer reflective layer in which a first insulating film having a first refractive index and a second insulating film having a second refractive index are alternately stacked.

The semiconductor light emitting device 500 may further include electrode structures 531_1, 537_1, 539_1, 531_2, 537_2, and 539_2 on the bottom surface of the first conductivity type semiconductor layer 509*p*. The electrode structures 531_1, 537_1, 539_1, 531_2, 537_2, and 539_2 may include a conductive material layer, for example, a metal layer. The electrode structures 531_1, 537_1, 539_1, 531_2, 537_2, and 539_2 may include first electrode structures 531_1, 537_1, and 539_1 and second electrode structures 531_2, 537_2, and 539_2.

The first electrode structures 531_1, 537_1, and 539_1 may include a first contact layer 531_1 on the bottom surface of the first conductivity type semiconductor layer 509*p*, and first electrode layers 537_1 and 539_1 electrically connected to the first contact layer 531_1. The first electrode layers 537_1 and 539_1 may be referred to as first via electrode layers. The first electrode structures 531_1, 537_1, and 539_1 may be electrically connected to the first conductivity type semiconductor layer 509*p* on the bottom surface of the first conductivity type semiconductor layer 509*p*. The first contact layer 531_1 may be an n-type contact layer.

The second electrode structures 531_2, 537_2, and 539_2 may include a second contact layer 531_2 on a bottom surface of the current spreading layer 519 inside the second through hole 529, and second electrode layers 537_2 and 539_2 electrically connected to the second contact layer 531_2. The second electrode layers 537_2 and 539_2 may be referred to as second via electrode layers. The second electrode structures 531_2, 537_2, and 539_2 may be electrically connected to the current spreading layer 519 through the first through hole 527 and the second through hole 529 on the bottom surface of the first conductivity type semiconductor layer 509*p*. The second electrode structures 531_2, 537_2, and 539_2 may be electrically connected to the second conductivity type semiconductor layer 513*p*. The second contact layer 531_2 may be a p-type contact layer.

Each of the first contact layer 531_1 and the second contact layer 531_2 may include one selected from the group consisting of conductive materials, for example, Ag, Al, Ni, Cr, Cu, Au, Pd, Pt, Sn, W, Rh, Ir, Ru, Mg, Zn, Ti, and alloys thereof. The first electrode layers 537_1 and 539_1 and the second electrode layers 537_2 and 539_2 may be a multilayer structure of first and second barrier metal layers 537_1 and 537_2 and first and second pad bump metal layers 539_1 and 539_2.

In the present example embodiment, the first electrode layers 537_1 and 539_1 and the second electrode layers 537_2 and 539_2 are provided in a dual layer structure, but may be provided as a single layer structure. The first electrode layers 537_1 and 539_1 and the second electrode layers 537_2 and 539_2 may include the same material as the first contact layer 531_1 and the second contact layer 531_2.

The first electrode layers 537_1 and 539_1 may be electrically connected to the first contact layer 531_1 on the bottom surface of the first conductivity type semiconductor layer 509*p*. The barrier metal layer 537_1 constituting the first electrode layers 537_1 and 539_1 may be formed on the bottom surface of the first conductivity type semiconductor layer 509*p* and may be electrically connected to the first contact layer 531_1. Reference numeral 530_1 of FIG. 15C may indicate a portion that contacts the first conductivity type semiconductor layer 509*p*.

The second electrode layers 537_2 and 539_2 may be on the bottom surface of the first conductivity type semiconductor layer 509*p* and may be electrically connected to the second contact layer 531_2 through the first through hole 527 and the second through hole 529. The second electrode layers 537_2 and 539_2 may be electrically connected to the second conductivity type semiconductor layer 513*p* through the second contact layer 531_2. Reference numeral 530_2 of FIG. 15C may indicate a portion that contacts the second conductivity type semiconductor layer 513*p*.

In a case where the reflective layer 533*p* is formed in the semiconductor light emitting device 500, the reflective layer 533*p* may be formed on bottom surfaces and sidewalls of the first contact layer 531_1 and the second contact layer 531_2. in a case where the reflective layer 533*p* is formed in the semiconductor light emitting device 500, the first electrode layers 537_1 and 539_1 and the second electrode layers 537_2 and 539_2 may be formed on the bottom surface of the reflective layer 533*p*.

The semiconductor light emitting device 500 may further include a graded index layer 521 on the current spreading layer 519. The graded index layer 521 may be a material layer that improves the light extraction efficiency of the semiconductor light emitting device 500. The graded index layer 521 may be a material layer that reduces a refractive index when light travels from the active layer (e.g., a GaN layer) having a refractive index of about 2.47 to an air layer having a refractive index of 1. As such, in the semiconductor light emitting device 500, in a case where the refractive index is reduced by using the graded index layer 521, the light extraction efficiency of the semiconductor light emitting device 500 may be improved.

The graded index layer 521 may be a multilayer structure of a titanium oxide ($TiO_2$) layer and a silicon oxide ($SiO_2$) layer. When the graded index layer 521 is a multilayer structure of a titanium oxide ($TiO_2$) layer and a silicon oxide ($SiO_2$) layer, the graded index layer 521 may adjust a level of refractive index to about 1.83 to about 2.26.

The graded index layer 521 may be an obliquely-deposited ITO layer on the top surface of the current spreading layer 519. That is, as the graded index layer 521, the obliquely-deposited ITO layer may be formed by depositing an ITO source obliquely at a predetermined angle with respect to a direction perpendicular to the top surface of the current spreading layer 519. When the graded index layer 521 is the obliquely-deposited ITO layer, the graded index layer 521 may adjust a refractive index to about 1.5 to about 2.1.

A transparent adhesive layer 523 and a transparent support substrate 525 may be on the graded index layer 521. The transparent adhesive layer 523 may adhere the transparent support substrate 525 to the graded index layer 521. When the graded index layer 521 is not formed, the transparent adhesive layer 523 may adhere the current spreading layer 519 to the transparent support substrate 525.

The transparent adhesive layer 523 may include a material selected from polyacrylate, polyimide, polyamide, and benzocyclobutene (BCB). The transparent adhesive layer 523 may be a refractive index matching layer for matching to a refractive index between the transparent support substrate 525 (or the graded index layer 521) and the light emitting structure 515p.

The transparent support substrate 525 may include any transparent material. The transparent support substrate 525 may include glass. Besides the glass, the transparent support substrate 525 may include a material having excellent light transparency, such as silicone, epoxy, or plastic. The transparent adhesive layer 523 may include a material that is optically transparent, is stable at a high temperature, and has high chemical/mechanical stability. The transparent adhesive layer 523 may include a benzocyclobutene (BCB)-based polymer, a polydimethylsiloxane (PDMS), a UV curing agent, and a thermal hardener.

The transparent support substrate 525 may be a support structure containing a wavelength conversion material such as a phosphor or a quantum dot. For example, the transparent support substrate 525 may be formed of a silicon resin mixed with a wavelength conversion material or a transparent liquid resin such as an epoxy resin.

In another example, when the transparent support substrate 525 is a glass substrate, a support containing a wavelength conversion material may be manufactured by mixing a wavelength conversion material such as a phosphor with a glass composition and sintering the mixture at a relatively low temperature.

In the case of using the transparent support substrate 525, the graded index layer 521 may be simply adhered to the transparent support substrate 525 using the transparent adhesive layer 523, without using a temporal bonding process or a eutectic bonding process.

In the semiconductor light emitting device 500 according to the present example embodiment, since the first electrode layers 537_1 and 539_1 and the second electrode layers 537_2 and 539_2 provided below the light-emitting structure 515p function as electrode pads, the first electrode layers 537_1 and 539_1 and the second electrode layers 537_2 and 539_2 may be directly mounted on an external device or an external substrate in a flip-chip structure.

The semiconductor light emitting device 500 according to the present example embodiment may improve the light extraction efficiency by forming the graded index layer 521 on the light-emitting structure 515p or by forming the reflective layer 533p on the surface of the first conductivity type semiconductor layer 509p of the light-emitting structure 515p and inside the through holes 527 and 529 formed in the light-emitting structure 515p.

FIGS. 16A to 28A and FIGS. 16B to 28B are diagrams illustrating a method of manufacturing a semiconductor light emitting device, according to an example embodiment of the inventive concept. FIGS. 16B to 21B are plan views of FIGS. 16A to 21A, respectively, and FIGS. 22B to 28B are bottom views of FIGS. 22A to 28A, respectively.

Figure 16A:
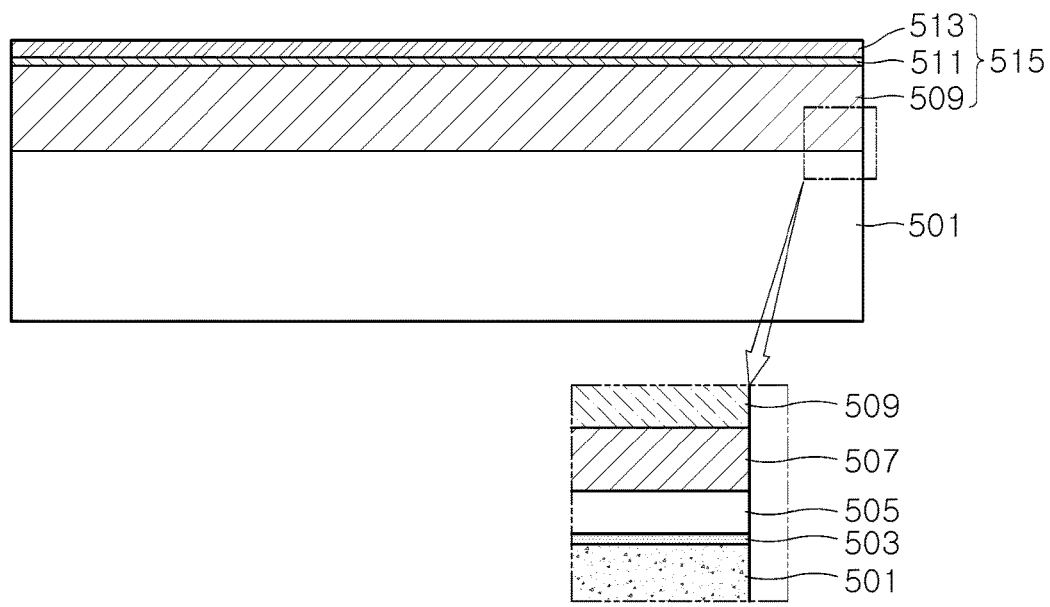
Figure 16B:
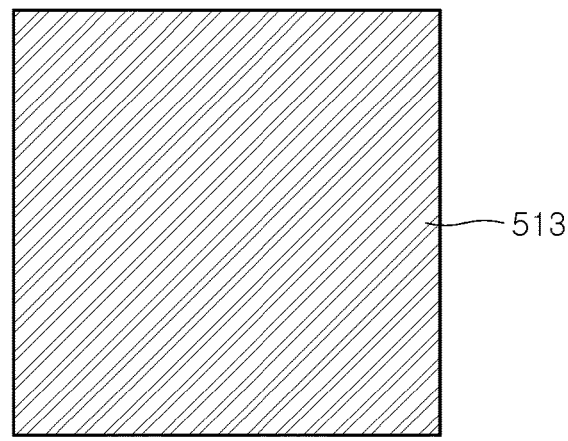

Referring to FIGS. 16A and 16B, a light-emitting structure 515 may be formed on a growth substrate 501. The growth substrate 501 may be a semiconductor wafer. The growth substrate 501 may be a silicon-based substrate. The silicon-based substrate may be a silicon (Si) substrate or a silicon carbide (SiC) substrate. When the silicon-based substrate is used as the growth substrate 501, it may be more suitable for an increase in a diameter of a wafer, and package productivity may be improved due to relatively low costs.

The growth substrate 501 may include an insulating material, a conductive material, or a semiconductor substrate, such as sapphire, SiC, $MgAl_2O_4$, MgO, $LiAlO_2$, and $LiGaO_2$. Sapphire widely used in a substrate for growth of nitride semiconductor is a crystal having electrical insulating properties and hexa-rhombo R3c symmetry. Sapphire may have a lattice constant of about 13.001 Å and about 4.758 Å in a c-axis direction and an a-axis direction and have a C(0001) plane, an A(1120) plane, and an R(1102) plane. In this case, since the C plane relatively facilitates the growth of a nitride thin film and is stable at a high temperature, it may be used as a substrate for the growth of a nitride material.

Buffer layers 503, 505, and 507 may be formed on the growth substrate 501. When the silicon-based substrate is used as the growth substrate 501, the buffer layers 503, 505, and 507 may be further required. The buffer layers 503, 505, and 507 may be layers for growing a nitride laminate having excellent quality, such as less cracks or lower potential.

The buffer layers 503, 505, and 507 may include a nucleus growth layer 503, a first buffer layer 505, and a second buffer layer 507. The nucleus growth layer 503 may include AlN. The first buffer layer 505 and the second buffer layer 507 may have a defect reducing function and may include $Al_xIn_yGa_{1-x-y}N$ (0≤x<1, 0≤y<1, 0≤x+y<1).

In detail, the buffer layers 503, 505 and 507 may be implemented by any one of structures described with reference to FIGS. 7A to 7D.

A light-emitting structure 515 may be formed by sequentially growing a first conductivity type semiconductor layer 509, an active layer 511, and a second conductivity type semiconductor layer 513 on the substrate 501 or the buffer layers 503, 505, and 507. The light-emitting structure 515 may be grown by using a metal organic chemical vapor deposition (MOCVD) process, a hydride vapor phase epitaxy (HVPE) process, a molecular beam epitaxy (MBE) process, or the like.

Figure 17A:
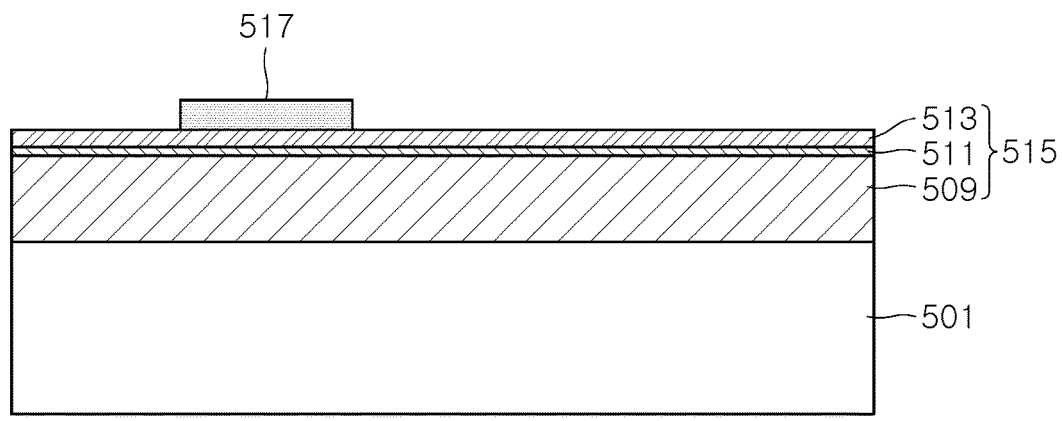
Figure 17B:
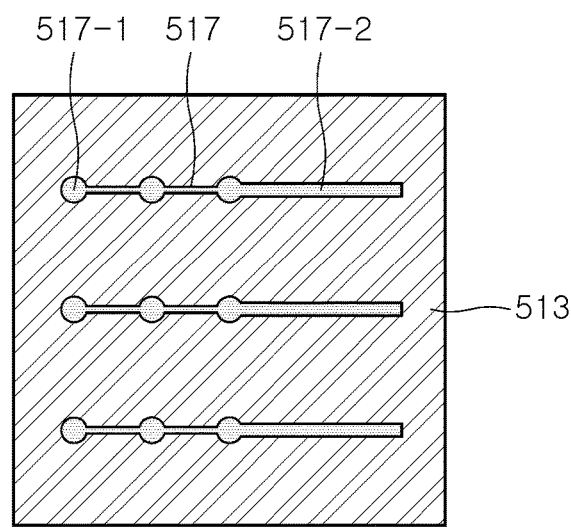

Referring to FIGS. 17A and 17B, an etch stop layer 517 may be formed on the second conductivity type semiconductor layer 513 of the light-emitting structure 515. The etch stop layer 517 may stop etching when a first through hole is formed in a subsequent process. The etch stop layer 517 may include a silicon oxide ($SiO_2$) layer.

As illustrated in FIG. 17B, the etch stop layer 517 may include a plurality of patterns spaced apart from one another when seen in a plan view. In addition, the etch stop layer 517 may include a circular pattern 517_1 and a bar-shaped pattern 517_2. The etch stop layer 517 may be formed by connecting the circular pattern 517_1 and the bar-shaped pattern 517_2.

Figure 18A:
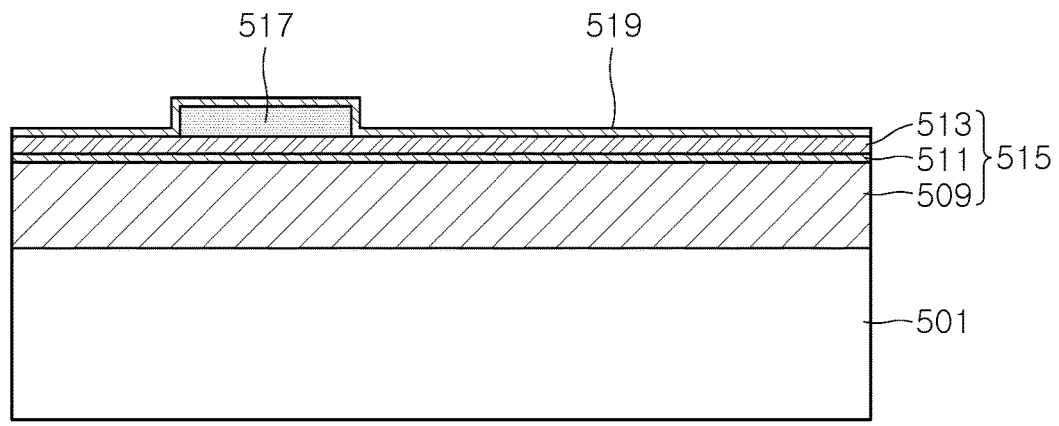
Figure 18B:
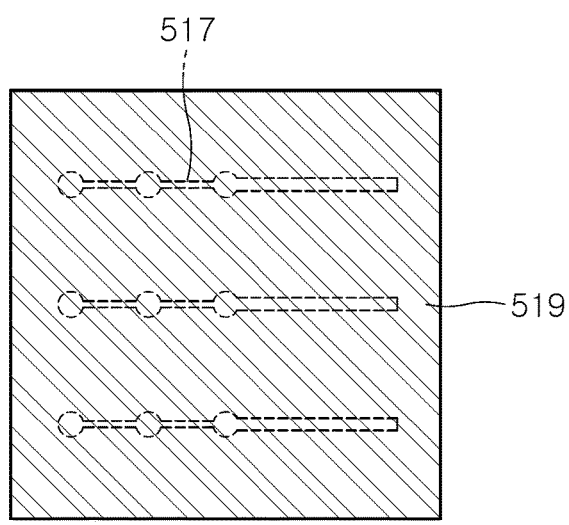

Referring to FIGS. 18A and 18B, a current spreading layer 519 may be formed on the top surfaces of the second conductivity type semiconductor layer 513 and the etch stop layer 517. The current spreading layer 519 may be an ITO layer. The current spreading layer 519 may be formed on the top surface of the second conductivity type semiconductor layer 513 and the top surface and the side surface of the etch stop layer 517.

The current spreading layer 519 may be formed for applying a voltage to the second conductivity type semiconductor layer 513. As illustrated in FIG. 18B, the current spreading layer 519 may be formed on an entire top surface of the etch stop layer 517. That is, the current spreading layer 519 may be formed on the entire top surface of the etch stop layer 517 including the circular pattern 517_1 and the bar-shaped pattern 517_2 described above with reference to FIG. 17B.

Figure 19A:
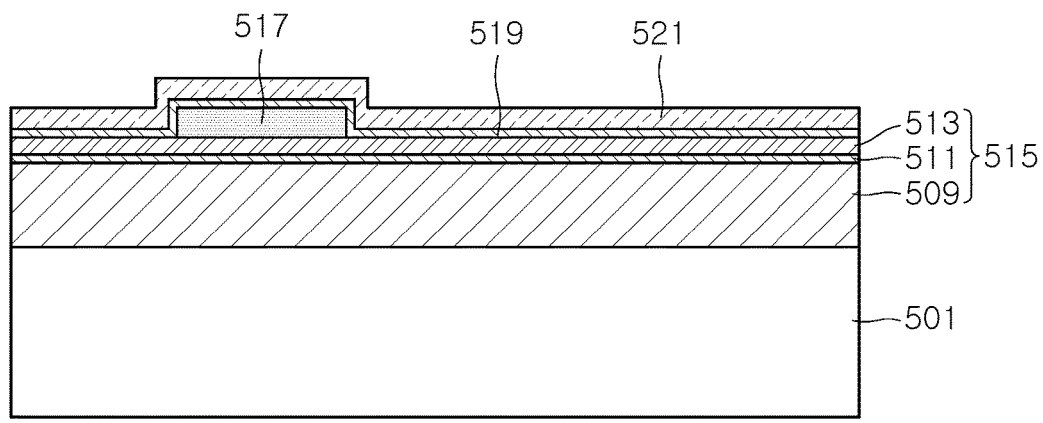
Figure 19B:
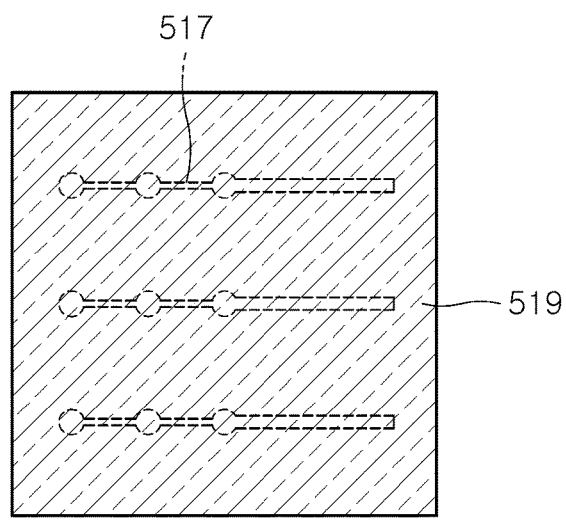

Referring to FIGS. 19A and 19B, a graded index layer 521 may be formed on the current spreading layer 519. As described above, the graded index layer 521 may be a material layer that improves light extraction efficiency. The graded index layer 521 may be a multilayer structure of a titanium oxide (TiO$_2$) layer and a silicon oxide (SiO$_2$) layer. When the graded index layer 521 is a multilayer structure of a titanium oxide (TiO$_2$) layer and a silicon oxide (SiO$_2$) layer, the graded index layer 521 may adjust a refractive index to about 1.83 to about 2.26.

The graded index layer 521 may be an obliquely-deposited ITO layer on a top surface of the current spreading layer 519. That is, as the graded index layer 521, an obliquely-deposited ITO layer may be formed by depositing an ITO source obliquely at a predetermined angle with respect to a direction perpendicular to the top surface of the current spreading layer 519. When the graded index layer 521 is an obliquely-deposited ITO layer, the graded index layer 521 may adjust a refractive index to about 1.5 to about 2.1. The graded index layer 521 may be formed over the entire top surface of the etch stop layer 517 including the circular pattern 517_1 and the bar-shaped pattern 517_2 described above with reference to FIG. 17B.

Figure 20A:
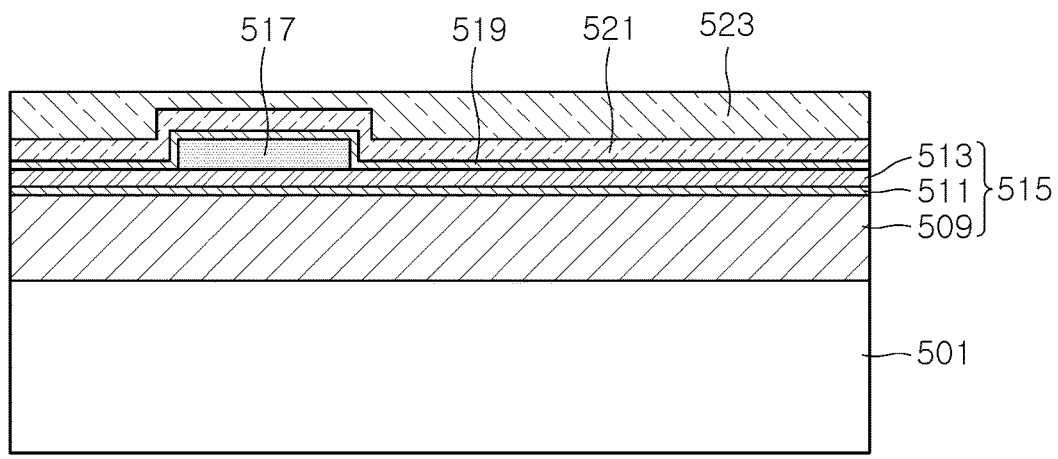
Figure 20B:
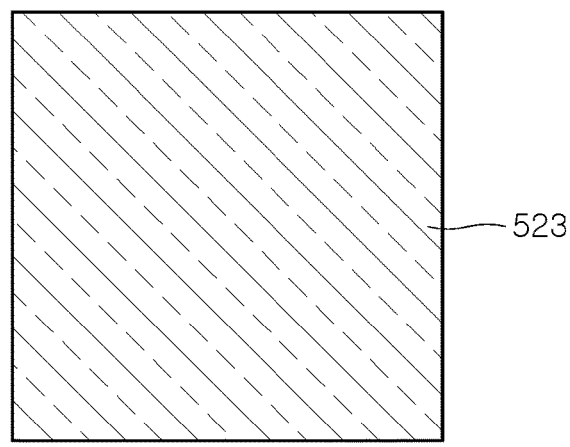

Referring to FIGS. 20A and 20B, a transparent adhesive layer 523 may be formed on the graded index layer 521. The transparent adhesive layer 523 may serve to adhere a transparent support substrate to be formed in a subsequent process. As described above, the transparent adhesive layer 523 may include a material that is optically transparent, is stable at a high temperature, and has high chemical/mechanical stability. The transparent adhesive layer 523 may include a benzocyclobutene (BCB)-based polymer, a polydimethylsiloxane (PDMS), a UV curing agent, and a thermal hardener.

Figure 21A:
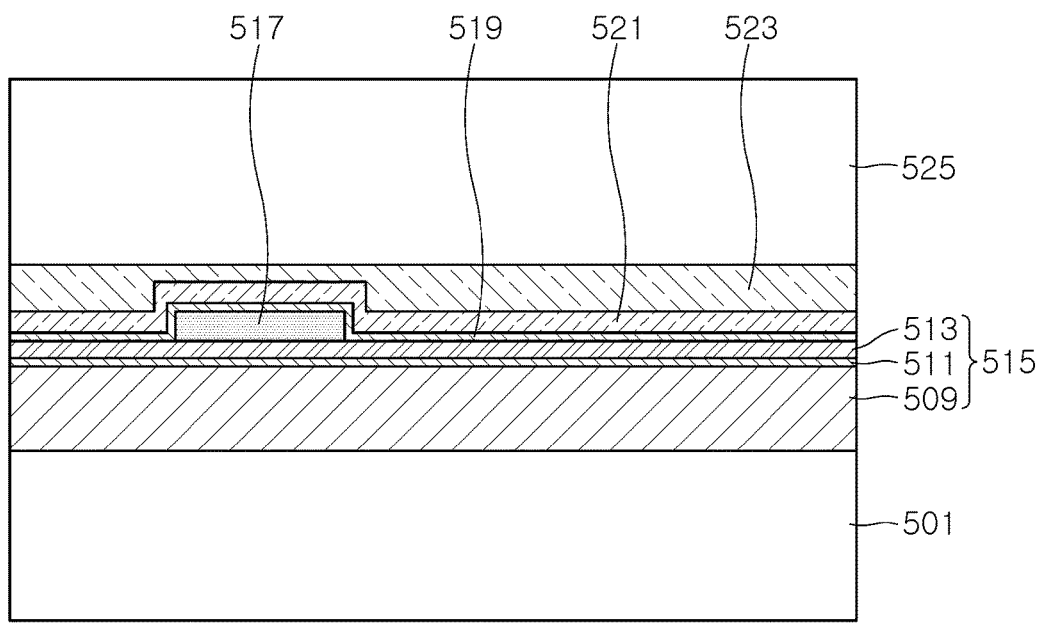
Figure 21B:
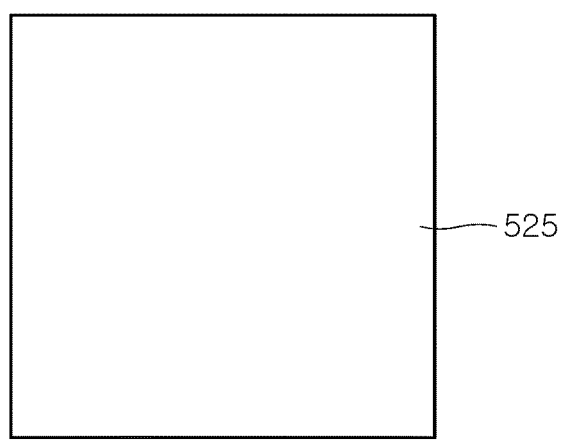

Referring to FIGS. 21A and 21B, a transparent support substrate 525 may be adhered to the transparent adhesive layer 523. The graded index layer 521 and the transparent support substrate 525 may be adhered to each other using the transparent adhesive layer 523. The transparent support substrate 525 may include any transparent materials. In the case of using the transparent support substrate 525, the graded index layer 521 may be simply adhered to the transparent support substrate 525 by using the transparent adhesive layer 523, without using a temporal bonding process or a eutectic bonding process.

Figure 22A:
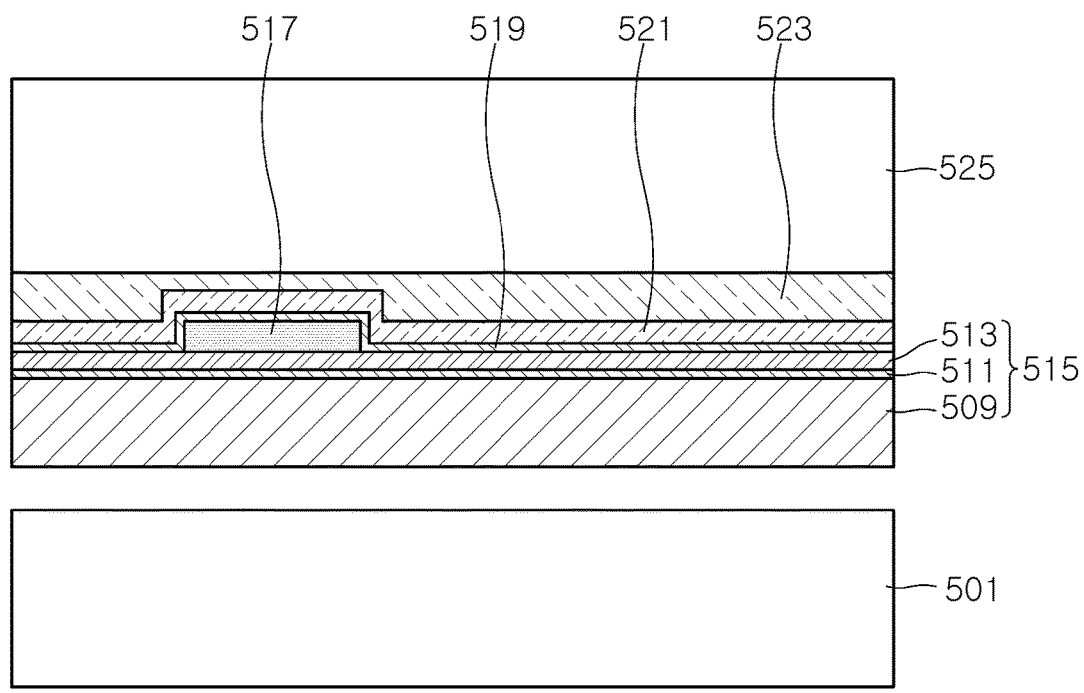
Figure 22B:
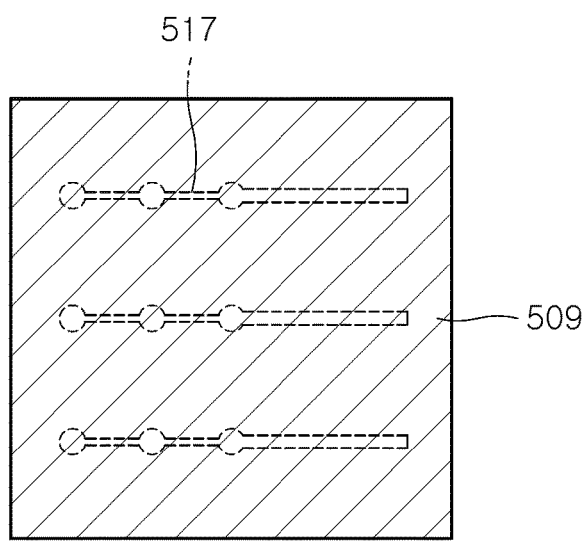

Referring to FIGS. 22A and 22B, the growth substrate 501 may be removed by using the transparent support substrate 525. The removal of the growth substrate 501 may be performed by using a wet etching process, a dry etching process, or a laser lift-off (LLO) process. In addition, according to some example embodiments, a mechanical polishing process may be used. Since the transparent support substrate 525 is adhered to the second conductivity type semiconductor layer 513 of the light-emitting structure 515, the growth substrate 501 may be easily removed from the first conductivity type semiconductor layer 509 of the light-emitting structure 515.

FIG. 22B is a bottom view of FIG. 22A that illustrates the etch stop layer 517. The etch stop layer 517 may include the circular pattern 517_1 and the bar-shaped pattern 517_2 described above with reference to FIG. 17B.

Figure 23A:
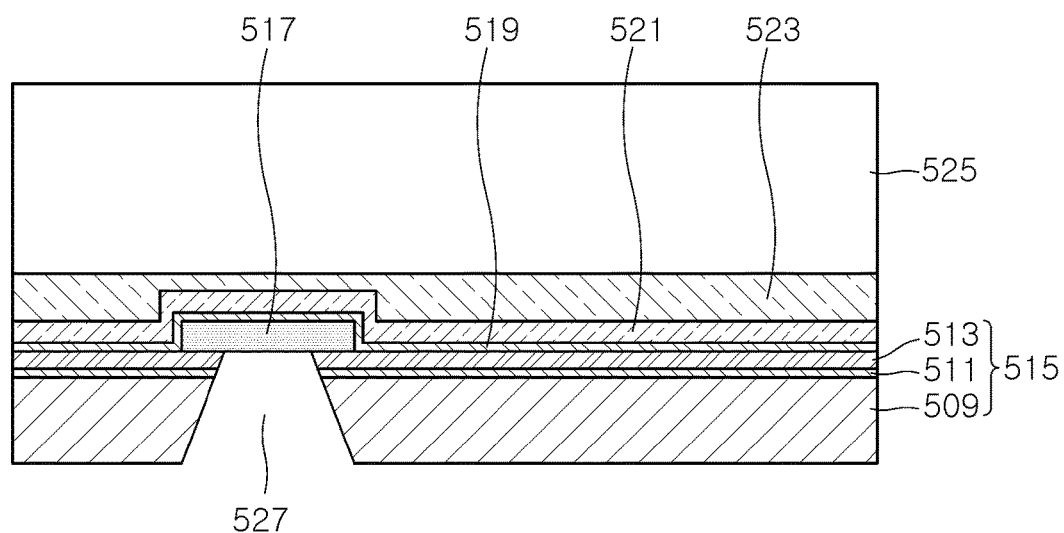
Figure 23B:
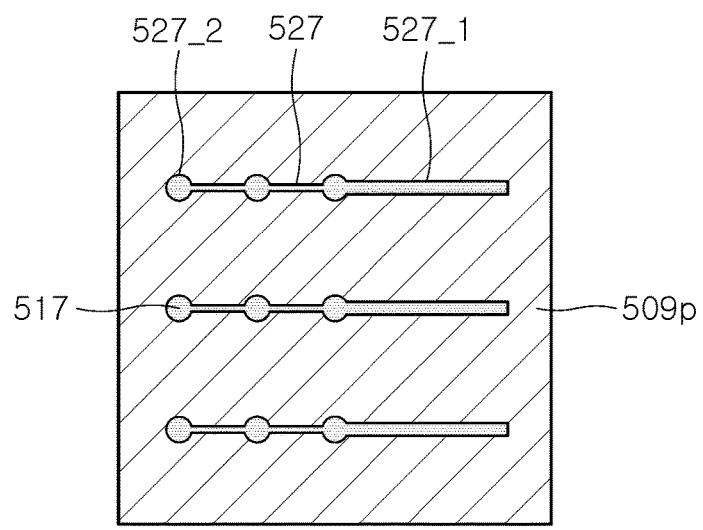

Referring to FIGS. 23A and 23B, a first through hole 527 passing through the first conductivity type semiconductor layer 509, the active layer 511, and the second conductivity type semiconductor layer 513 may be formed by using the etch stop layer 517 as an etch stop film. The first through hole 527 may be formed to expose the bottom surface of the etch stop layer 517.

The first through hole 527 may be formed by forming a mask layer (not illustrated) on the first conductivity type semiconductor layer 509 and etching the first conductivity type semiconductor layer 509, the active layer 511, and the second conductivity type semiconductor layer 513 by using a wet etching process or a dry etching process.

FIG. 23B is a bottom view of FIG. 23A that illustrates the etch stop layer 517. The etch stop layer 517 may include the circular pattern 517_1 and the bar-shaped pattern 517_2 described above with reference to FIG. 17B. In addition, the first through hole 527 may include a circular pattern 527_1 and a bar-shaped pattern 527_2 as in the etch stop layer 517.

Figure 24A:
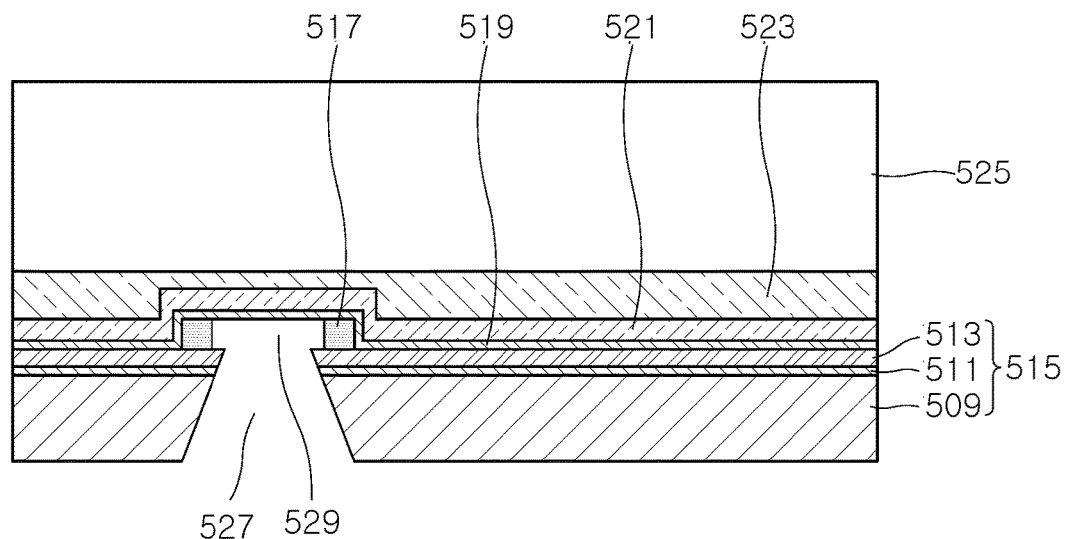
Figure 24B:
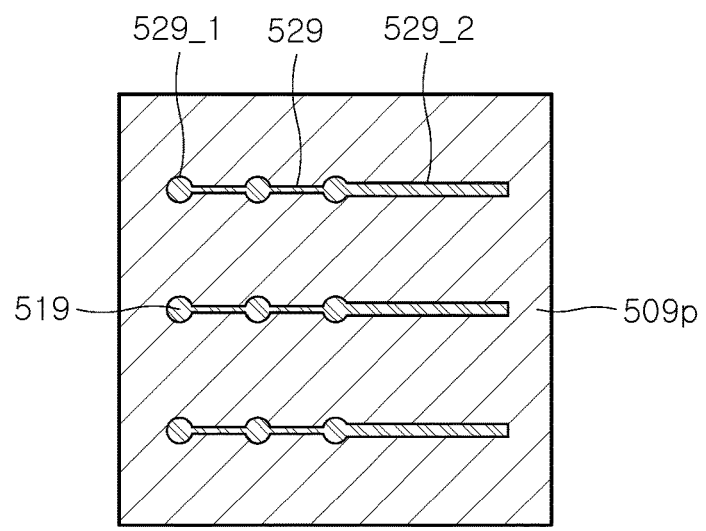

Referring to FIGS. 24A and 24B, a second through hole 529 communicating with the first through hole 527 may be formed by etching the etch stop layer 517 exposed by the first through hole 527. The second through hole 529 may be formed to expose the bottom surface of the current spreading layer 519. The second through hole 529 may be formed inside the etch stop layer 517. The second through hole 529 may be formed by etching the etch stop layer 517 exposed by the first through hole 527, by using a wet etching process or a dry etching process.

In the drawings subsequent to FIGS. 24A and 24B, the light-emitting structure 515 with the first through hole 527 is denoted by 515p. In addition, the first conductivity type semiconductor layer 509, the active layer 511, and the second conductivity type semiconductor layer 513 are denoted by 505p, 511p, and 513p, respectively.

Further, in the drawings subsequent to FIGS. 24A and 24B, the etch stop layer 517 with the second through hole 529 is denoted by 517p. FIG. 24B is a bottom view of FIG. 24A that illustrates the current spreading layer 519. In addition, the second through hole 529 may include a circular pattern 529_1 and a bar-shaped pattern 529_2.

Figure 25A:
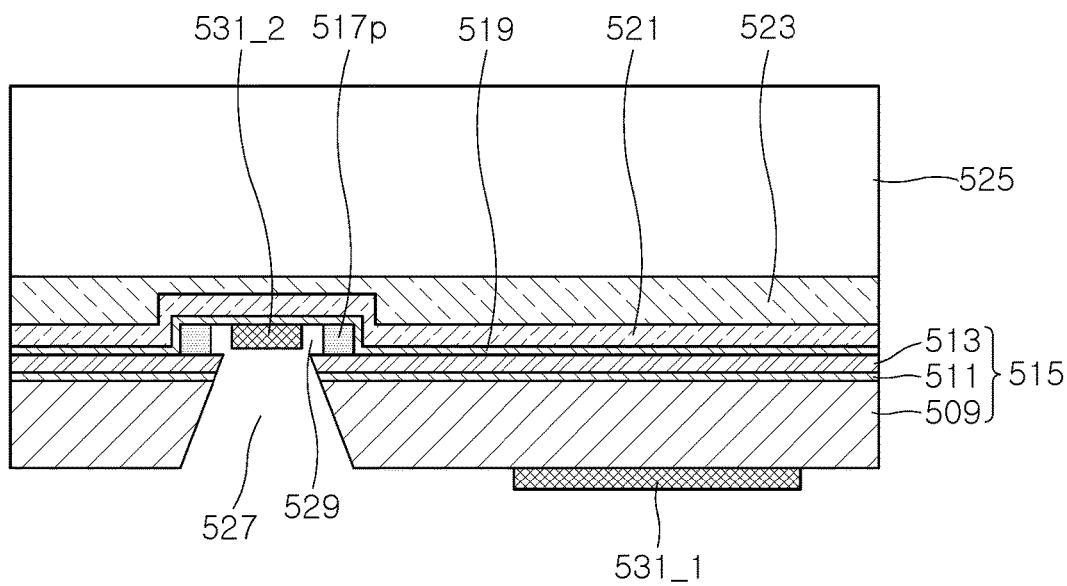
Figure 25B:
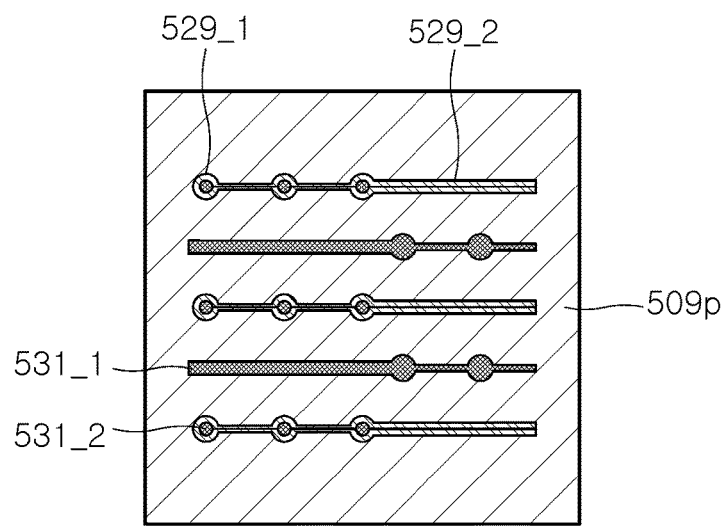

Referring to FIGS. 25A and 25B, a first contact layer 531_1 and a second contact layer 531_2 may respectively be formed on the bottom surface of the first conductivity type semiconductor layer 509p and the bottom surface of the second through hole 529. The first contact layer 531_1 may have a first electrode structure and may be electrically connected to the first conductivity type semiconductor layer 509p. The first contact layer 531_1 may be an n-type contact layer.

The second contact layer 531_2 may have a second electrode structure and may be electrically connected to the second conductivity type semiconductor layer 513p through the current spreading layer 519. The second contact layer 531_2 may be a p-type contact layer.

FIG. 25B is a bottom view of FIG. 25A. The first contact layer 531_1 and the second contact layer 531_2 may be formed inside the second through hole 529 including the circular pattern 529_1 and the bar-shaped pattern 529_2. Each of the first contact layer 531_1 and the second contact layer 531_2 may include a circular pattern and a bar-shaped pattern.

Figure 26A:
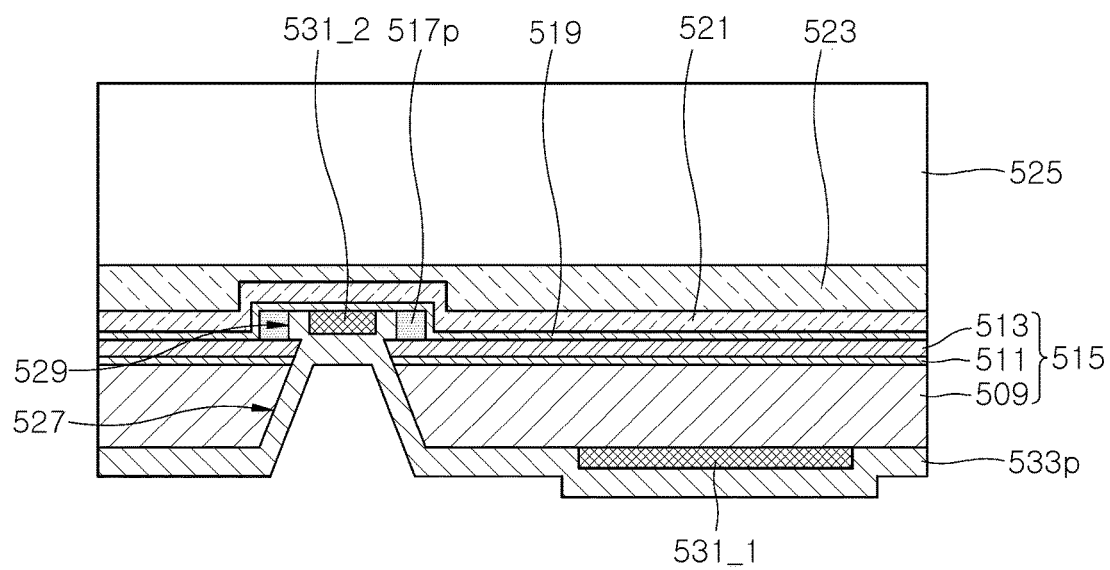
Figure 26B:
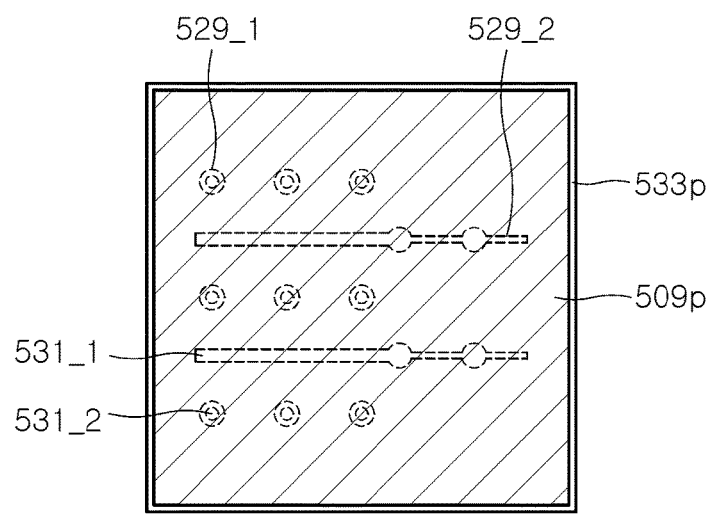

Referring to FIGS. 26A and 26B, a reflective layer 533 may be formed on the internal walls of the first through hole 527 and the second through hole 529, bottom surfaces of the first contact layer 531_1 and the second contact layer 531_2, and a bottom surface of the first conductivity type semiconductor layer 509p. The reflective layer 533p may be formed on an entire bottom surface of the light-emitting structure 515p.

The reflective layer 533 may reflect light generated by the light-emitting structure 515p. The reflective layer 533p may be a silver layer or a copper layer. The reflective layer 533p may be a distributed Bragg reflector (DBR).

FIG. 26B is a bottom view of FIG. 26A as described above. As illustrated in FIG. 26B, the reflective layer 533 may be formed on the bottom surfaces of the first contact layer 531_1 and the second contact layer 531_2 formed inside the second through hole 529 including the circular pattern 529_1 and the bar-shaped pattern 529_2, and the bottom surface of the first conductivity type semiconductor layer 509p.

Figure 27A:
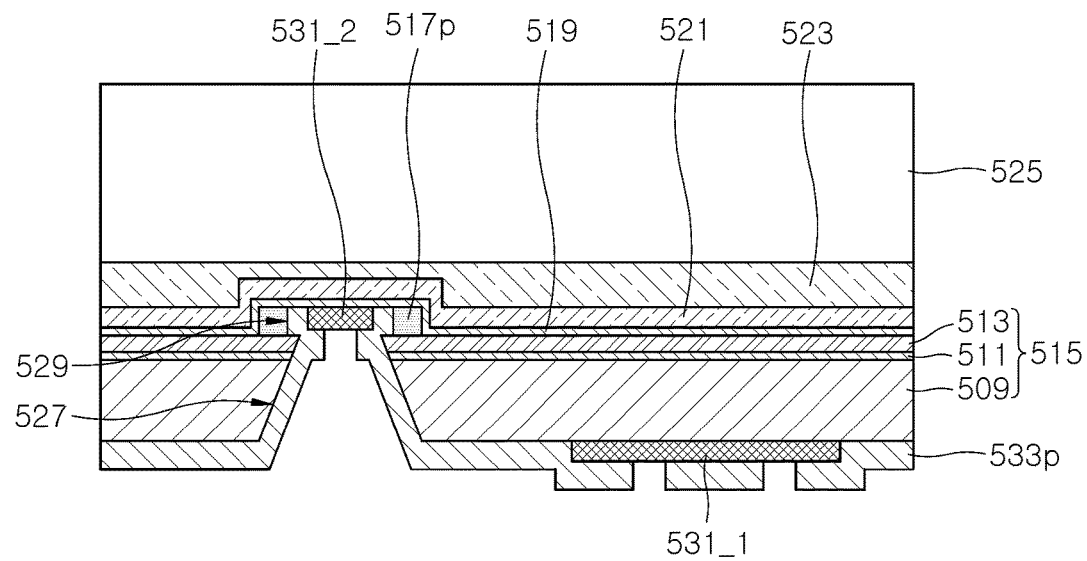
Figure 27B:
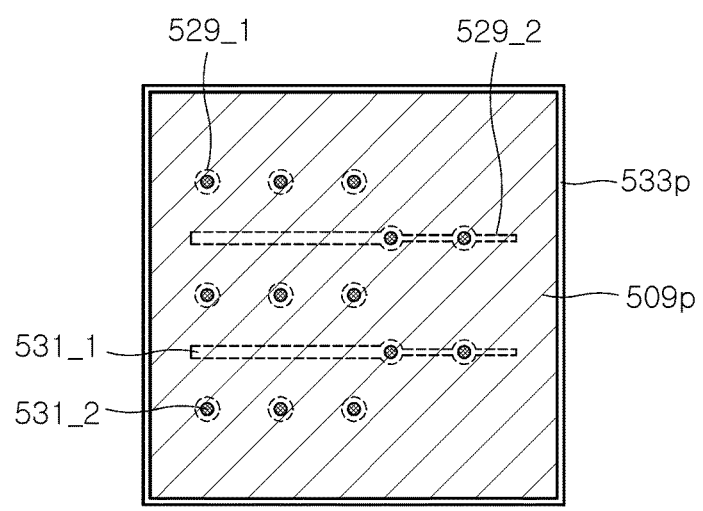

Referring to FIGS. 27A and 27B, the reflective layer 533 may be etched to expose the bottom surfaces of the first contact layer 531_1 and the second contact layer 531_2. A mask layer (not illustrated) may be formed on the reflective layer 533. The bottom surfaces of the first contact layer 531_1 and the second contact layer 531_2 may be exposed by etching the reflective layer 533 through a wet etching process or a dry etching process by using the mask layer as an etching mask. In the drawings subsequent to FIGS. 27A and 27B, the etched reflective layer 533 is denoted by 533p.

FIG. 27B is a bottom view of FIG. 27A as described above. As illustrated in FIG. 27B, the bottom surfaces of the first contact layer 531_1 and the second contact layer 531_2 formed inside the second through hole 529 including the circular pattern 529_1 and the bar-shaped pattern 529_2 may be exposed, and the reflective layer 533p may be formed on the bottom surface of the first conductivity type semiconductor layer 509p.

Figure 28A:
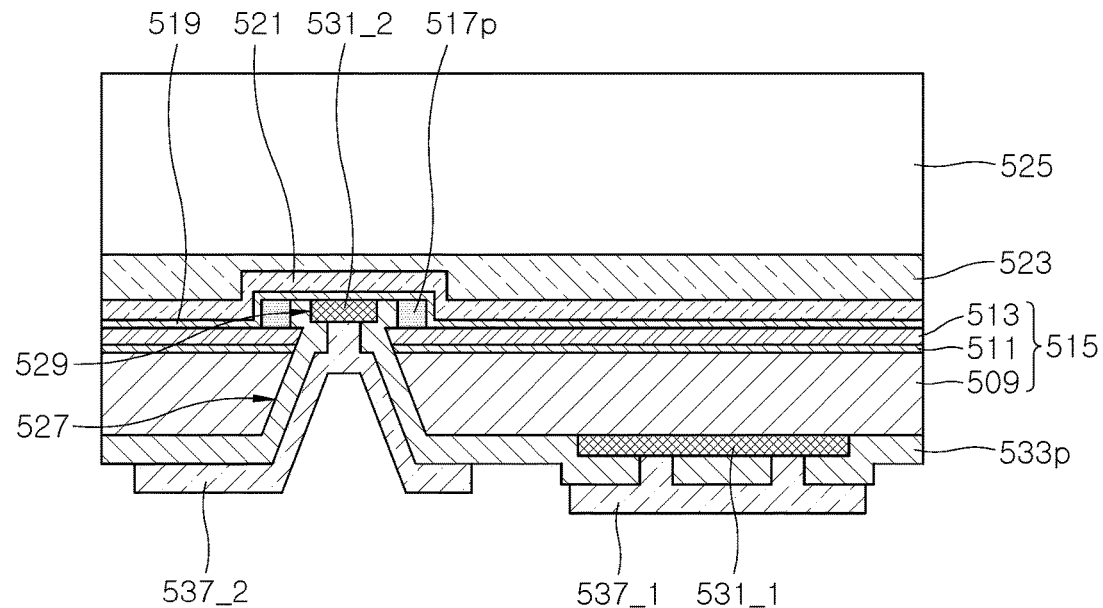
Figure 28B:
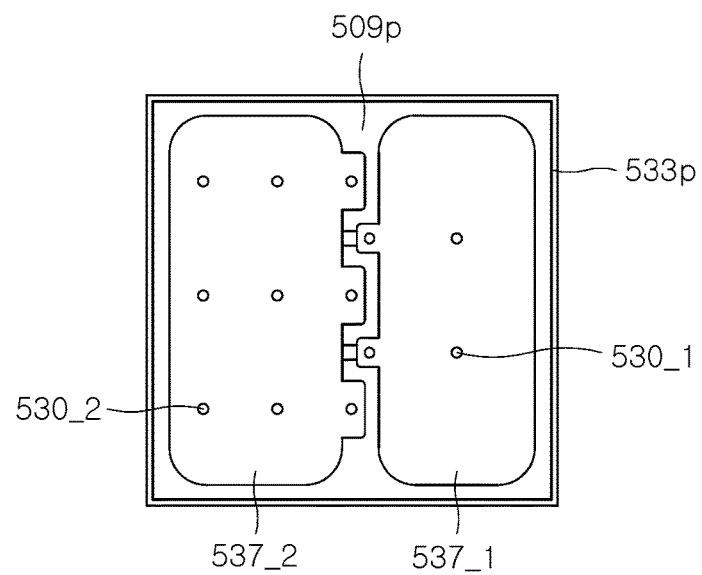

Referring to FIGS. 28A and 28B, barrier metal layers 537_1 and 537_2 electrically connected to the first contact layer 531_1 and the second contact layer 531_2 may be formed on the bottom surface of the reflective layer 533p. The barrier metal layer 537_1 may constitute a first electrode layer, and the barrier metal layer 537_2 may constitute a second electrode layer.

The barrier metal layer 537_1 may be formed on the bottom surface of the first conductivity type semiconductor layer 509p and may be electrically connected to the first contact layer 531_1. The barrier metal layer 537_2 may be formed on the bottom surface of the reflective layer 533p and may be electrically connected to the second contact layer 531_2 through the first through hole 527 and the second through hole 529.

FIG. 28B is a bottom view of FIG. 28A as described above. As illustrated in FIG. 28B, the barrier metal layers 537_1 and 537_2 electrically connected to the first conductivity type semiconductor layer 509p and the second conductivity type semiconductor layer 513p may be formed on the reflective layer 533p. In FIG. 28B, reference numeral 530_1 may indicate a portion that contacts the first conductivity type semiconductor layer 509p. Reference numeral 530_2 may indicate a portion that contacts the second conductivity type semiconductor layer 513p.

Figure 29:
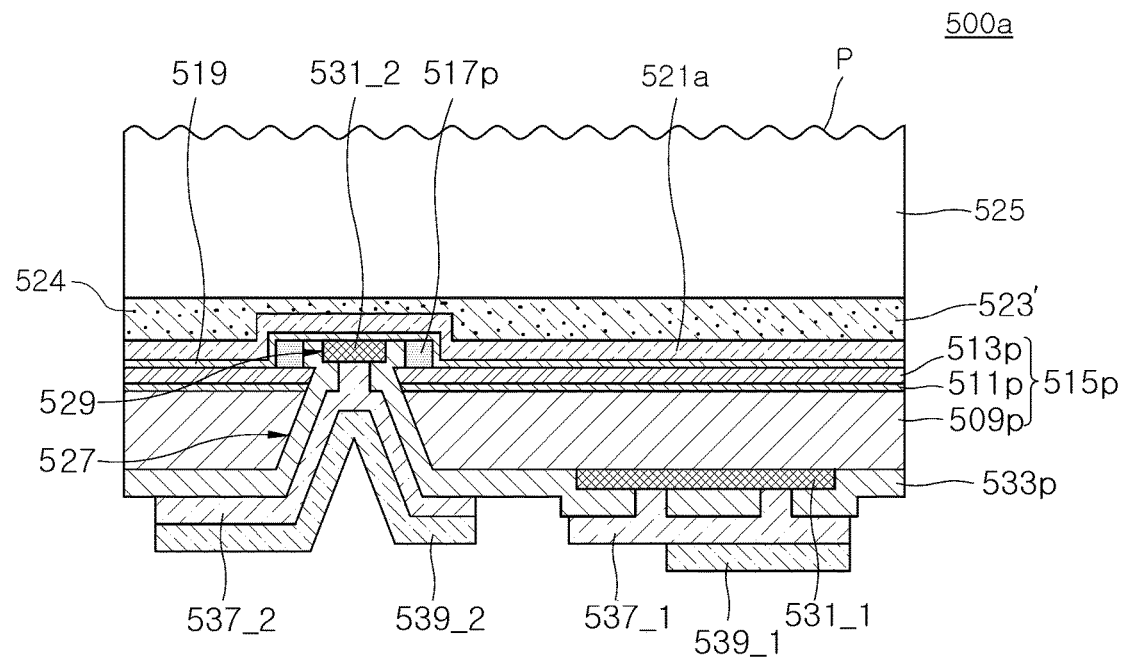
FIGS. 29 through 33 are cross-sectional views illustrating semiconductor light emitting devices, according to various example embodiments of the inventive concept.

FIG. 29 is a cross-sectional view of a semiconductor light emitting device 500a, according to another example embodiment of the inventive concept.

Referring to FIG. 29, the semiconductor light emitting device 500a of FIG. 29 may be substantially identical to the semiconductor light emitting device 500 of FIG. 15A, except that a concave/convex structure P is formed on a top surface of a transparent support substrate 525 and a wavelength conversion material is contained in the transparent adhesive layer. In some example embodiments, although not illustrated in FIG. 29, a concave/convex structure may also be formed on a top surface of a second conductivity type semiconductor layer 513p.

Due to the concave/convex structure P, when light emitted from an active layer 511p is incident on an external air layer, the light may be transmitted or multi-reflected and be guided upward. Therefore, the light extraction efficiency of the semiconductor light emitting device 500a may be increased. The concave/convex structure P may be formed by etching the upper portion of the transparent support substrate 525.

A transparent adhesive layer 523' may contain a wavelength conversion material 524 converting at least a portion of light having a first wavelength generated by the active layer 511p into light having a second wavelength. The transparent adhesive layer 523' may include at least one adhesive material selected from a group consisting of silicone, an epoxy, polyacrylate, polyimide, polyamide, and benzocyclobutene. The wavelength conversion material 524 may be mixed with the adhesive material before being cured to thereby provide the transparent adhesive layer 523' as a wavelength conversion element.

Figure 30:
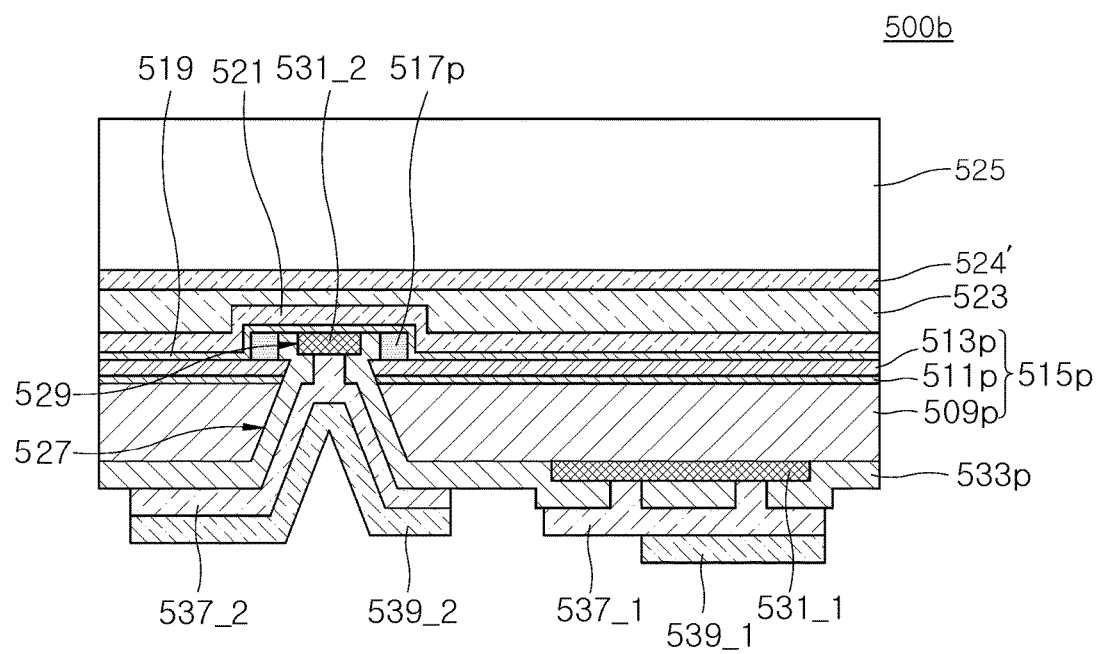

FIG. 30 is a cross-sectional view of a semiconductor light emitting device 500b, according to another example embodiment of the inventive concept.

Referring to FIG. 30, the semiconductor light emitting device 500b of FIG. 30 may be substantially identical to the semiconductor light emitting device 500 of FIG. 15A, except that a wavelength conversion layer 524' may be formed between a transparent adhesive layer 523 and a transparent support substrate 525.

In the semiconductor light emitting device 500b of FIG. 30, the wavelength conversion layer 524' may be formed on the bottom surface of the transparent support substrate 525. The wavelength conversion layer 524' may include a phosphor that is excited by light emitted from a light-emitting structure 515p and emits light having different wavelengths. When light is emitted through the phosphor, desired output light such as white light may be obtained. Although not illustrated in FIG. 30, the wavelength conversion layer 524' may not be separately provided and may have a structure in which phosphor materials are distributed in the transparent support substrate 525.

Before the transparent support substrate 525 is adhered and before the graded index layer 521 is adhered, the wavelength conversion layer 524' may be formed by coating wavelength conversion materials on a bottom surface of the transparent support substrate 525 through a simple process such as a spray coating process or a spin coating process. The wavelength conversion layer 524' may be formed on the bottom surface of the transparent support substrate 525 by using a method of attaching a sheet such as a phosphor film or a ceramic phosphor.

Figure 31:
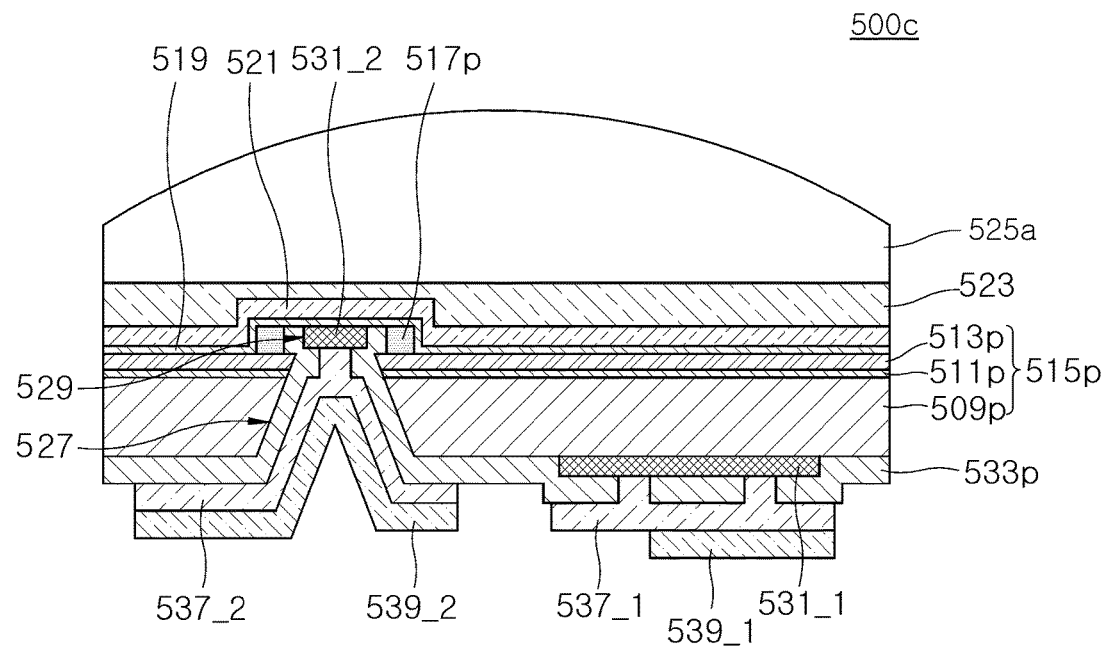

FIG. 31 is a cross-sectional view of a semiconductor light emitting device 500c, according to another example embodiment of the inventive concept.

Referring to FIG. 31, the semiconductor light emitting device 500c of FIG. 31 may be substantially identical to the semiconductor light emitting device 500 of FIG. 15A, except that the transparent support substrate 525 is replaced with a transparent support substrate 525a.

In the semiconductor light emitting device 500c, the top surface of the transparent support substrate 525a on a light path of light emitted by a light-emitting structure 515p may have a semispherical shape. That is, the top surface of the transparent support substrate 525a, from which light is emitted, may have a semispherical shape.

Therefore, the transparent support substrate 525a may serve as a lens. The semispherical shape of the transparent support substrate 525a may be formed by etching the upper portions of the transparent support substrates 525 according to the above-described example embodiments.

Figure 32:
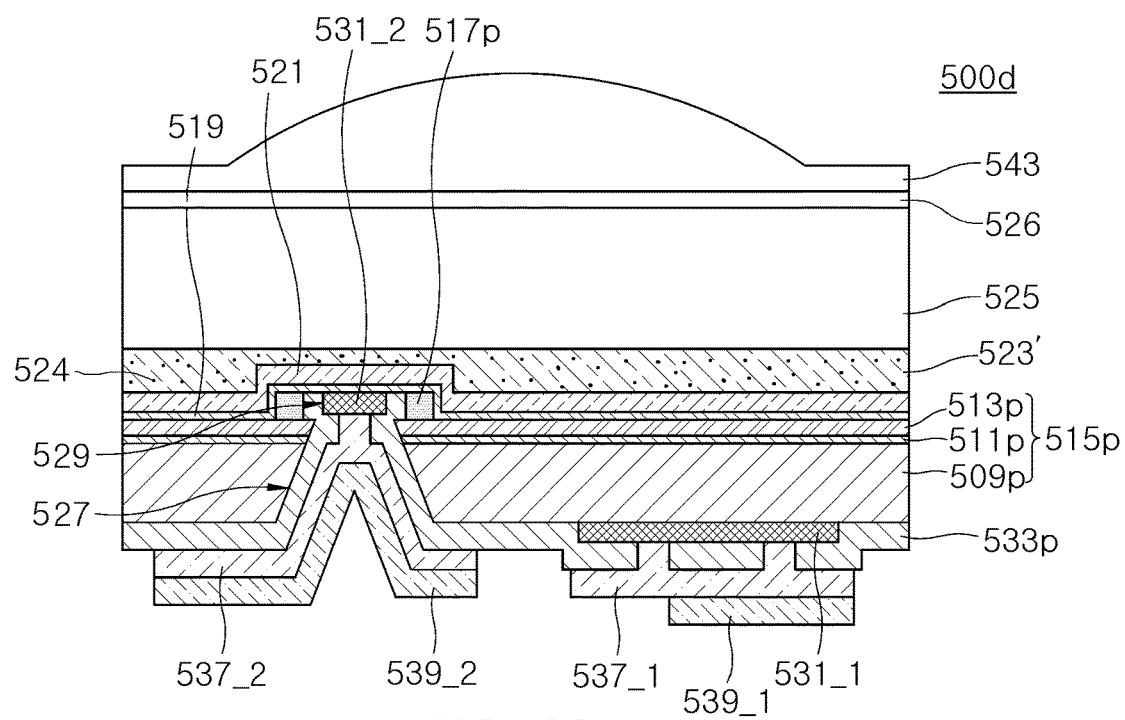

FIG. 32 is a cross-sectional view of a semiconductor light emitting device 500d, according to another example embodiment of the inventive concept.

Referring to FIG. 32, the semiconductor light emitting device 500d of FIG. 32 may be substantially identical to the semiconductor light emitting device 500a of FIG. 29, except that a lens layer 543 is further formed on a transparent support substrate 525 and an optical filter layer 526 is added.

The lens layer 543 of the semiconductor light emitting device 500d may include a material having excellent light transparency and heat resistance, such as silicone, epoxy, glass, or plastic. The lens layer 543 may adjust an orientation angle of light emitted through the top surface thereof by a convex or concave lens structure. The lens layer 543 may include a resin having a degree of transparency sufficient to transmit light emitted from the light-emitting structure 515p with significantly reduced loss. For example, the lens layer 543 may include an elastic resin, silicone, an epoxy resin, or plastic.

As illustrated in FIG. 32, the top surface of the lens layer 543 may have a convex dome shape, but the inventive concept is not limited thereto. Alternatively, the lens layer 543 may have an aspherical and/or asymmetrical shape, a concave/convex portion may be formed on the top surface of the lens layer 543. The lens layer 543 may be formed on the transparent support substrate 525 by, for example, a spray coating process.

In the semiconductor light emitting device 500d, the optical filter layer 526 may be further formed between the transparent support substrate 525 and the lens layer 543. The optical filter layer 526 may be configured in such a manner that it allows light within a required wavelength band to be selectively transmitted while allowing light in a non-required wavelength band to be selectively blocked. For example, the optical filter layer 526 may be an omnidirectional reflector (ODR) or a distributed Bragg reflector (DBR). In this case, the optical filter layer 526 may be formed by alternately forming two types of dielectric layers having different refractive indices. Alternatively, the optical filter layer 526 may include a material such as a dye.

In the example embodiment, the optical filter layer 526 may serve to block unconverted light, for example, blue light, having the first wavelength in order to increase a rate of light, for example, green or red light, having the second wavelength converted by the wavelength conversion material 524 contained in the transparent adhesive layer 523', in finally emitted light.

In the example embodiment, the optical filter layer 526 is illustrated as being disposed on the top surface of the transparent support substrate 525, but it may also be arranged in a different position, as necessary. For example, the optical filter layer 526 may be disposed between the transparent support substrate 525 and the transparent adhesive layer 523'.

Figure 33:
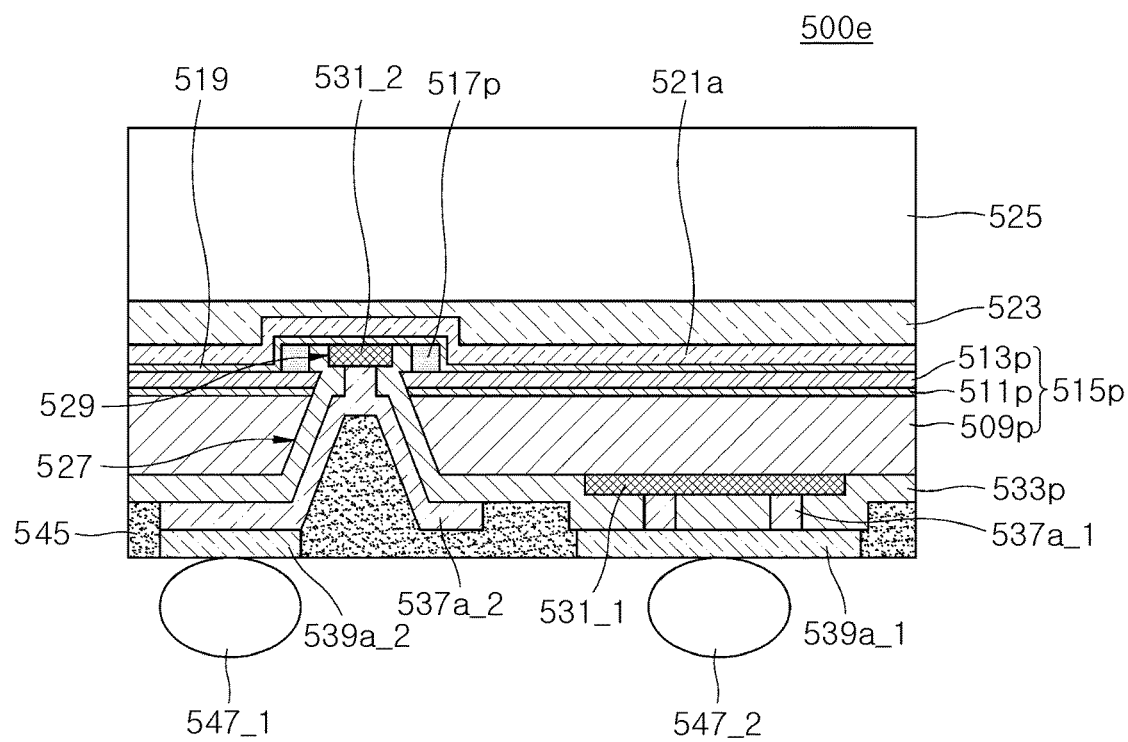

FIG. 33 is a cross-sectional view of a semiconductor light emitting device 500e, according to another example embodiment of the inventive concept.

Referring to FIG. 33, the semiconductor light emitting device 500e of FIG. 33 may be substantially identical to the semiconductor light emitting device 500 of FIG. 15A, except that a support layer 545 fills a first through hole 527, first electrode layers 537a_1 and 539a_1 and second electrode layers 537a_2 and 539a_2 have different shapes, and external connection terminals 547_1 and 547_2 are further formed on the bottom surfaces of the first electrode layers 537a_1 and 539a_1 and the second electrode layers 537a_2 and 539a_2.

In the semiconductor light emitting device 500e, the support layer 545 may be formed on a bottom surface of a reflective layer 533p while filling the inside of the first through hole 527. A bottom surface of the support layer 545 may have the same plane as the bottom surfaces of the first electrode layers 537a_1 and 539a_1 and the second electrode layers 537a_2 and 539a_2. The support layer 545 may also be formed on side surfaces of the first electrode layers 537a_1 and 539a_1 and the second electrode layers 537a_2 and 539a_2. The support layer 545 may protect the reflective layer 533p, the first electrode layers 537a_1 and 539a_1, and the second electrode layers 537a_2 and 539a_2, and may facilitate the handling of the semiconductor light emitting device 500e.

In the semiconductor light emitting device 500e, a first barrier metal layer 1 constituting the first electrode layers 537a_1 and 539a_1 may not be formed to protrude over a bottom surface of the reflective layer 533p, and a second pad bump metal layer constituting the second electrodes 537a_2 and 539a_2 may be partially formed on a bottom surface of the second barrier metal layer 537a_2. As described above, the semiconductor light emitting device 500e may include the first electrode layers 537a_1 and 539a_1 and the second electrode layers 537a_2 and 539a_2 in different shapes.

The external connection terminals 547_1 and 547_2 may be respectively formed on bottom surfaces of the first electrode layers 537a_1 and 539a_1 and the second electrode layers 537a_2 and 539a_2. The external connection terminals 547_1 and 547_2 may be formed for connection to an external device. The external connection terminals 547_1 and 547_2 may protrude outwardly from the first electrode layers 537a_1 and 539a_1 and the second electrode layers 537a_2 and 539a_2. The shapes of the external connection terminals 547_1 and 547_2 are not limited to the shape illustrated in FIG. 33. For example, the external connection terminals 547_1 and 547_2 may have a pillar shape such as a rectangular pillar or a cylinder.

The external connection terminals 547_1 and 547_2 may be solder bumps. The external connection terminals 547_1 and 547_2 may include at least one selected from the group consisting of copper (Cu), aluminium (Al), silver (Ag), tin (Sn), and gold (Au).

Figure 34:
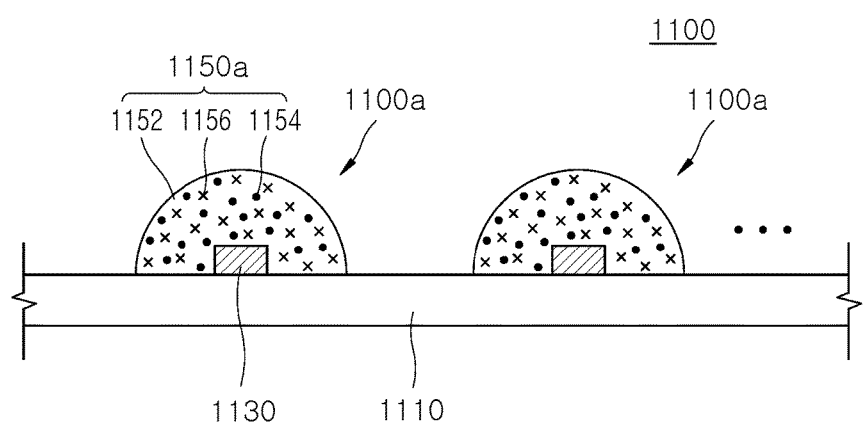
FIGS. 34 and 35 are cross-sectional views schematically illustrating white light emitting modules including a semiconductor light emitting device, according to an example embodiment of the inventive concept.
Figure 35:
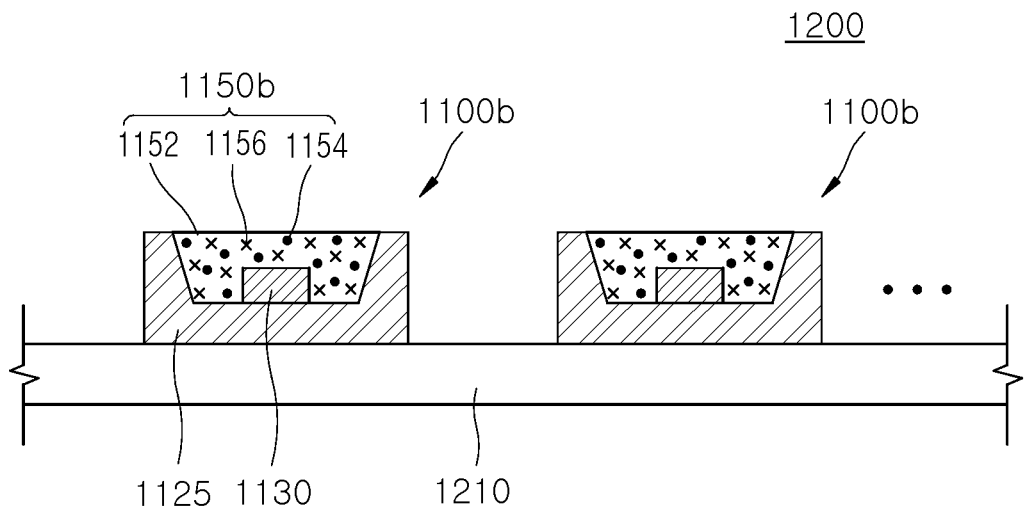

FIGS. 34 and 35 are cross-sectional views of a white light source module including a semiconductor light emitting device, according to an example embodiment of the inventive concept.

Referring to FIG. 34, a light source module 1100 for a liquid crystal display (LCD) backlight may include a circuit board 1110 and an array of a plurality of white light-emitting devices 1100a mounted on the circuit board 1110. Conductive patterns connected to the white light-emitting devices 1100a may be formed on the circuit board 1110.

Each of the white light-emitting devices 1100a may be configured such that a light-emitting device 1130 configured to emit blue light is directly mounted on the circuit board 1110 by using a chip-on-board (COB) method. The light-emitting device 1130 may be at least one of the above-described semiconductor light emitting devices 50, 50*a*, 50*b*, 50*c*, 50*d*, 100, 500, 500*a*, 500*b*, 500*c*, 500*d*, and 500*e* according to the example embodiments. Each of the white light-emitting device 1100*a* may exhibit a wide orientation angle because a wavelength conversion unit (wavelength conversion layer) 1150*a* is formed to have a semispherical shape with a lens function. The wide orientation angle may contribute to reducing a thickness or a width of an LCD display.

Referring to FIG. 35, a light source module 1200 for an LCD backlight may include a circuit board 1110 and an array of a plurality of white light-emitting devices 1100*b* mounted on the circuit board 1110. Each of the white light-emitting devices 1100*b* may include a blue light-emitting device 1130 mounted in a reflection cup of a package body 1125, and a wavelength conversion unit 1150*b* that encapsulates the blue light-emitting device 1130. The light-emitting device 1130 may be at least one of the above-described semiconductor light emitting devices 50, 50*a*, 50*b*, 50*c*, 50*d*, 100, 500, 500*a*, 500*b*, 500*c*, 500*d*, and 500*e* according to the example embodiments.

If necessary, the wavelength conversion units 1150*a* and 1150*b* may include wavelength conversion materials 1152, 1154, and 1156 such as phosphors and/or quantum dots as described in reference to FIGS. 34 and 35. A detailed description of the wavelength conversion materials may be referred to in the description above with reference to FIG. 14.

In addition, as in the semiconductor light emitting devices 50, 50*a*, 50*b*, 50*c*, 50*d*, 100, 500*a*, 500*b*, and 500*d*, in the case that the semiconductor light emitting device itself has a wavelength conversion element, the wavelength conversion element of the semiconductor light emitting device may have a different type or a different color of wavelength conversion material from those of the wavelength conversion units 1150*a* and 1150*b*.

Figure 36:
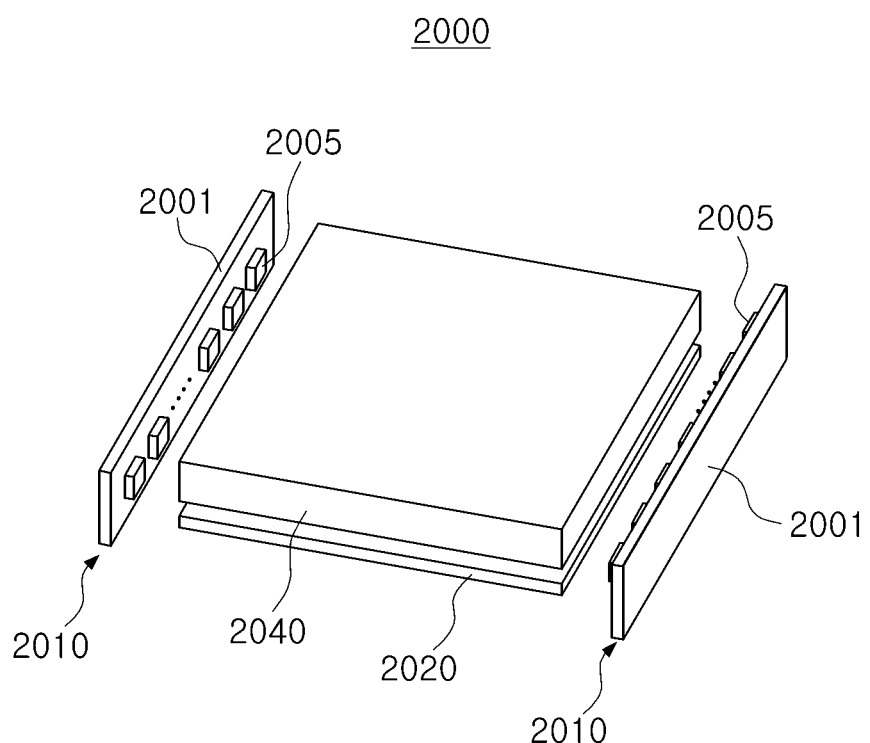
FIG. 36 is a perspective view schematically illustrating a backlight unit including a semiconductor light emitting device, according to an example embodiment of the inventive concept.

FIG. 36 is a schematic perspective view of a backlight unit 2000 including a semiconductor light emitting device, according to an example embodiment of the inventive concept.

Referring to FIG. 36, the backlight unit 2000 may include a light guide plate 2040 and light source modules 2010 on both sides of the light guide plate 2040. In addition, the backlight unit 2000 may further include a reflective plate 2020 under the light guide plate 2040. The backlight unit 2000 according to the present example embodiment may be an edge-type backlight unit. According to some example embodiments, the light source module 2010 may only be provided on one side of the light guide plate 2040 or may be additionally provided on the other side. The light source module 2010 may include a printed circuit board (PCB) 2001 and a plurality of light sources 2005 mounted on the PCB 2001. The light source 2005 may be at least one of the above-described semiconductor light emitting devices 50, 50*a*, 50*b*, 50*c*, 50*d*, 100, 500, 500*a*, 500*b*, 500*c*, 500*d*, and 500*e* according to the example embodiments.

Figure 37:
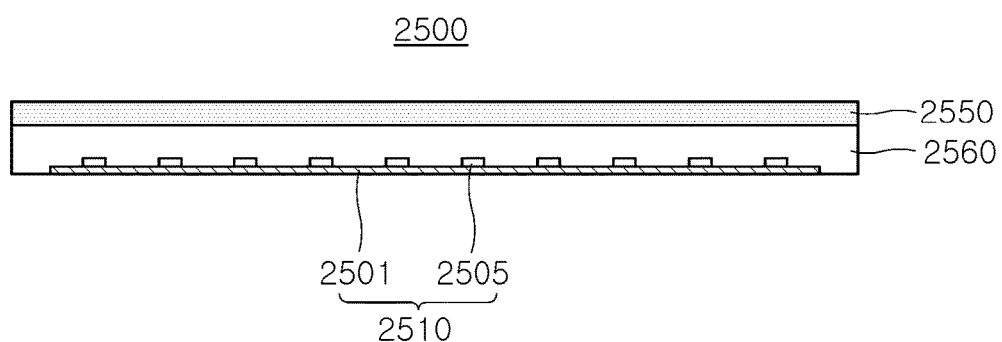
FIG. 37 is a view illustrating an example of a direct-type backlight unit including a semiconductor light emitting device, according to an example embodiment of the inventive concept.
Figure 38:
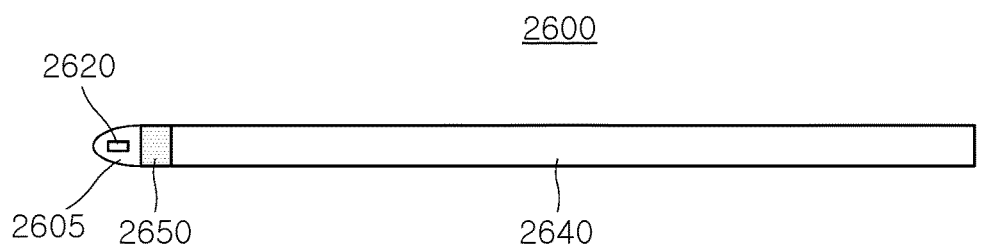
FIGS. 38 and 39 are views illustrating examples of edge-type backlight units including a semiconductor light emitting device, according to an example embodiment of the inventive concept.
Figure 39:
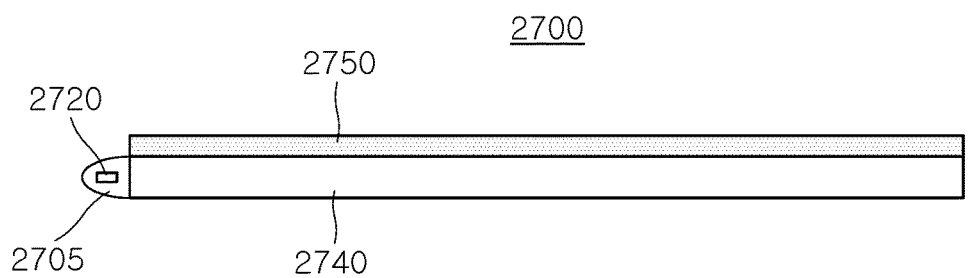

FIGS. 37 to 39 are cross-sectional views of backlight units 2500, 2600, and 2700 including a semiconductor light emitting device, according to an example embodiment of the inventive concept.

In the backlight units 2500, 2600, and 2700, wavelength conversion units 2550, 2650, and 2750 are not arranged in light sources 2505, 2605, and 2705. The wavelength conversion units 2550, 2650, and 2750 are arranged in the backlight units 2500, 2600, and 2700 outside of the light sources 2505, 2605, and 2705 so as to convert light. The light sources 2505, 2605, and 2705 may be at least one of the above-described semiconductor light emitting devices 50, 50*a*, 50*b*, 50*c*, 50*d*, 100, 500, 500*a*, 500*b*, 500*c*, 500*d*, and 500*e* according to the example embodiments. The semiconductor light emitting device 50, 50*a*, 50*b*, 50*c*, 50*d*, 100, 500*a*, 500*b*, or 500*d* may themselves have a wavelength conversion element. In this case, the wavelength conversion element of the semiconductor light emitting device may have a different type or a different color of wavelength conversion material from those of the wavelength conversion units 2550, 2650 and 2750. For example, the wavelength conversion element may include a red phosphor, such as fluoride, vulnerable to moisture, and the wavelength conversion units 2550, 2650, and 2750 spaced apart from the light sources 2505, 2605, and 2705 may include a different type of wavelength conversion material, such as a green quantum dot.

The backlight unit 2500 of FIG. 37 is a direct-type backlight unit and may include the wavelength conversion unit 2550, a light source module 2510 under the wavelength conversion unit 2550, and a bottom case 2560 accommodating the light source module 2510. In addition, the light source module 2510 may include a PCB 2501 and a plurality of light sources 2505 mounted on the PCB 2501.

In the backlight unit 2500, the wavelength conversion unit 2550 may be on the bottom case 2560. Therefore, at least a part of the light emitted by the light source module 2510 may be wavelength-converted by the wavelength conversion unit 2550. The wavelength conversion unit 2550 may be manufactured as a separate film and may be integrated with a light diffusion plate (not illustrated).

The backlight units 2600 and 2700 of FIGS. 38 and 39 are edge-type backlight units and may include the wavelength conversion unit 2650 and 2750, light guide plates 2640 and 2740, and reflection units 2620 and 2720 and light sources 2605 and 2705 arranged on one side of the light guide plates 2640 and 2740. The light emitted by the light sources 2605 and 2705 may be guided inside the light guide plates 2640 and 2740 by the reflection units 2620 and 2720. In the backlight unit 2600 of FIG. 38, the wavelength conversion unit 2650 may be arranged between the light guide plate 2640 and the light source 2605. In the backlight unit 2700 of FIG. 39, the wavelength conversion unit 2750 may be on a light emission surface of the light guide plate 2740.

The wavelength conversion units 2550, 2650, and 2750 may include typical phosphors. In particular, QD phosphors may be used for supplementing characteristics of QDs vulnerable to moisture or heat from the light source.

Figure 40:
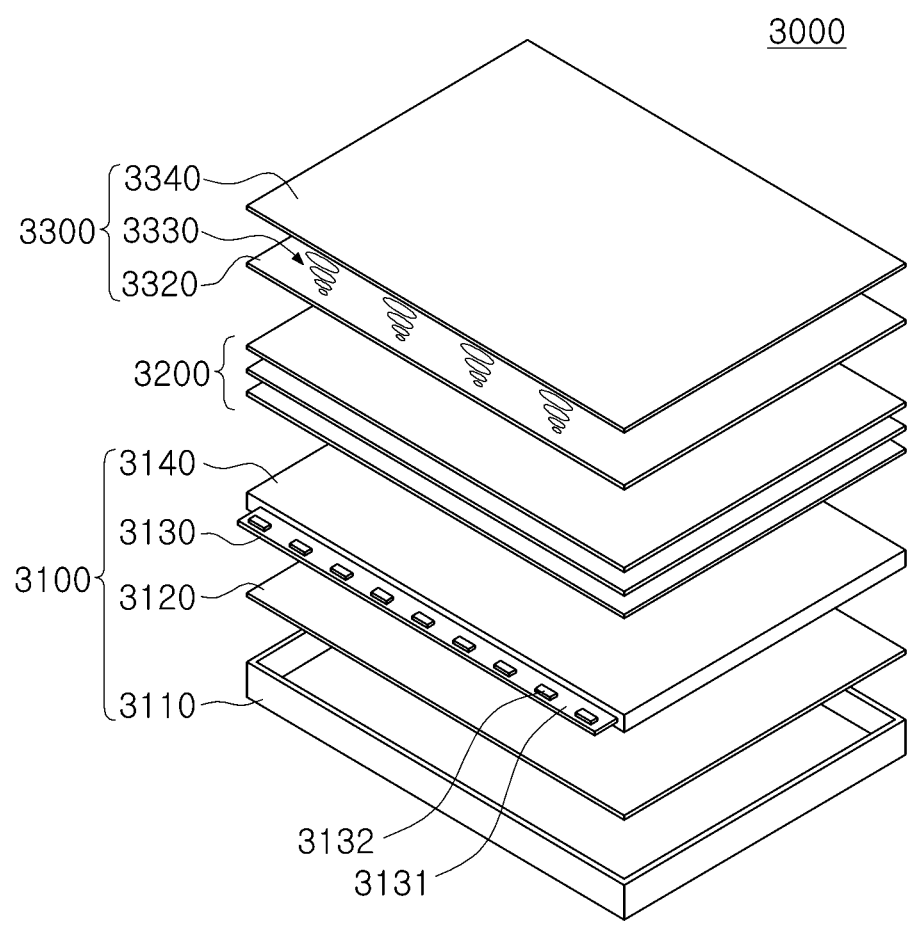
FIG. 40 is an exploded perspective view of a display device including a semiconductor light emitting device, according to an example embodiment of the inventive concept.

FIG. 40 is an exploded perspective view of a display device 3000 including a semiconductor light emitting device, according to an example embodiment of the inventive concept.

Referring to FIG. 40, the display device 3000 may include a backlight unit 3100, an optical sheet 3200, and a display panel 3300 such as a liquid crystal panel. The backlight unit 3100 may include a bottom case 3110, a reflection plate 3120, a light guide plate 3140, and a light source module 3130 on at least one side of the light guide plate 3140. The light source module 3130 may include a PCB 3131 and a light source 3132.

In detail, the light source 3132 may be a side view type LED mounted on a side adjacent to a light emission surface. The light source 3132 may be at least one of the above-described semiconductor light emitting devices 50, 50*a*, 50*b*, 50*c*, 50*d*, 100, 500, 500*a*, 500*b*, 500*c*, 500*d*, and 500*e* according to the example embodiments. The optical sheet 3200 may be between the light guide plate 3140 and the display panel 3300 and may include various types of sheets, such as a diffusion sheet, a prism sheet, or a protection sheet.

The display panel 3300 may display an image by using light emitted from the optical sheet 3200. The display panel 3300 may include an array substrate 3320, a liquid crystal layer 3330, and a color filter substrate 3340. The array substrate 3320 may include pixel electrodes arranged in matrix form, thin film transistors configured to apply a driving voltage to the pixel electrodes, and signal lines configured to operate the thin film transistors.

The color filter substrate 3340 may include a transparent substrate, a color filter, and a common electrode. The color filter may include filters configured to selectively transmit light having a specific wavelength in white light emitted by the backlight unit 3100. The liquid crystal layer 3330 may be rearranged by an electric field formed between the pixel electrode and the common electrode and adjust an optical transmittance. The light, of which the optical transmittance is adjusted, may display an image while passing through the color filter of the color filter substrate 3340. The display panel 3300 may further include a driving circuit configured to process an image signal.

According to the present example embodiment, since the display device 3000 uses the light source 3132 configured to emit blue light, green light, and red light having a relatively narrow full width at half maximum, the emitted light may implement blue, green, and red colors having a high color purity after passing through the color filter substrate 3340.

Figure 41:
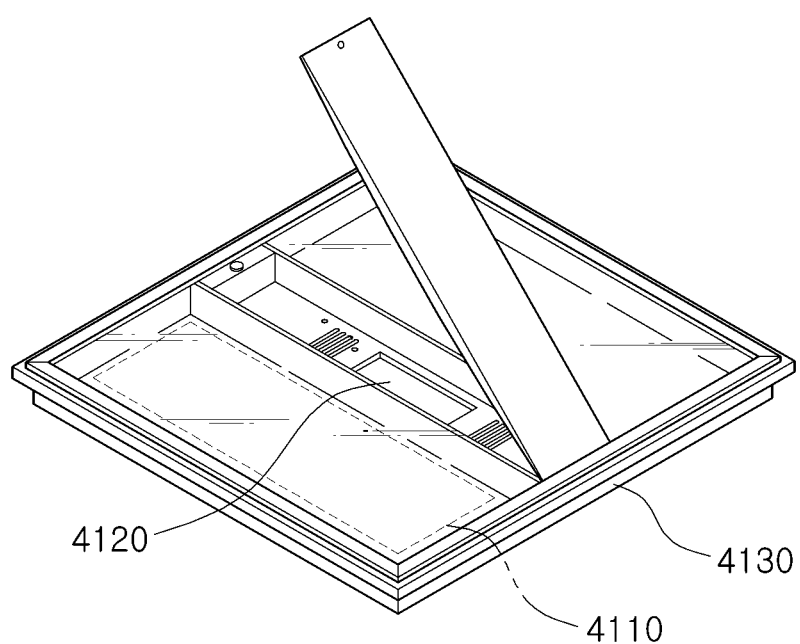
FIG. 41 is a perspective view of a flat-panel lighting apparatus including a semiconductor light emitting device, according to an example embodiment of the inventive concept.

FIG. 41 is a perspective view of a flat-panel lighting apparatus 4100 including a semiconductor light emitting device, according to an example embodiment of the inventive concept.

Referring to FIG. 41, the flat-panel lighting apparatus 4100 may include a light source module 4110, a power supply 4120, and a housing 4030. According to the present example embodiment, the light source module 4110 may include an LED array as a light source. The light source module 4110 may be at least one of the above-described semiconductor light emitting devices 50, 50*a*, 50*b*, 50*c*, 50*d*, 100, 500, 500*a*, 500*b*, 500*c*, 500*d*, and 500*e* according to the example embodiments. The power supply 4120 may include an LED driver.

The light source module 4110 may include an LED array and may be formed to have a flat shape as a whole. According to the present example embodiment, the LED array may include an LED and controller configured to store driving information of the LED.

The power supply 4120 may be configured to supply power to the light source module 4110. The housing 4130 may form an accommodation space for accommodating the light source module 4110 and the power supply 4120. The housing 4130 is formed to have a hexahedral shape with one open side, but is not limited thereto. The light source module 4110 may be arranged to emit light toward the open side of the housing 4130.

Figure 42:
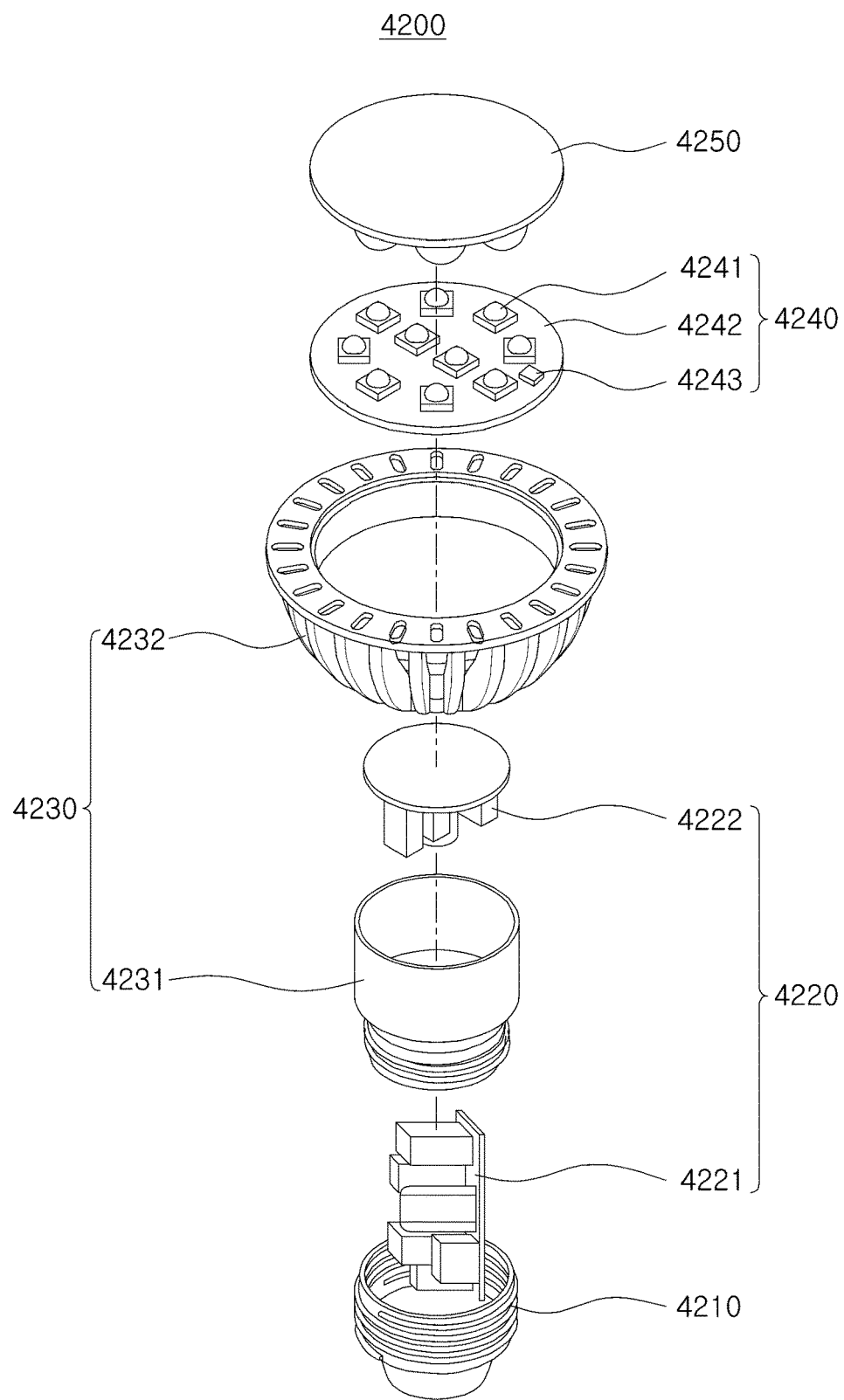
FIG. 42 is an exploded perspective view of a lighting apparatus including a semiconductor light emitting device, according to an example embodiment of the inventive concept.

FIG. 42 is an exploded perspective view of a lighting apparatus 4200 including a semiconductor light emitting device, according to an example embodiment of the inventive concept.

Referring to FIG. 42, the lighting apparatus 4200 may include a socket 4210, a power supply 4220, a heat sink 4230, a light source module 4240, and an optical unit 4250. According to the present example embodiment, the light source module 4240 may include an LED array, and the power supply 4220 may include an LED driver.

The socket 4210 may be configured to accept an existing lighting apparatus. Power may be supplied to the lighting apparatus 4200 through the socket 4210. The power supply 4220 may be dissembled into a first power supply 4221 and a second power supply 4220. The heat sink 4230 may include an internal heat sink 4231 and an external heat sink 4232. The internal heat sink 4231 may be directly connected to the light source module 4240 and/or the power supply 4220. The internal heat sink 4231 may transfer heat to the external heat sink 4232. The optical unit 4250 may include an internal optical unit (not illustrated) and an external optical unit (not illustrated). The optical unit 4250 may be configured to uniformly disperse light emitted by the light source module 4240.

The light source module 4240 may receive power from the power supply 4220 and emit light to the optical unit 4250. The light source module 4240 may include one or more semiconductor light emitting devices 4241, a circuit board 4242, and controller 4243. The controller 4243 may store driving information of the semiconductor light emitting devices 4241. The semiconductor light emitting devices 4241 may be at least one of the above-described semiconductor light emitting devices 50, 50*a*, 50*b*, 50*c*, 50*d*, 100, 500, 500*a*, 500*b*, 500*c*, 500*d*, and 500*e* according to the example embodiments.

Figure 43:
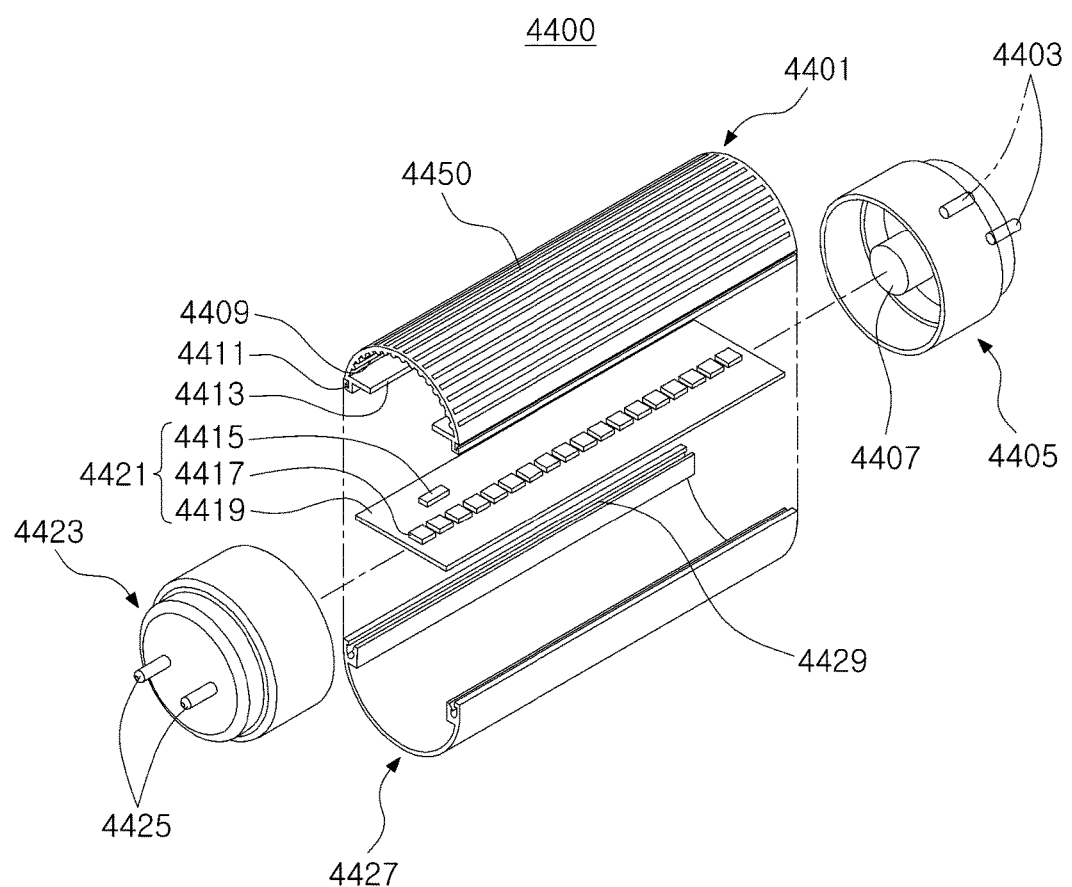
FIG. 43 is an exploded perspective view of a bar-type lighting apparatus including a semiconductor light emitting device, according to an example embodiment of the present inventive concept.

FIG. 43 is an exploded perspective view of a bar-type lighting apparatus 4400 including a semiconductor light emitting device, according to an example embodiment of the inventive concept.

Referring to FIG. 43, the bar-type lighting apparatus 4400 may include a heat sink member 4401, a cover 4427, a light source module 4421, a first socket 4405, and a second socket 4423. A plurality of heat sink fins 4450 and 4409 having a concave/convex shape may be formed on internal or external surfaces of the heat sink member 4401. The heat sink fins 4450 and 4409 may be designed to have various shapes and intervals. A support 4413 having a protruding shape may be formed inside the heat sink member 4401. The light source module 4421 may be fixed to the support 4413. Locking protrusions 4411 may be formed on both ends of the heat sink member 4401.

Locking grooves 4429 may be formed in the cover 4427. The locking protrusions 4411 of the heat sink member 4401 may be hooked to the locking grooves 4429. The positions of the locking grooves 4429 may be exchanged with the positions of the locking protrusions 4411.

The light source module 4421 may include an LED array. The light source module 4421 may include a PCB 4419, a light source 4417, and a controller 4415. The controller 4415 may store driving information of the light source 4417. Circuit wirings may be formed on the PCB 4419 so as to operate the light source 4417. In addition, the light source module 4421 may include components for operating the light source 4417. The light source 4417 may be at least one of the above-described semiconductor light emitting devices 50, 50*a*, 50*b*, 50*c*, 50*d*, 100, 500, 500*a*, 500*b*, 500*c*, 500*d*, and 500*e* according to the example embodiments.

The first and second sockets 4405 and 4423 may be provided as a pair of sockets and may be connected to both ends of a cylindrical cover unit including the heat sink member 4401 and the cover 4427. For example, the first socket 4405 may include an electrode terminal 4403 and a power supply 4407, and the second socket 4423 may include a dummy terminal 4425. In addition, an optical sensor module and/or a communications module may be embedded into the first socket 4405 or the second socket 4423. For example, the optical sensor module and/or the communications module may be embedded into the second socket 4423 in which the dummy terminal 4425 is arranged. As another example, the optical sensor module and/or the communications module may be embedded into the first socket 4405 in which the electrode terminal 4403 is arranged.

Figure 44:
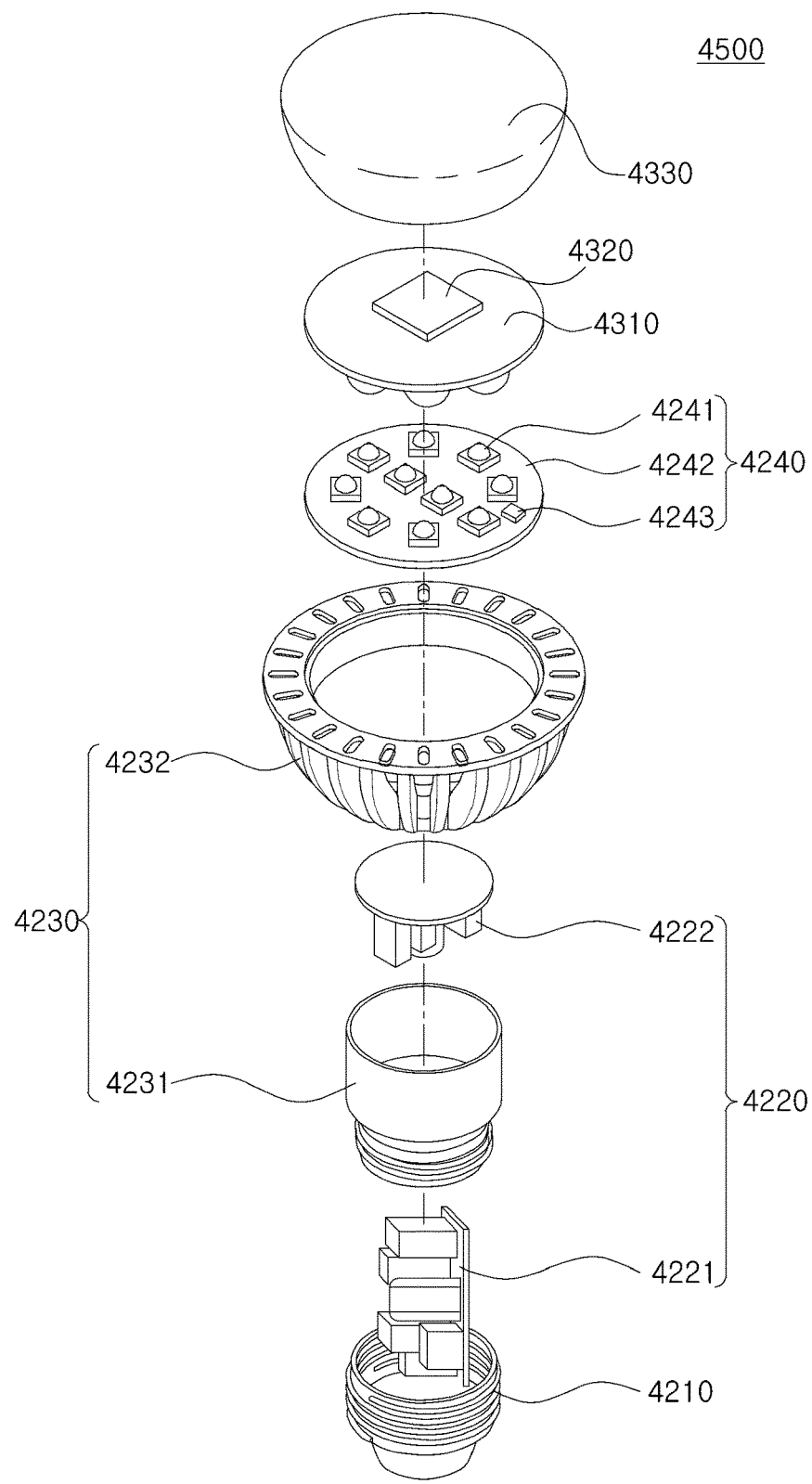
FIG. 44 is an exploded perspective view of a lighting apparatus including a semiconductor light emitting device, according to an example embodiment of the inventive concept.

FIG. 44 is an exploded perspective view of a lighting apparatus 4500 including a semiconductor light emitting device, according to an example embodiment of the inventive concept.

The lighting apparatus 4500 of FIG. 44 differs from the lighting apparatus 4200 of FIG. 42 in that a reflection plate 4310 and a communications module 4320 are provided on a light source module 4240. The reflection plate 4310 may uniformly disperse light from the light source in a lateral direction and a rearward direction so as to reduce glare.

The communications module 4320 may be mounted on the reflection plate 4310, and a home network communication may be performed through the communications module 4320. For example, the communications module 4320 may be a wireless communications module using ZigBee®, Wi-Fi, or Li-Fi, and control an indoor or outdoor lighting apparatus, such as on/off operations or brightness adjustment of the lighting apparatus through a smartphone or a wireless controller. In addition, electronic appliances and vehicle systems, such as TVs, refrigerators, air conditioners, doorlock systems, vehicles, may be controlled through a Li-Fi communications module using a wavelength of visible light in the indoor or outdoor lighting apparatus. The reflection plate 4310 and the communications module 4320 may be covered by the cover 4330.

Figure 45:
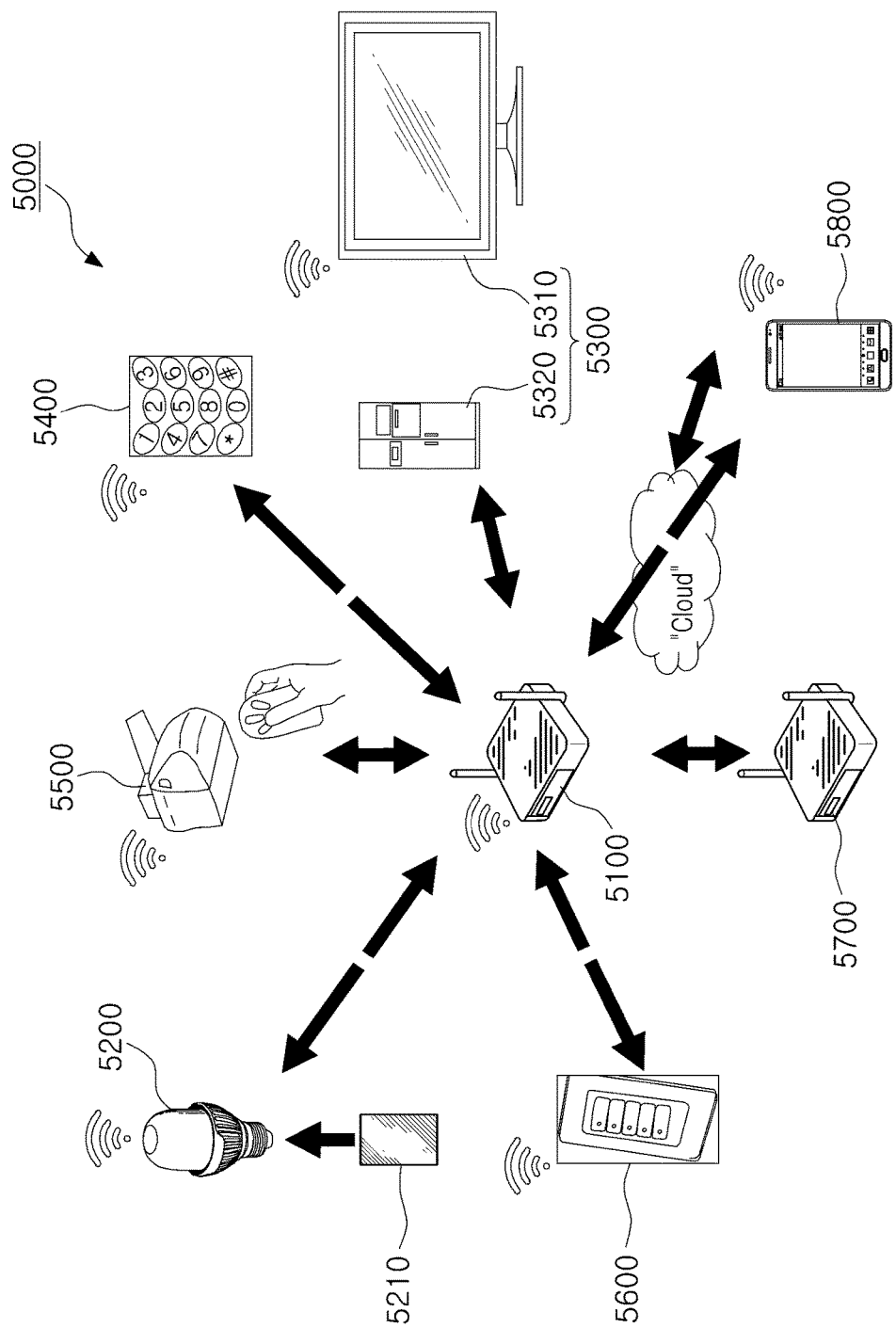
FIG. 45 is a diagram illustrating an indoor lighting control network system including a semiconductor light emitting device, according to an example embodiment of the inventive concept.

FIG. 45 is a diagram illustrating an indoor lighting control network system 5000 including a semiconductor light emitting device, according to an example embodiment of the inventive concept.

Referring to FIG. 45, the indoor lighting control network system 5000 may be a composite smart lighting-network system in which illumination technology using an LED, Internet of Things (IoT) technology and wireless communications technology converge. The network system 5000 may be implemented using various lighting apparatuses and wired/wireless communication devices, and may be implemented using a sensor, a controller, a communications device, and software for network control and maintenance.

The network system 5000 may be applied to a closed space defined in buildings such as offices, an open space such as parks or streets, and the like. The network system 5000 may be implemented based on an IoT environment so as to collect, process, and provide a variety of information to users.

An LED lamp 5200 included in the network system 5000 may receive information regarding an ambient environment from a gateway 5100 and control illumination of the LED lamp 5200 itself. Furthermore, the LED lamp 5200 may check and control the operating states of other devices 5300 to 5800 included in the IoT environment based on a visible light communications function of the LED lamp 5200. The LED lamp 5200 may be at least one of the above-described semiconductor light emitting devices 50, 50a, 50b, 50c, 50d, 100, 500, 500a, 500b, 500c, 500d, and 500e according to the example embodiments. For example, the LED lamp 5200 may be at least one of the lighting apparatuses 4100, 4200, 4400, and 4500 illustrated in FIGS. 41 to 44.

The network system 5000 may include the gateway 5100 configured to process data transmitted and received in accordance with different communications protocols, the LED lamp 5200 communicably connected to the gateway 5100 and including an LED, and a plurality of devices 5300 to 5800 communicably connected to the gateway 5100 in accordance with various wireless communication schemes. In order to implement the network system 5000 based on the IoT environment, the devices 5300 to 5800, including the LED lamp 5200, may include at least one communications module. According to the present example embodiment, the LED lamp 5200 may be communicably connected to the gateway 5100 by a wireless communications protocol such as Wi-Fi, ZigBee®, or Li-Fi. To this end, the LED lamp 5200 may include at least one lamp communications module 5210.

The network system 5000 may be applied to a closed space such as homes or offices, an open space such as parks or streets, and the like. In a case where the network system 5000 is applied to the home, the plurality of devices 5300 to 5800, which are included in the network system 5000 and communicably connected to the gateway 5100 based on the IoT technology, may include electronic appliances 5300, a digital doorlock 5400, a garage doorlock 5500, a lighting switch 5600 installed on a wall, a router 5700 for relaying a wireless communication network, and mobile devices 5800 such as smartphones, tablets, or laptop computers.

In the network system 5000, the LED lamp 5200 may determine the operating states of the various devices 5300 to 5800 or automatically control the illumination of the LED lamp 5200 itself according to the ambient environment and conditions by using the wireless communication network (e.g., ZigBee®, Wi-Fi, Li-Fi, etc.) installed in a home. In addition, the LED lamp 5200 may control the devices 5300 to 5800 included in the network system 5000 through the Li-Fi communication using the visible light emitted by the LED lamp 5200.

The LED lamp 5200 may automatically control the illumination of the LED lamp 5200 based on the information about the ambient environment, transmitted from the gateway 5100 through the lamp communications module 5210, or the information about the ambient environment, collected from the sensor mounted on the LED lamp 5200. For example, the brightness of the LED lamp 5200 may be automatically adjusted according to a type of a TV program viewed on the TV 5310 or a screen brightness of the TV 5310. To this end, the LED lamp 5200 may receive operation information of the TV 5310 from the lamp communications module 5210 connected to the gateway 5100. The lamp communications module 5210 may be integrally modularized with the sensor and/or the controller included in the LED lamp 5200.

For example, when a television (TV) program viewed on a TV is a drama, the LED lamp 5200 may lower a color temperature to 12,000K or less (e.g., 5,000K) and adjust a color sense according to a preset value, thus creating a cozy atmosphere. On the other hand, when a TV program is a comedy program, the LED lamp 5200 may increase a color temperature to 5,000K or more according to a set value so as to be adjusted to bluish white light.

In addition, after elapse of a predetermined time after the digital doorlock 5400 has been locked in such a state that there is no person at home, it is possible to prevent electricity wastage by turning off the turned-on LED lamp 5200. Alternatively, in a case where a security mode is set through the mobile device 5800 or the like, when the digital doorlock 5400 is locked in such a state that there is no person at home, the LED lamp 5200 may maintain the turned-on state.

The operation of the LED lamp 5200 may be controlled according to information about the ambient environment, collected through various sensors connected to the network system 5000. For example, in a case where the network system 5000 is implemented in a building, it is possible to turn on or off the illumination by combining a lighting apparatus, a position sensor, and a communications module within the building, or provide collected information in real time, thus enabling efficient facility management or efficient utilization of unused space. Since the lighting apparatus such as the LED lamp 5200 is usually arranged in almost all spaces of each floor in the building, a variety of information about the building may be collected through a sensor integrally provided with the LED lamp 5200, and the collected information may be used for facility management and utilization of unused spaces.

On the other hand, by combining the LED lamp 5200 with an image sensor, a storage device, the lamp communications module 5210, or the like, the LED lamp 5200 may be used as a device capable of maintaining building security or sensing and counteracting emergency situations. For example, when a smoke or temperature sensor is attached to the LED lamp 5200, it is possible to promptly detect an outbreak of fire, thus minimizing fire damage. In addition, it is possible to adjust the brightness of the lighting apparatus, save energy, and provide a pleasant illumination environment, taking into consideration outside weather or an available amount of sunlight.

As described above, the network system 5000 may be applied to a closed space such as homes, offices, or buildings, an open space such as parks or streets, and the like. In a case where the network system 5000 is intended to be applied to an open space without physical limitations, it may be relatively difficult to implement the network system 5000 due to a distance limitation of wireless communications and a communication interference caused by various obstacles. By mounting the sensors and the communications modules on various lighting apparatuses and using the lighting apparatuses as information collection units and communication relay units, the network system 5000 may be more efficiently implemented in the open environments.

Figure 46:
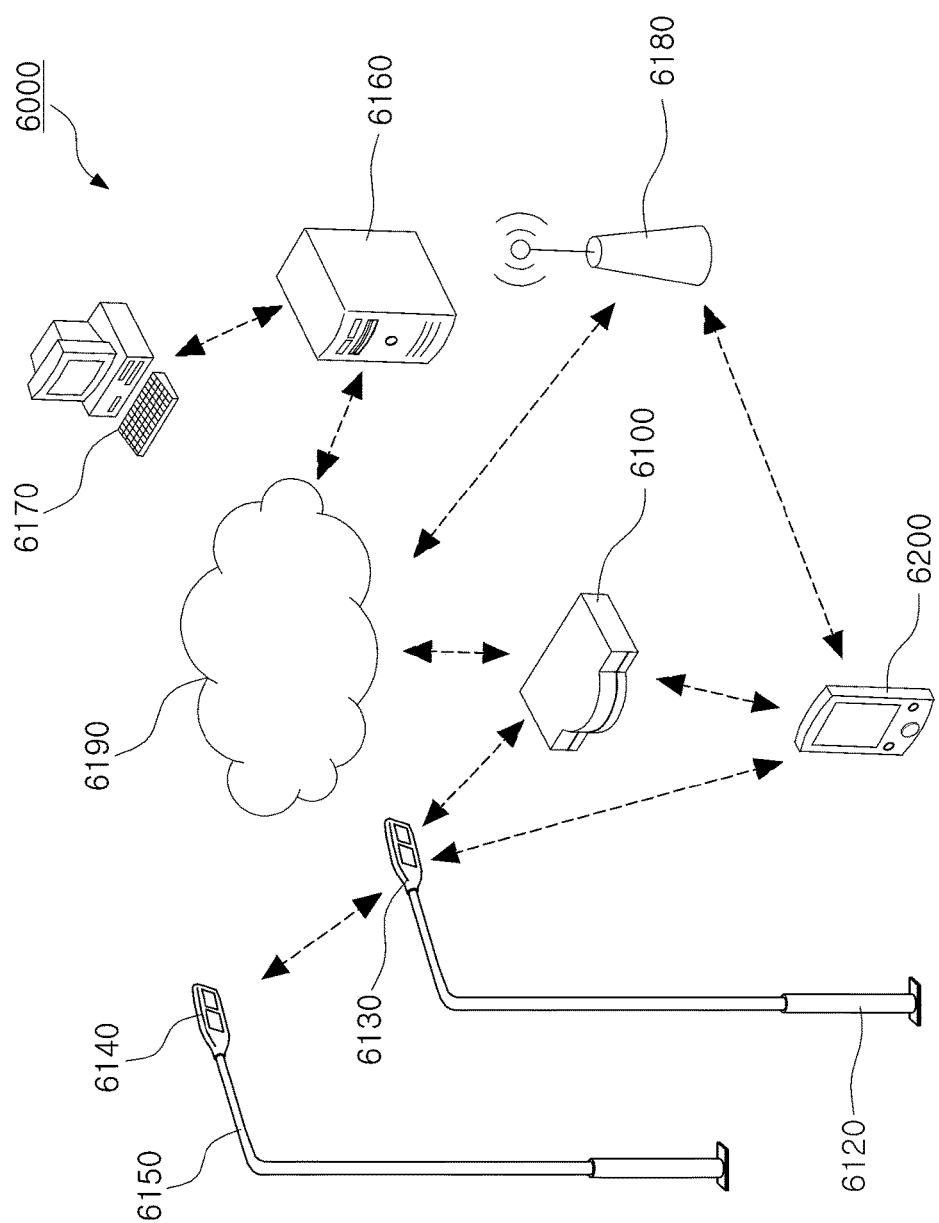
FIG. 46 is a diagram illustrating a network system including a semiconductor light emitting device, according to an example embodiment of the inventive concept.

FIG. 46 is a diagram illustrating a network system 6000 including a semiconductor light emitting device according to an example embodiment of the inventive concept.

Specifically, FIG. 46 illustrates the network system 6000 applied to an open space. The network system 6000 may include a communications connecting device 6100, a plurality of lighting apparatuses 6120 and 6150 installed at predetermined intervals and communicably connected to the communications connecting device 6100, a server 6160, a computer 6170 configured to manage the server 6160, a communications base station 6180, a communications network 6190 configured to connect communicable devices, and a mobile device 6200.

The plurality of lighting apparatuses 6120 and 6150 installed in open external spaces such as streets or parts may include smart engines 6130 and 6140, respectively. Each of the smart engines 6130 and 6140 may include an LED configured to emit light, a driver configured to drive the LED, a sensor configured to collect information about an ambient environment, and a communications module. The LEDs included in the smart engine 6130 and 6140 may be at least one of the above-described semiconductor light emitting devices 50, 50a, 50b, 50c, 50d, 100, 500, 500a, 500b, 500c, 500d, and 500e according to the example embodiments.

The communications module may enable the smart engines 6130 and 6140 to communicate with other peripheral devices in accordance with the communications protocol such as Wi-Fi, ZigBee®, or Li-Fi.

For example, one smart engine 6130 may be communicably connected to the other smart engine 6140. In this case, a Wi-Fi mesh may be applied to the communications between the smart engines 6130 and 6140. At least one smart engine 6130 may be connected to the communications connecting device 6100 connected to the communications network 6190 by a wired/wireless communications. In order to increase the efficiency of communications, the plurality of smart engines 6130 and 6140 may be grouped into one group and be connected to one communications connecting device 6100.

The communications connecting device 6100 may be an access point (AP) capable of performing wired/wireless communications and may relay communications between the communications network 6190 and other devices. The communications connecting device 6100 may be connected to the communications network 6190 by at least one of the wired/wireless communications schemes. For example, the communications connecting device 6100 may be mechanically accommodated in one of the lighting apparatuses 6120 and 6150.

The communications connecting device 6100 may be connected to the mobile device 6200 through the communications protocol such as Wi-Fi. A user of the mobile device 6200 may receive information about the ambient environment, collected by the plurality of smart engines 6130 and 6140, through the communications connecting device connected to the smart engine 6130 of the adjacent lighting apparatus 6120. The information about the ambient environment may include local traffic information, weather information, and the like. The mobile device 6200 may be connected to the communications network 6190 through the communications base station 6180 by a wireless cellular communications scheme such as a 3G or 4G communications scheme.

On the other hand, the server 6160 connected to the communications network 6190 may receive information collected by the smart engines 6130 and 6140 respectively mounted on the lighting apparatuses 6120 and 6150 and may monitor the operating states of the lighting apparatuses 6120 and 6150. In order to manage the lighting apparatuses 6120 and 6150 based on the monitoring result of the operating states of the lighting apparatuses 6120 and 6150, the server 6160 may be connected to the computer 6170 that provides the management system. The computer 6170 may execute software capable of monitoring and managing the operating states of the lighting apparatuses 6120 and 6150, especially the smart engines 6130 and 6140.

Figure 47:
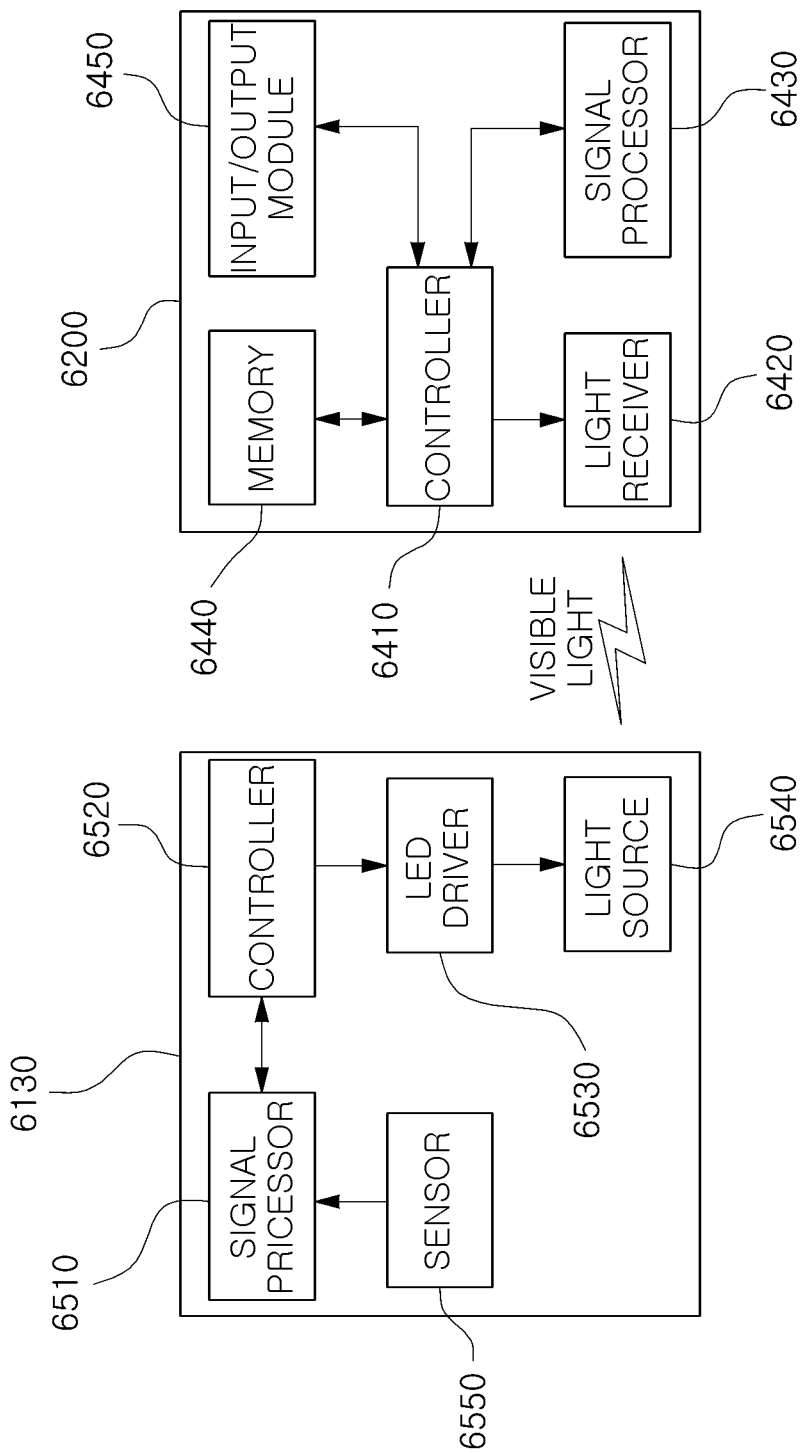
FIG. 47 is a block diagram illustrating a communications operation between a smart engine of a lighting apparatus including a semiconductor light emitting device and a mobile device, according to an example embodiment of the inventive concept.

FIG. 47 is a block diagram illustrating a communications operation between a smart engine 6130 of a lighting apparatus 6120 and a mobile device 6200, including a semiconductor light emitting device according to an example embodiment of the inventive concept.

Specifically, FIG. 47 is a block diagram illustrating a communications operation between the smart engine 6130 of the lighting apparatus 6120 of FIG. 46 and the mobile device 6200 via the visible light wireless communications. Various communications schemes may be applied for transmitting information collected by the smart engine 6130 to the mobile device 6200 of the user.

Through the communications connecting device (6100 of FIG. 46) connected to the smart engine 6130, the information collected by the smart engine 6130 may be transmitted to the mobile device 6200, or the smart engine 6130 and the mobile device 6200 may be directly communicable connected to each other. The smart engine 6130 and the mobile device 6200 may communicate directly with each other through the visible light wireless communications (Li-Fi).

The smart engine 6130 may include a signal processor 6510, a controller 6520, an LED driver 6530, a light source 6540, and a sensor 6550. The mobile device 6200, connected to the smart engine 6130 through the visible light wireless communications, may include a controller 6410, a light receiver 6420, a signal processor 6430, a memory 6440, and an input/output module 6450.

The visible light wireless communications (Li-Fi) technology is a wireless communications technology that wirelessly transmits information by using light of a visible light wavelength the human may recognize with his/her eyes. The visible light wireless communications technology differs from the existing wired optical communications technology and infrared wireless communications in that the light of the visible light wavelength, for example, a specific frequency of visible light from the light emitting device or the lighting apparatus, is used, and differs from the wired optical communications technology in that communications environment is a wireless environment. Contrary to the RF wireless communications technology, the visible light wireless communications technology may freely be used without regulation or permission in terms of frequency use. In addition, the visible light wireless communications technology has excellent physical security and has differentiation that enable a user to confirm a communications link with his/her eyes. Furthermore, the visible light wireless communications technology is a convergence technology that is capable of simultaneously obtaining the unique purpose of the light source and the communications function.

The signal processor 6510 of the smart engine 6130 may process data to be transmitted and received through the visible light wireless communications. For example the signal processor 6510 may process information collected by the sensor 6550 into data and transmit the data to the controller 6520. The controller 6520 may control the operations of the signal processor 6510 and the LED driver 6530. In particular, the controller 6520 may control the operation of the LED driver 6530 based on the data transmitted by the signal processor 6510. The LED driver 6530 may transmit the data to the mobile device 6200 by turning on the light source 6540 according to a control signal transmitted by the controller 6520.

The mobile device 6200 may include the light receiver 6420 configured to recognize visible light including data, as well as the controller 6410, the memory 6440 configured to store data, the input/output module 6450 including a display, a touch screen, and an audio output unit, and the signal processor 6430. The light receiver 6420 may detect visible light and convert the detected visible light into an electrical signal. The signal processor 6430 may decode data included in the electrical signal. The controller 6410 may store the decoded data output from the signal processor 6430 in the memory 6440, or may output the decoded data through the input/output module 6450 so as to allow the user to recognize the decoded data.

Figure 48:
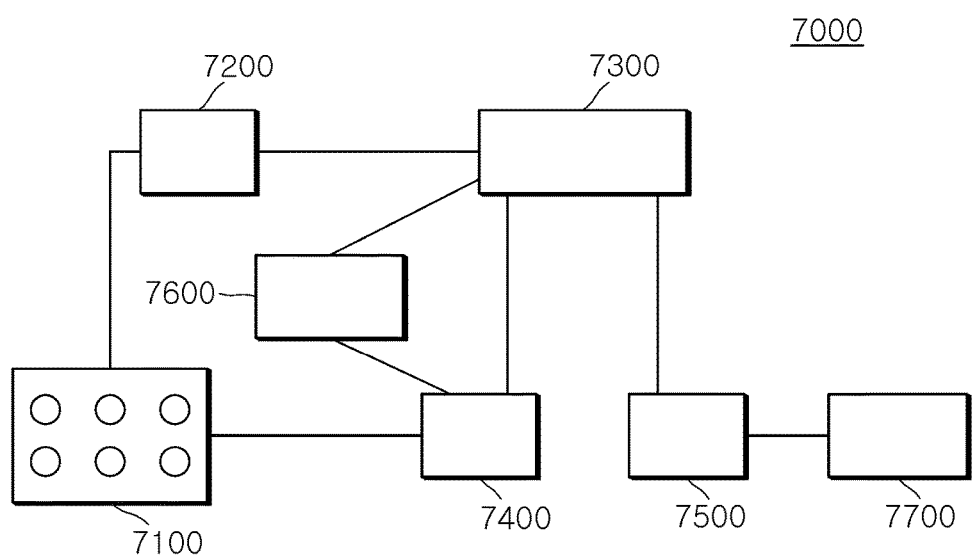
FIG. 48 is a block diagram of a smart lighting system including a semiconductor light emitting device, according to an example embodiment of the inventive concept.

FIG. 48 is a block diagram of a smart lighting system 7000 including a semiconductor light emitting device, according to an example embodiment of the inventive concept.

Referring to FIG. 48, the smart lighting system 7000 may include an illumination module 7100, a sensor module 7200, a server 7300, a wireless communications module 7400, a controller 7500, and an information storage device 7600. The illumination module 7100 may include one or more lighting apparatuses installed in a building and there is no limitation to a type of the lighting apparatus. Examples of the lighting apparatus may include basic illuminations for a living room, a room, a balcony, a bathroom, stairs, and a front door, a mood illumination, a stand illumination, and a decorative illumination. The lighting apparatus may be at least one of the above-described semiconductor light emitting devices 50, 50a, 50b, 50c, 50d, 100, 500, 500a, 500b, 500c, 500d, and 500e according to the example embodiments. For example, the lighting apparatuses may be at least one of the lighting apparatuses 4100, 4200, 4400, and 4500 illustrated in FIGS. 41 to 44.

The sensor module 7200 may detect illumination states related to the turn-on/off of each lighting apparatus and the intensity of the illumination, output a signal corresponding to the detected illumination state, and transmit the signal to the server 7300. The sensor module 7200 may be provided in the building where the lighting apparatus is installed. One or more sensors module 7200 may be at a position where the illumination states of all the lighting apparatuses controlled by the smart lighting system 7000 are detectable, or may be provided at each of the lighting apparatuses.

The information about the illumination state may be transmitted to the server 7300 in real time, or may be transmitted with a time difference based on predetermined time unit such as minute unit or hour unit. The server 7300 may be installed inside and/or outside the building. The server 7300 may receive a signal from the sensor module 7200, collect information about the illumination state, such as the turn-on/off of the lighting apparatus within the building, group the collected information, define an illumination pattern based on the grouped information, and provide information about the defined illumination pattern to the wireless communications module 7400. In addition, the server 7300 may serve as a medium that transmits a command received from the wireless communications module 7400 to the controller 7500.

Specifically, the server 7300 may receive the information about the illumination state of the building, detected and transmitted by the sensor module 7200, and collect and analyze the information about the illumination state. For example, the server 7300 may divide the collected information into various groups by period, such as time, day, day of week, weekdays and weekends, a preset specified day, a week, and a month. Then, the server 7300 may program a "defined illumination pattern" defined as an illumination pattern of an average day unit, week unit, weekday unit, weekend unit, and month unit based on the grouped information. The "defined illumination pattern" may be periodically provided to the wireless communications module 7400, or may be received from the server 7300 in response to a request for providing information when the user requests the information regarding the illumination pattern.

In addition, apart from the defining of the illumination pattern from the information regarding the illumination state received from the sensor module 7200, the server 7300 may provide the wireless communications module 7400 with a "normal illumination pattern" programmed in advance by reflecting a normal illumination state occurring at home. As in the case of the "defined illumination pattern", the "normal illumination pattern" may be periodically provided from the server 7300, or may be provided when there is a request from a user. Only one server 7300 is illustrated in FIG. 48, but two or more servers may be provided when necessary. Optionally, the "normal illumination pattern" and/or the "defined illumination pattern" may be stored in the information storage device 7600. The information storage device 7600 may be a so-called cloud that is accessible via a network.

The wireless communications module 7400 may select one of the plurality of illumination patterns received from the server 7300 and/or the information storage device 7600 and transmit a command signal for executing or stopping an "automatic illumination mode" to the server 7300. The wireless communications module 7400 may be applied to various portable wireless communications devices such as smartphones, tablet personal computers (PCs), personal digital assistants (PDAs), notebook computers, or netbook computers, which may be carried by the user of the smart lighting system.

Specifically, the wireless communications module 7400 may receive various defined illumination patterns from the server 7300 and/or the information storage device 7600, select necessary patterns from the received illumination patterns, and transmit a command signal to the server 7300 so as to execute the "automatic illumination mode" to operate the illumination module 7100 in the selected illumination pattern. The command signal may be transmitted at a set execution time. Alternatively, after the command signal is transmitted without defining a stop time, the execution of the "automatic illumination mode" may be stopped by transmitting a stop signal when necessary.

In addition, the wireless communications module 7400 may further have a function of allowing the user to partially modify the illumination pattern received from the server 7300 and/or the information storage device 7600 or manipulate a new illumination pattern when necessary. The modified or newly manipulated "user setting illumination pattern" may be stored in the wireless communications module 7400, may be automatically transmitted to the server 7300 and/or the information storage device 7600, or may be transmitted when necessary. In addition, the wireless communications module 7400 may automatically receive the "defined illumination pattern" and the "normal illumination pattern" from the server 7300 and/or the information storage device 7600, or may receive the "defined illumination pattern" and the "normal illumination pattern" by transmitting a provision request signal to the server 7300.

The wireless communications module 7400 may exchange a necessary command or information signal with the server 7300 and/or the information storage device 7600, and the server 7300 may serve as a medium between the wireless communications module 7400, the sensor module 7200, and the controller 7500. In this manner, the smart lighting system may be operated.

The connection between the wireless communications module 7400 and the server 7300 may be performed using an application program of the smartphone. That is, the user may instruct the server 7300 to execute the "automatic illumination mode" through an application program downloaded in the smartphone, or may provide information regarding the user setting illumination pattern" manipulated or modified by the user.

The information may be automatically provided to the server 7300 and/or the information storage device 7600 by the storing of the "user setting illumination pattern", or may be provided by performing a transmission operation. This may be determined as a default of the application program, or may be selected by the user according to an option.

The controller 7500 may receive the command signal of executing or stopping the "automatic illumination mode" from the server 7300, and control one or more lighting apparatuses by executing the received command signal in the illumination module 7100. That is, the controller 7500 may control the turn-on/off or the like of the lighting apparatuses included in the illumination module 7100 according to the command signal from the server 7300.

In addition, the smart lighting system 7000 may further include an alarm device 7700 in the building. The alarm device 7700 may give an alarm when there is an intruder in the building.

Specifically, in a case where the "automatic illumination mode" is executed in the building in the absence of the user, when there occurs an intrusion in the building and there occurs an abnormal situation deviating from the set illumination pattern, the sensor module 7200 may detect the abnormal situation and transmit an alarm signal to the server 7300. The server 7300 may notify the wireless communications module 7400 of the abnormal situation and operate the alarm device 7700 in the building by transmitting a signal to the controller 7500.

In addition, when the alarm signal is transmitted to the server 7300, the server 7300 may directly notify a security company of an emergency situation via the wireless communications module 7400 or a TCP/IP network.

As set forth above, according to example embodiments of the inventive concept, a flip chip semiconductor light emitting device having a transparent support substrate using, for example, glass may be provided. The transparent adhesive layer is interposed between the transparent support substrate and the light emitting structure and the transparent support substrate may be provided on the surface of the light emitting structure on which the concavo-convex portion is formed. The transparent adhesive layer may be configured to act as a refractive index matching layer, and as a result, light extraction efficiency may be enhanced. The transparent adhesive layer may include a wavelength conversion material such as a phosphor to simplify a wavelength conversion structure.

In the semiconductor light emitting device according to the example embodiment, since the first electrode layers and the second electrode layers provided below the light-emitting structure function as electrode pads, the first electrode layers and the second electrode layers may be directly mounted on an external device or an external substrate in a flip-chip structure.

In the semiconductor light emitting device according to the example embodiment, the light extraction efficiency may be improved by forming the graded index layer on the light-emitting structure or by forming the reflective layer on the surface of the first conductivity type semiconductor layer of the light-emitting structure or in the through hole formed in the light-emitting structure.

The semiconductor light emitting device according to the example embodiment may be completed by adhering the transparent support substrate on the light-emitting structure by using the transparent adhesive layer and removing the growth substrate. In addition, in the semiconductor light emitting device according to the example embodiment, after the through hole is formed in the light-emitting structure by using the etch stop layer, the electrode structure may be formed under the light-emitting structure. Therefore, the semiconductor light emitting device according to the example embodiment may reduce the manufacturing costs by simplifying the manufacturing process.

While example embodiments have been shown and described above, it will be apparent to those skilled in the art that modifications and variations could be made without departing from the scope of the inventive concept as defined by the appended claims.

What is claimed is:

1. A semiconductor light emitting device comprising:
a light emitting structure comprising a first conductivity-type semiconductor layer and a second conductivity-type semiconductor layer respectively providing a first surface and a second surface, opposite to each other, of the light emitting structure, and an active layer interposed between the first conductivity-type semiconductor layer and the second conductivity-type semiconductor layer, and a plurality of regions of the first conductivity-type semiconductor layer being open by a plurality of holes penetrating through the second conductivity-type semiconductor layer and the active layer;
a first electrode disposed on the plurality of regions of the first conductivity-type semiconductor layer;
a second electrode disposed on a region of the second conductivity-type semiconductor layer;
an insulating layer disposed on the second surface of the light emitting structure;
a first solder pad and a second solder pad connected to the first electrode and the second electrode, respectively;
a transparent support substrate disposed on the first surface of the light emitting structure; and
a transparent adhesive layer disposed between the first surface of the light emitting structure and the transparent support substrate,
wherein at least one of the transparent support substrate and the transparent adhesive layer comprises a wavelength conversion material converting at least a portion of light having a first wavelength and generated by the active layer into light having a second wavelength, and
wherein the first surface of the light emitting structure, which is a surface of the first conductive-type semiconductor layer, comprises a concavo-convex portion,
wherein the first electrode has an extension portion extending onto the insulating layer, and the insulating layer, the extension portion of the first electrode, the first solder pad are sequentially stacked on a portion of the second electrode.

2. The semiconductor light emitting device of claim 1, wherein the transparent adhesive layer has a refractive index between a refractive index of the first conductivity-type semiconductor layer and a refractive index of the transparent support substrate.

3. The semiconductor light emitting device of claim 1, wherein both of the transparent support substrate and the transparent adhesive layer comprise at least one type of the wavelength conversion material.

4. The semiconductor light emitting device of claim 1, wherein the transparent adhesive layer comprises a wavelength conversion material converting at least a portion of light having a first wavelength and generated by the active layer into light having a second wavelength.

5. The semiconductor light emitting device of claim 1, wherein the transparent adhesive layer has a refractive index lower than a refractive index of the first conductivity-type semiconductor layer.

6. The semiconductor light emitting device of claim 5, wherein the transparent adhesive layer has a refractive index higher than a refractive index of the transparent support substrate.

7. The semiconductor light emitting device of claim 4, further comprising an optical filter layer disposed on a surface of the transparent support substrate, and blocking light having the first wavelength and allowing light having the second wavelength to be transmitted therethrough.

8. The semiconductor light emitting device of claim 7, further comprising a color filter layer disposed on the optical filter layer and allowing light partially within a wavelength band of the second wavelength to be selectively transmitted therethrough.

9. The semiconductor light emitting device of claim 8, further comprising a light diffusion layer disposed on the color filter layer and diffusing light emitted from the color filter layer.

10. The semiconductor light emitting device of claim 4, wherein the transparent adhesive layer comprises at least one material selected from the group consisting of polyacrylate, polyimide, polyamide, and benzocyclobutene (BCB).

11. The semiconductor light emitting device of claim 1, wherein the transparent support substrate and the transparent adhesive layer comprise different types of the wavelength conversion material, respectively.

12. The semiconductor light emitting device of claim 1, further comprising a wavelength conversion layer disposed on a surface of the transparent support substrate and containing a wavelength conversion material different from the wavelength conversion material of the at least one of the transparent support substrate and the transparent adhesive layer.

13. The semiconductor light emitting device of claim 1, wherein an area of the first surface of the light emitting structure in which the concavo-convex portion is formed is 80% or greater of an entire area of the first surface.

14. The semiconductor light emitting device of claim 1, wherein the insulating layer comprises
a first insulating layer having a first opening and a second opening allowing the plurality of regions of the first conductivity-type semiconductor layer and the region of the second conductivity-type semiconductor layer to be open, respectively, the second electrode being disposed in the second opening; and
a second insulating layer allowing a portion of the second electrode to be open and covering another portion of the second electrode,
wherein the first electrode is disposed in the first opening.

15. A semiconductor light emitting device comprising:
a light emitting structure comprising a first surface and a second surface opposite to each other, the first surface comprising an uneven surface and including an n-type semiconductor layer, a p-type semiconductor layer, and an active layer interposed between the n-type and p-type semiconductor layers to generate light;
a first electrode connected to a plurality of regions of the n-type semiconductor layer being open by a plurality of holes penetrating through the second conductivity-type semiconductor layer and the active layer;
a second electrode connected to the p-type semiconductor layer;
an insulating layer disposed on the second surface of the light emitting structure;
a first solder pad and a second solder pad connected to the first electrode and the second electrode, respectively; and
a transparent support substrate disposed on the first surface of the light emitting structure to structurally support the light emitting structure,
wherein the transparent support substrate contains a wavelength conversion material converting at least a portion of light having a first wavelength and generated at the light emitting structure into light having a second wavelength, wherein the uneven surface is formed on a surface of the n-type semiconductor layer facing the transparent support substrate, wherein a portion of the insulating layer, portion of the first electrode, the first solder pad are sequentially stacked on a portion of the second electrode.

16. The semiconductor light emitting device of claim 15, wherein the light emitting structure further comprises a buffer layer disposed on the n-type semiconductor layer providing an uneven surface.

17. The semiconductor light emitting device of claim 16, wherein the buffer layer comprises AlN, AlGaN or InGaN.

* * * * *